US009685454B2

(12) United States Patent
Rabkin et al.

(10) Patent No.: US 9,685,454 B2
(45) Date of Patent: Jun. 20, 2017

(54) METHOD OF FORMING 3D VERTICAL NAND WITH III-V CHANNEL

(71) Applicant: SanDisk Technologies Inc., Plano, TX (US)

(72) Inventors: Peter Rabkin, Cupertino, CA (US); Jayavel Pachamuthu, San Jose, CA (US); Johann Alsmeier, San Jose, CA (US); Masaaki Higashitani, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 149 days.

(21) Appl. No.: 14/666,687

(22) Filed: Mar. 24, 2015

(65) Prior Publication Data

US 2016/0284724 A1  Sep. 29, 2016

(51) Int. Cl.
| | |
|---|---|
| *H01L 27/11582* | (2017.01) |
| *H01L 21/02* | (2006.01) |
| *H01L 27/06* | (2006.01) |
| *H01L 29/792* | (2006.01) |
| *H01L 29/201* | (2006.01) |

(52) U.S. Cl.
CPC .. *H01L 27/11582* (2013.01); *H01L 21/02178* (2013.01); *H01L 21/02192* (2013.01); *H01L 27/0605* (2013.01); *H01L 29/201* (2013.01); *H01L 29/7926* (2013.01)

(58) Field of Classification Search
CPC .......... H01L 27/11582; H01L 29/7926; H01L 29/201; H01L 21/768; H01L 21/02178; H01L 27/0605; H01L 21/02192
See application file for complete search history.

(56) References Cited

U.S. PATENT DOCUMENTS

| | | |
|---|---|---|
| 7,859,066 B2 | 12/2010 | Kito et al. |
| 8,349,681 B2 | 1/2013 | Alsmeier et al. |
| 8,445,347 B2 | 5/2013 | Alsmeier et al. |

(Continued)

OTHER PUBLICATIONS

Restriction Requirement dated May 20, 2016, U.S. Appl. No. 14/666,678, filed Mar. 24, 2015.
U.S. Appl. No. 14/666,678, filed Mar. 24, 2015.
Hou, Jared J., et al., "Synthesis and Characterizations of Ternary InGaAs Nanowires by a Two-Step Growth Method for High-Performance Electronic Devices," ACS Nano, vol. 6, No. 4, Mar. 26, 2012, 7 pages.

(Continued)

*Primary Examiner* — Selim Ahmed
(74) *Attorney, Agent, or Firm* — Vierra Magen Marcus LLP

(57) ABSTRACT

Disclosed herein is 3D memory with vertical NAND strings having a III-V compound channel, as well as methods of fabrication. The III-V compound has at least one group III element and at least one group V element. The III-V compound provides for high electron mobility transistor cells. Note that III-V materials may have a much higher electron mobility compared to silicon. Thus, much higher cell current and overall cell performance can be achieved. Also, the memory device may have better read-write efficiency due to much higher carrier mobility and velocity. The tunnel dielectric of the memory cells may have an $Al_2O_3$ film in direct contact with the III-V NAND channel. The drain end of the NAND channel may be a metal-III-V alloy in direct contact with a metal region. The body of the source side select transistor could be formed from the III-V compound or from crystalline silicon.

24 Claims, 51 Drawing Sheets

(56) References Cited

U.S. PATENT DOCUMENTS

| | | |
|---|---|---|
| 8,847,302 B2 | 9/2014 | Alsmeier et al. |
| 2011/0298013 A1 | 12/2011 | Hwang et al. |
| 2012/0164821 A1 | 6/2012 | Kim et al. |
| 2012/0256247 A1* | 10/2012 | Alsmeier ............. H01L 21/764 257/319 |
| 2013/0234130 A1 | 9/2013 | Ino |
| 2013/0248974 A1* | 9/2013 | Alsmeier ............. G11C 16/04 257/321 |
| 2013/0341701 A1 | 12/2013 | Blomme et al. |
| 2013/0341702 A1 | 12/2013 | Kar et al. |
| 2014/0001519 A1 | 1/2014 | Dewey et al. |
| 2014/0264525 A1 | 9/2014 | Takahashi et al. |
| 2015/0076620 A1* | 3/2015 | Waldron ............. H01L 29/20 257/401 |

OTHER PUBLICATIONS

Park, Won II, et al., "Controlled Synthesis of Millimeter-Long Silicon Nanowires with Uniform Electronic Properties," Nano Letters, vol. 8, No. 9, Jul. 12, 2008, 6 pages.

Semiconductor Today, "InGaAs buffer/channel structure boosts effective mobility 4.2x that of silicon," [downloaded from http://www.semiconductor-today.com/news_items/2012/JAN/KIM_040112.html], Jan. 4, 2012, 2 pages.

Semiconductor Today, "Self-aligned Ni—InGaAs as source-drain for InGaAs MOSFET," [downloaded from http://www.semiconductor-today.com/news_items/2011/FEB/NAIST_040211.htm], Feb. 4, 2011, 2 pages.

Response to Restriction Requirement dated Jun. 16, 2016, U.S. Appl. No. 14/666,678, filed Mar. 24, 2015.
Non-final Office Action dated Nov. 17, 2016, U.S. Appl. No. 14/666,678, filed Mar. 24, 2015.
Response to Office Action dated Jan. 31, 2017, U.S. Appl. No. 14/666,678, filed Mar. 24, 2015.

* cited by examiner

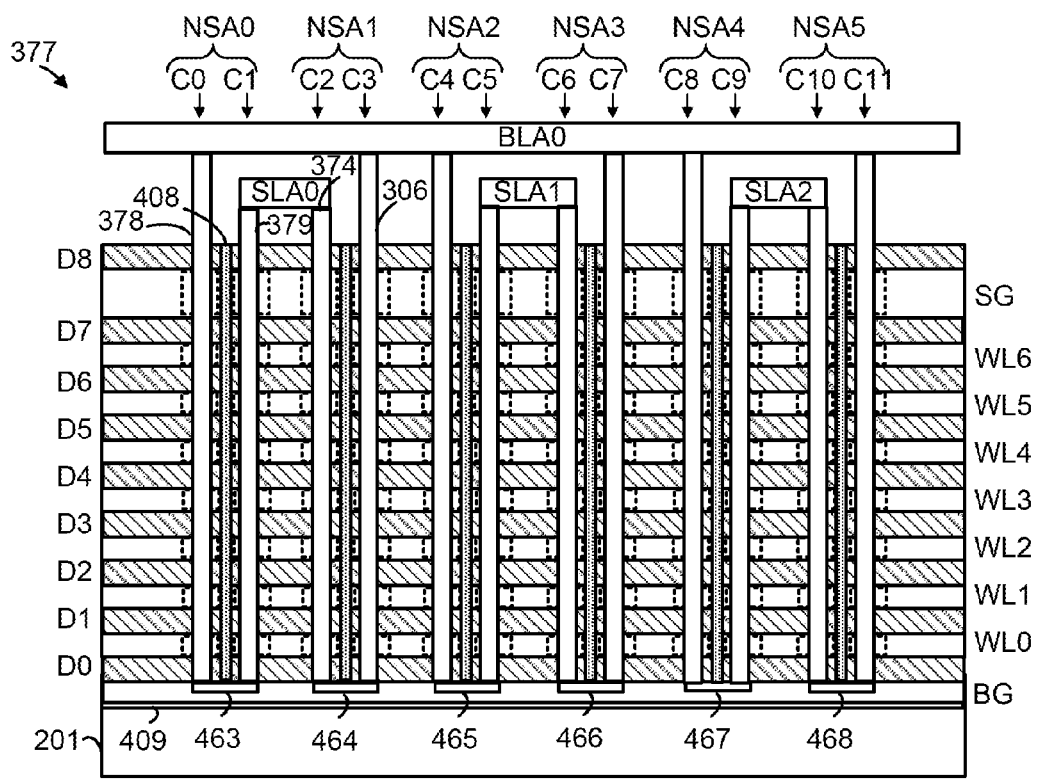

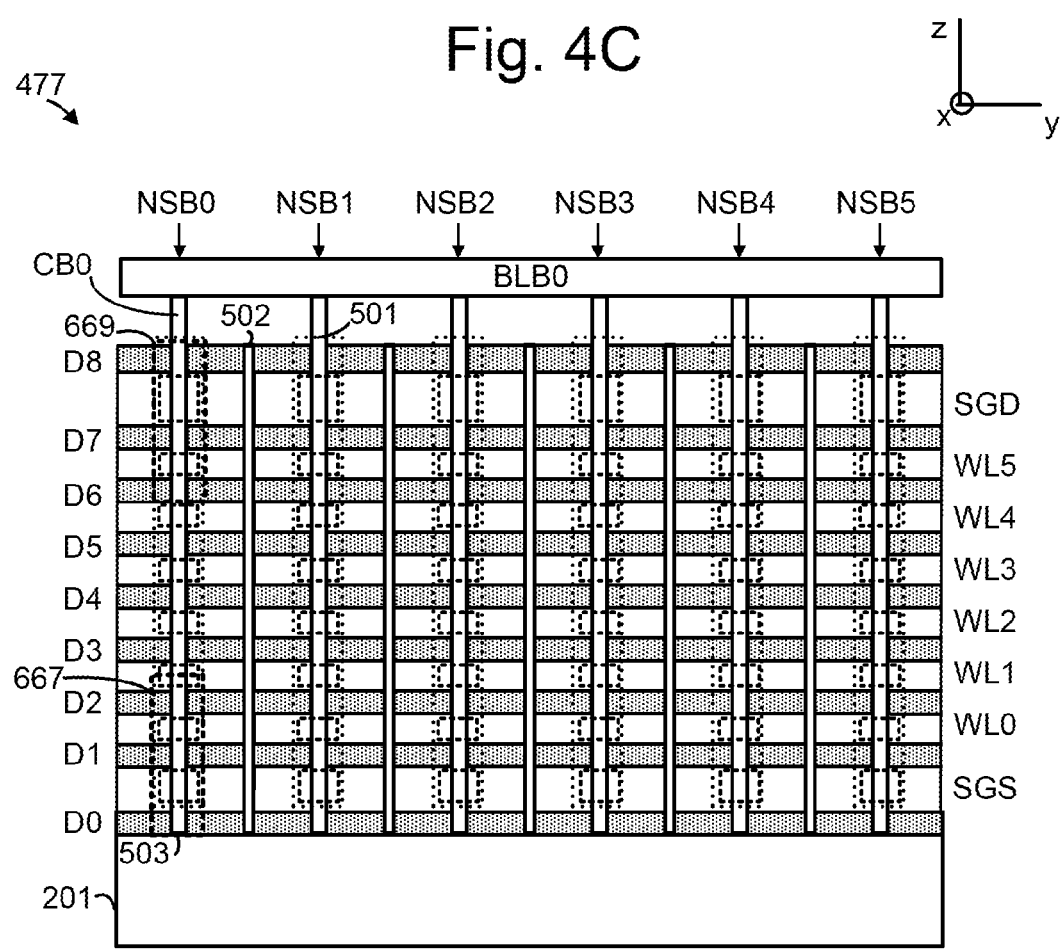

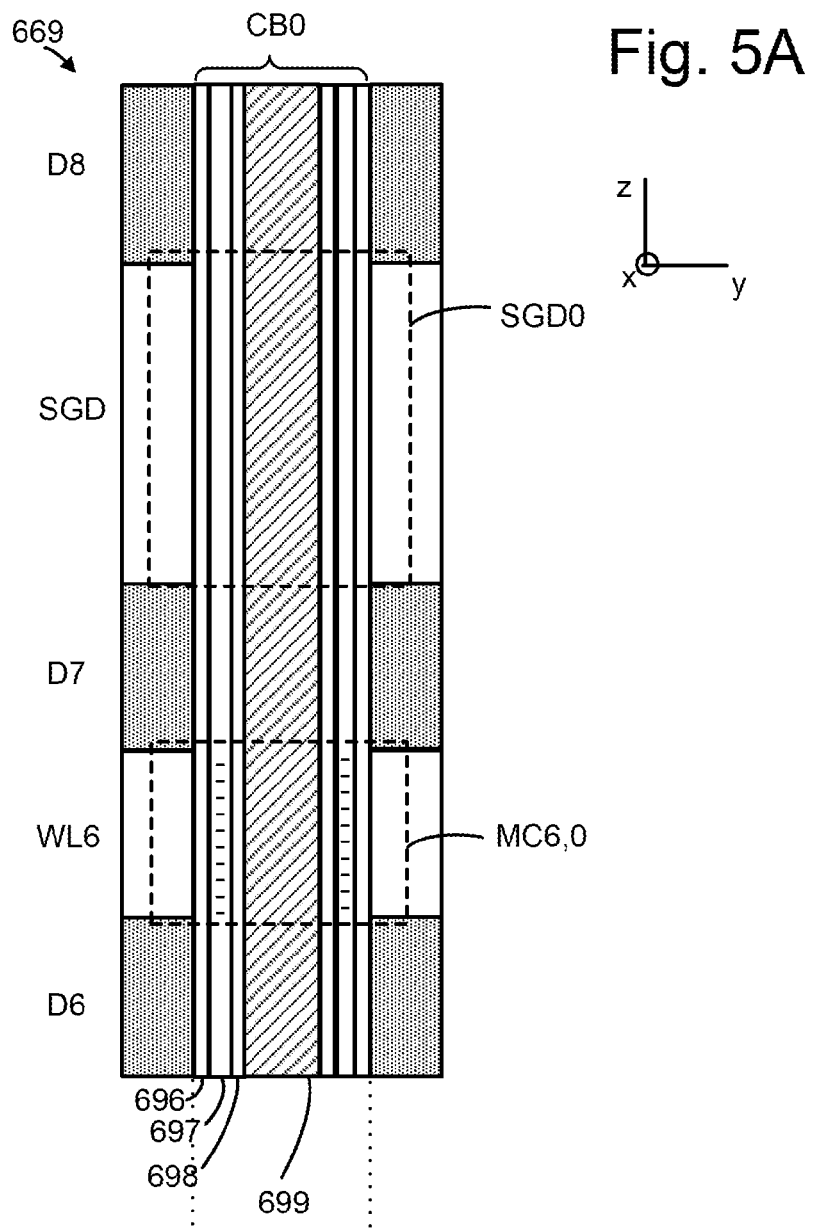
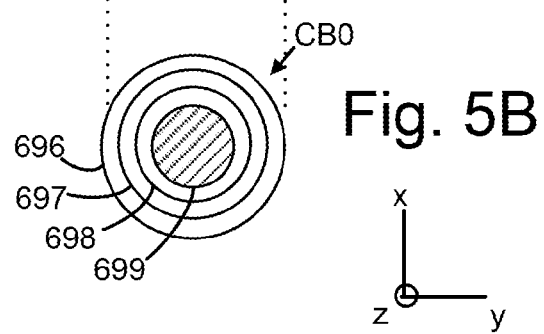

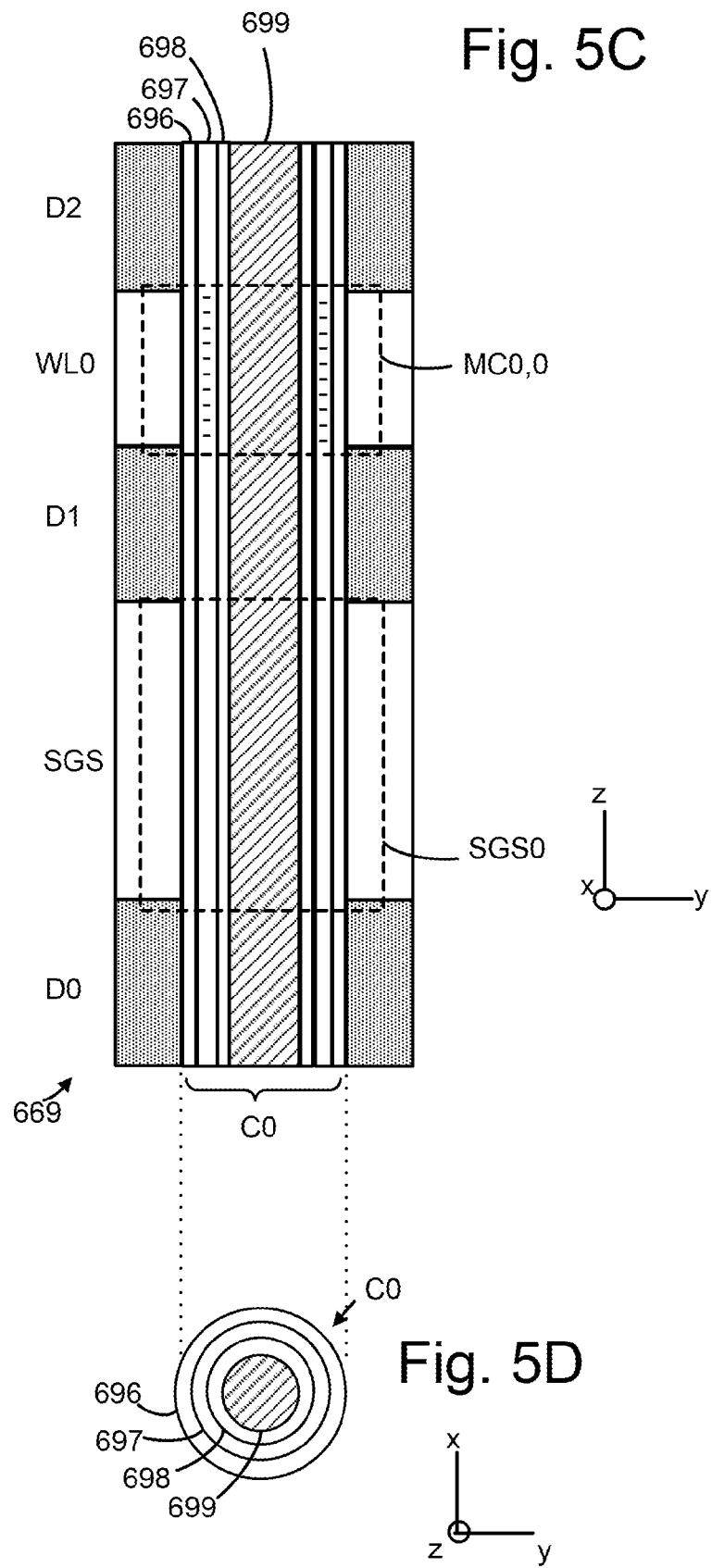

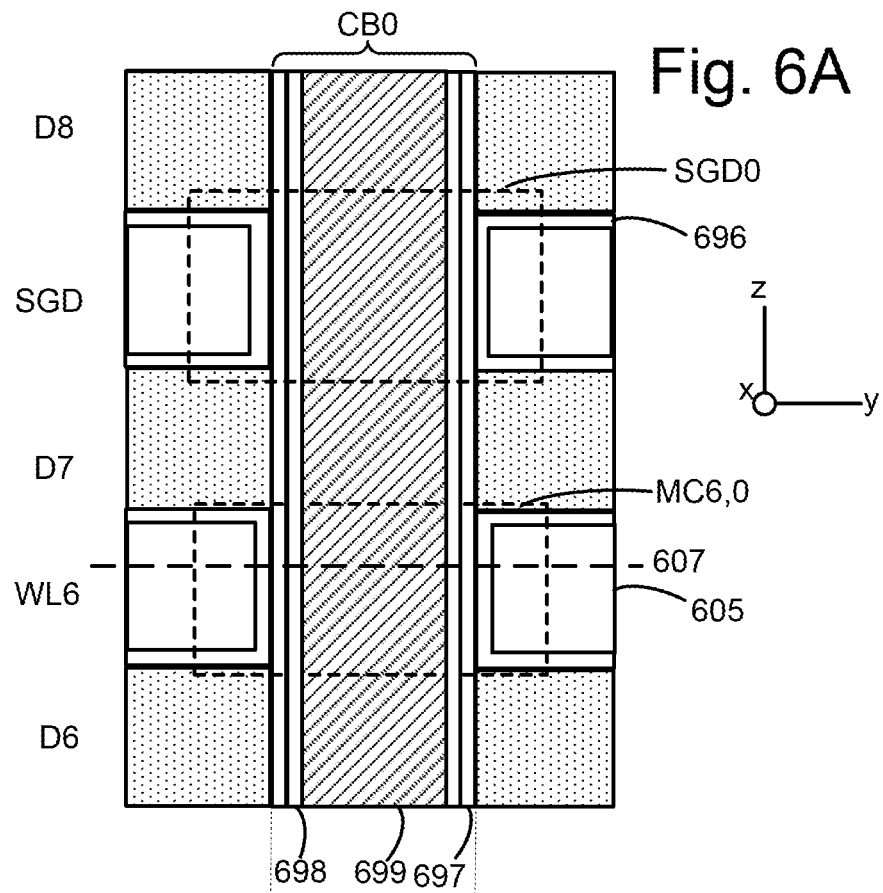
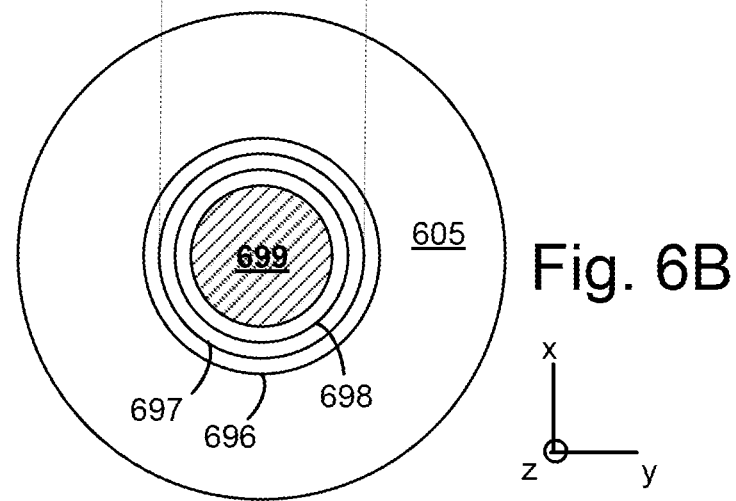

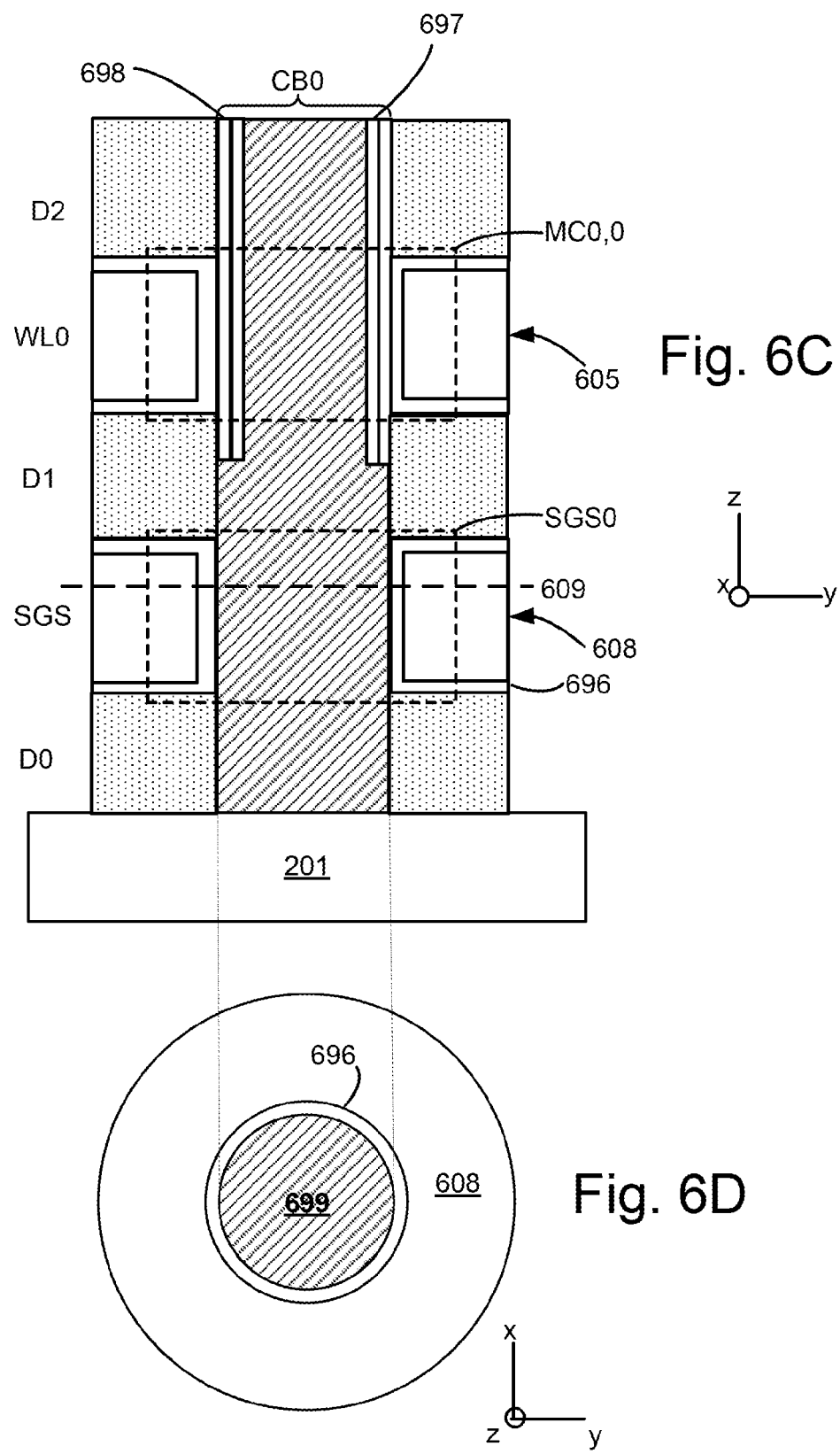

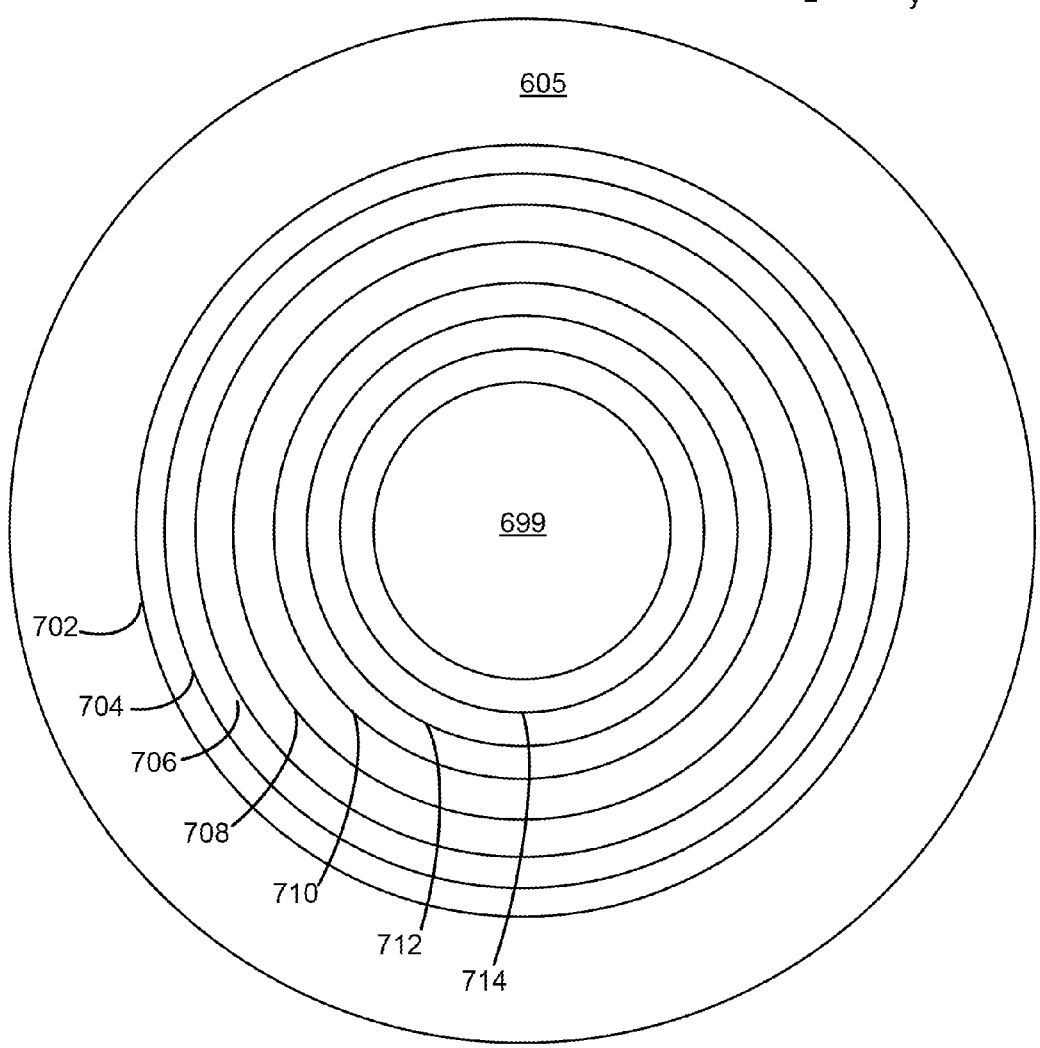

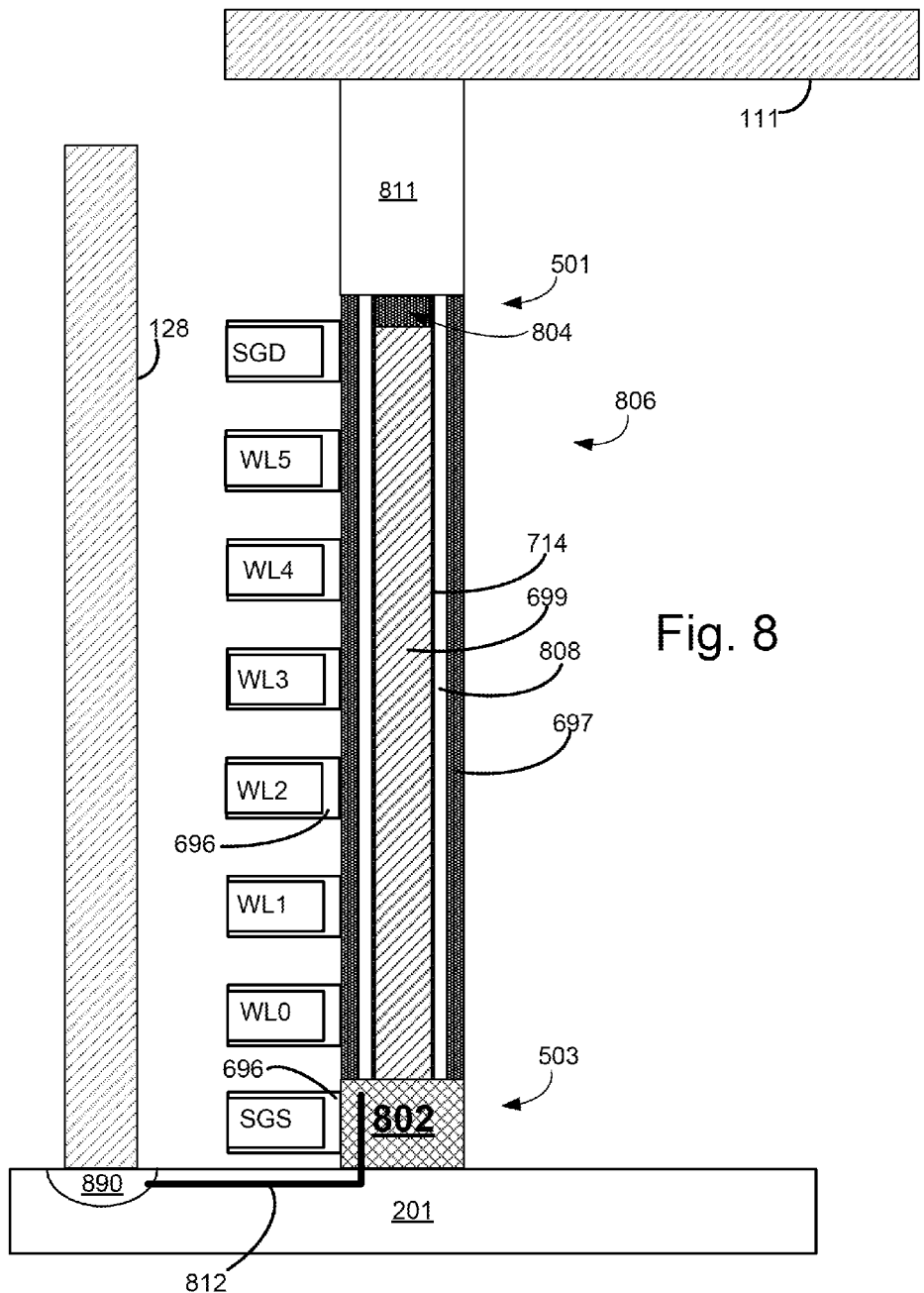

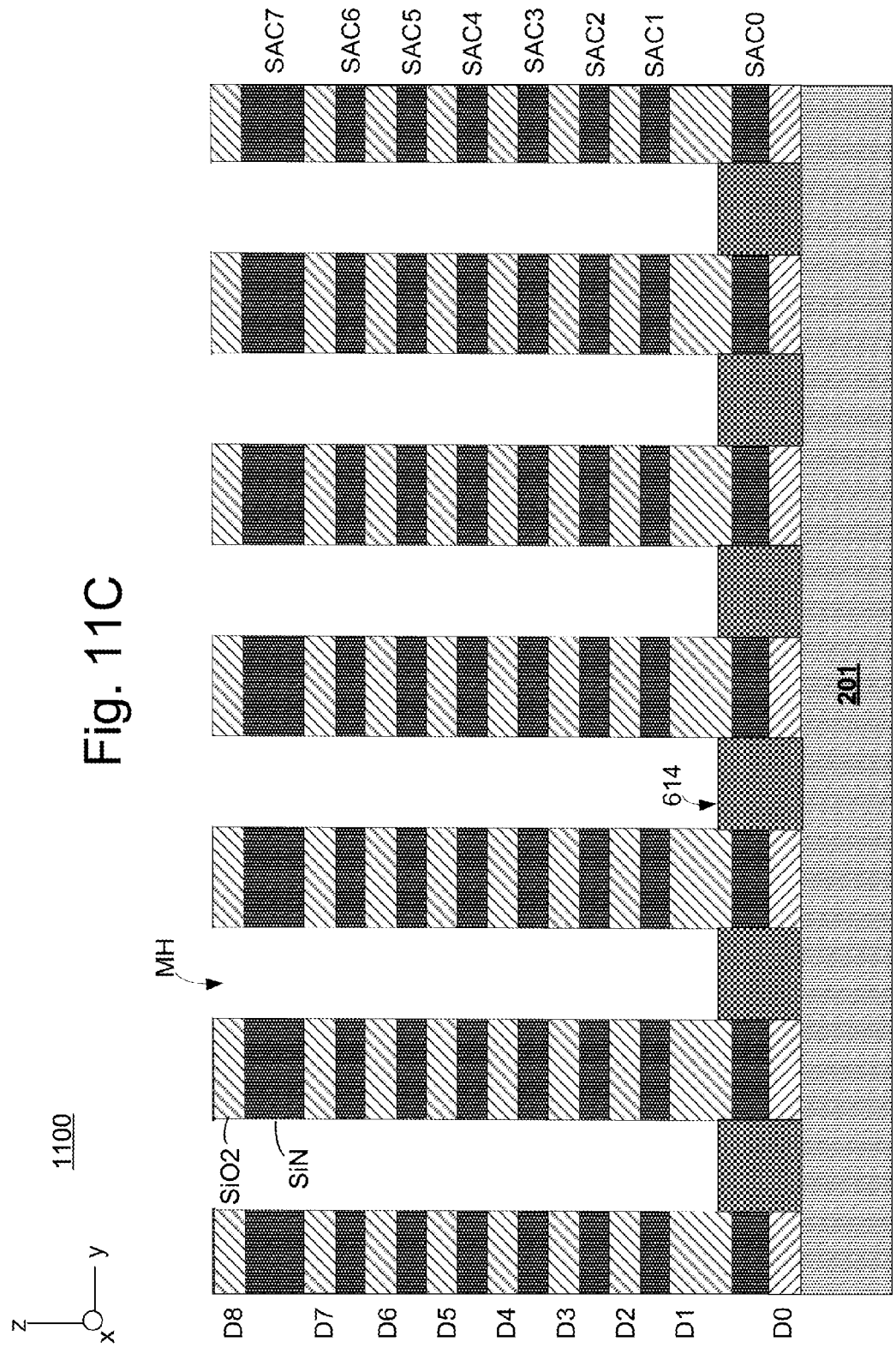

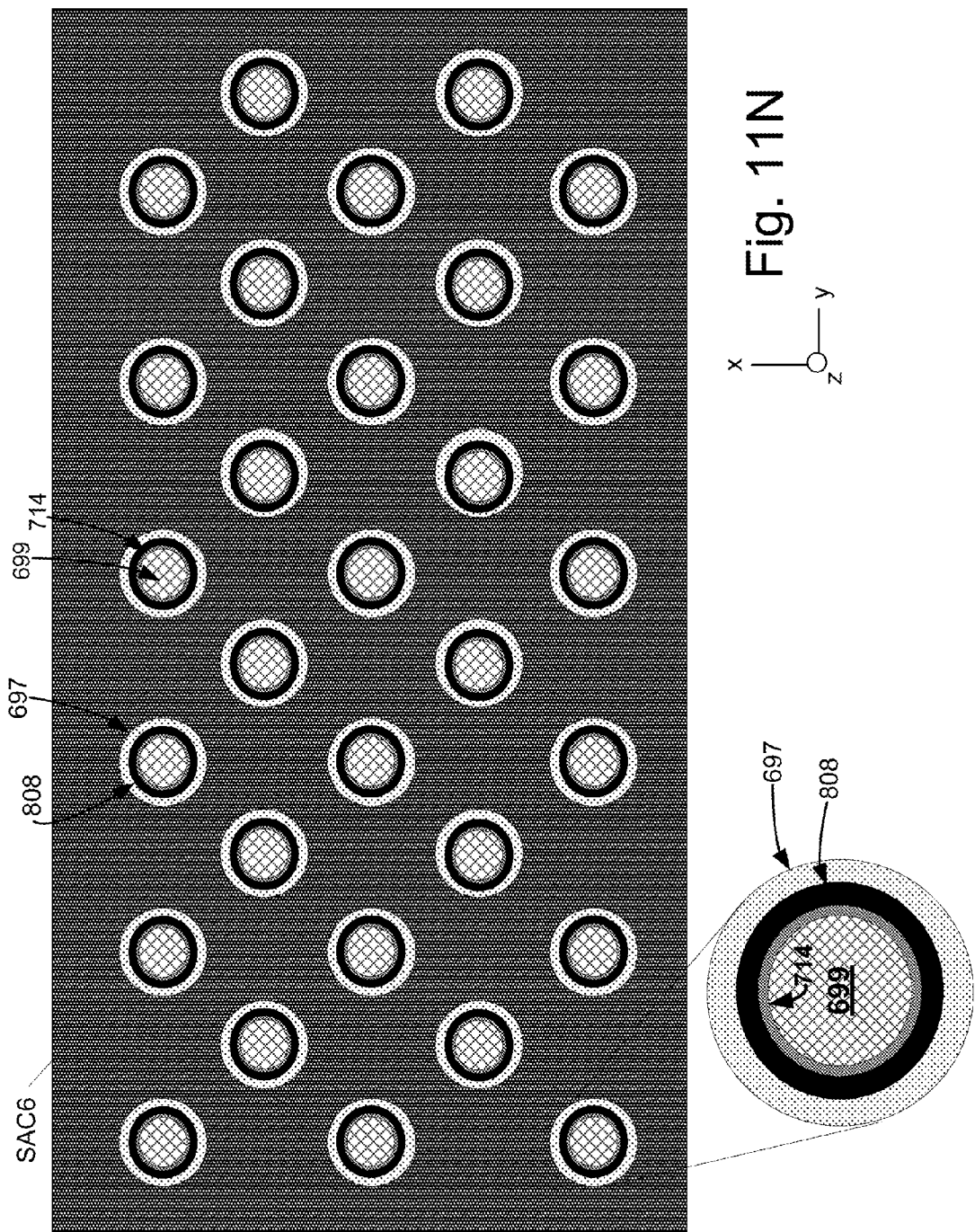

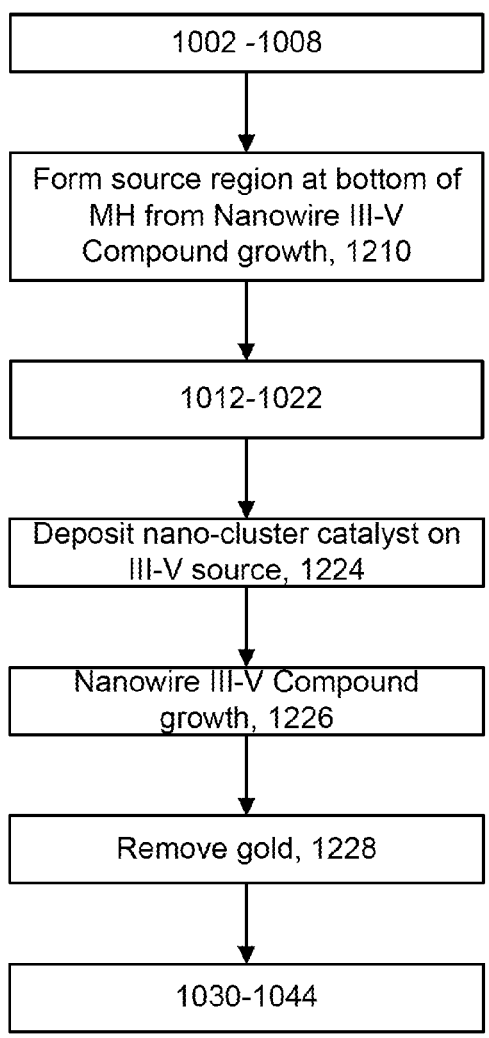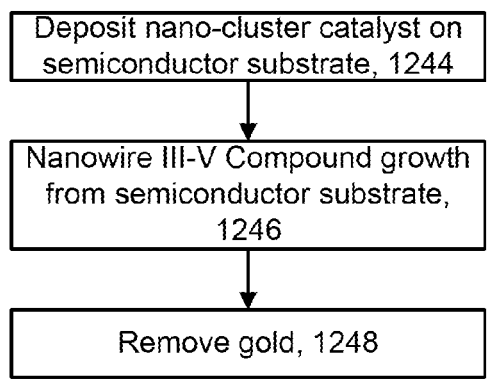
Fig. 12A
Fig. 12B

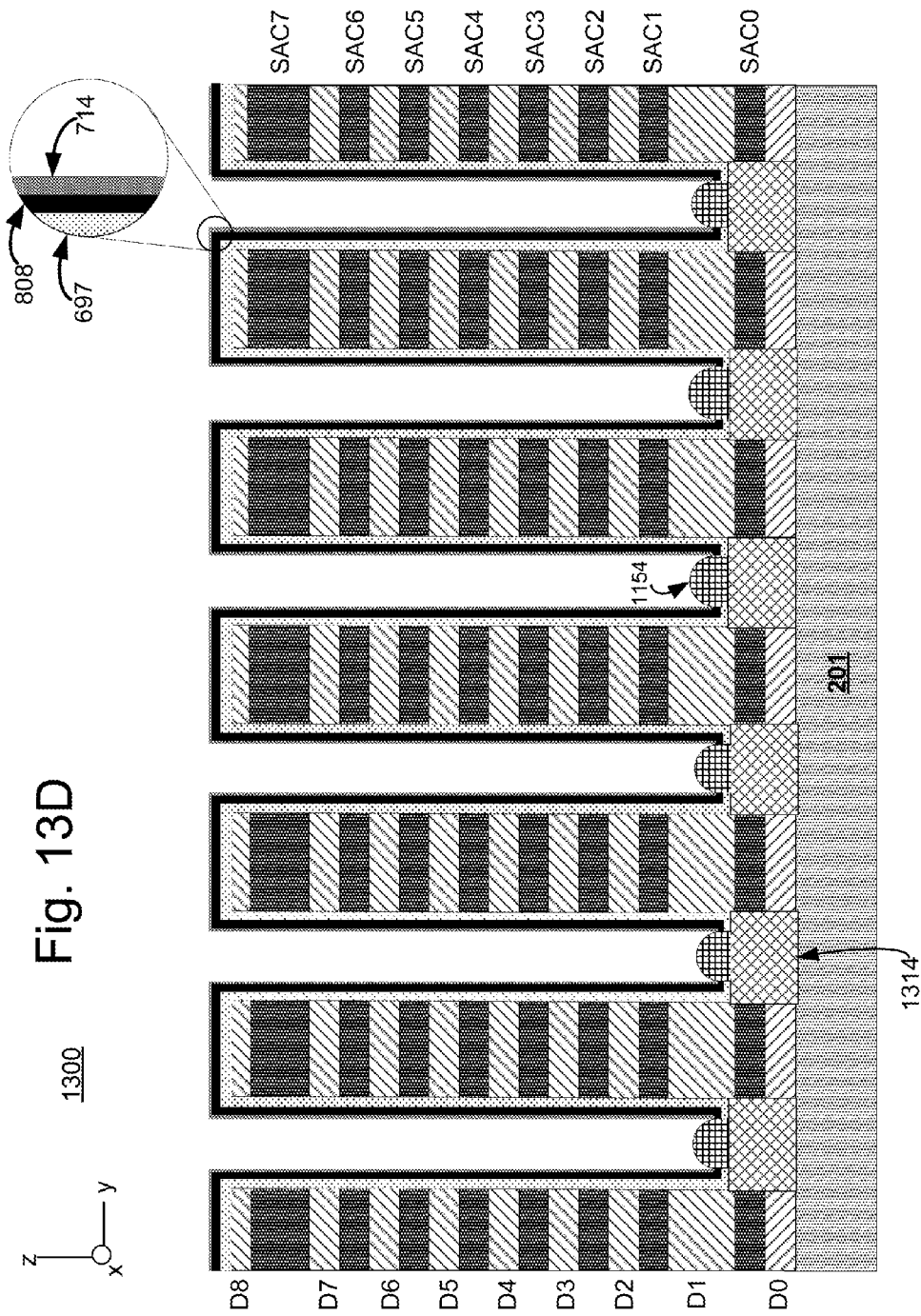

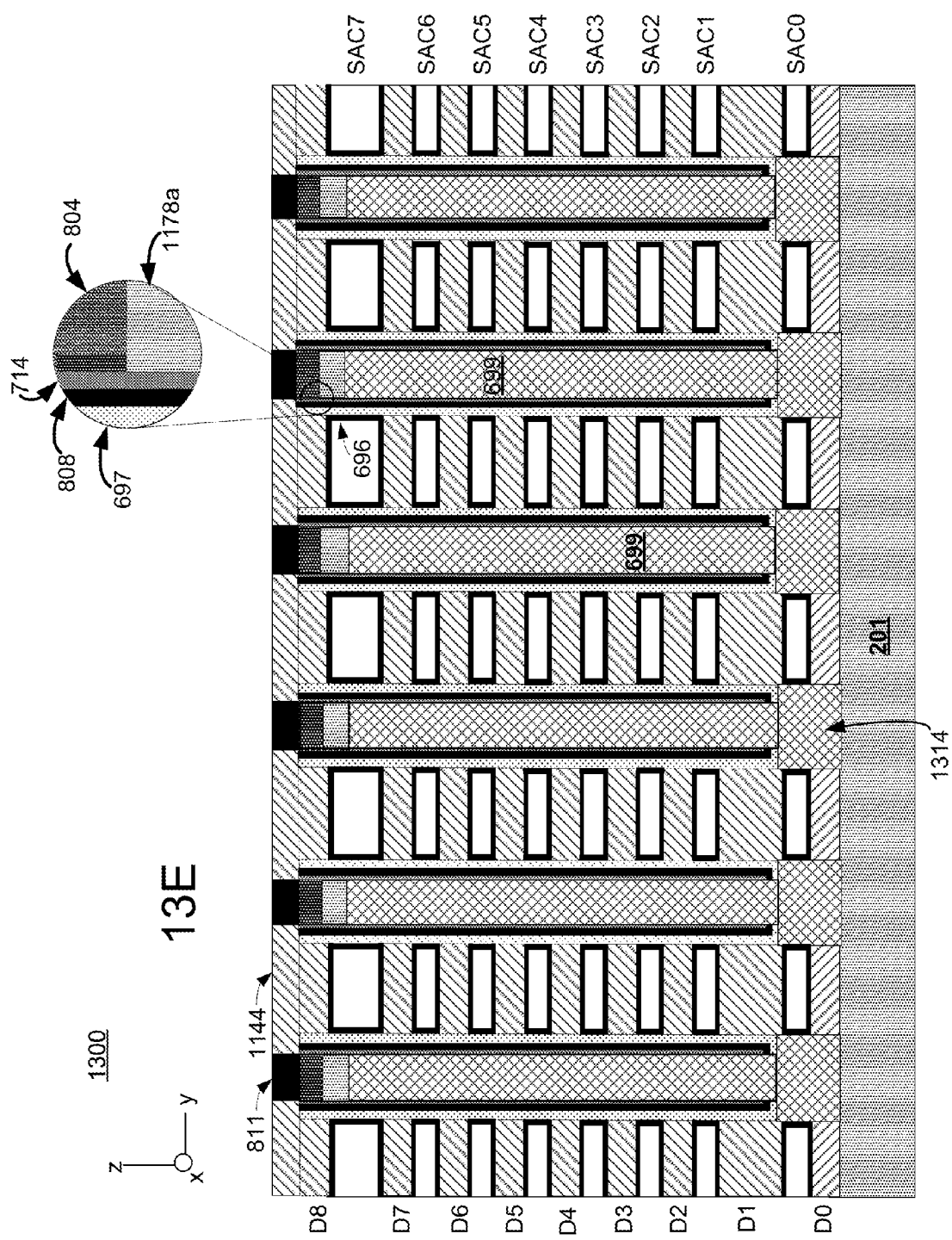

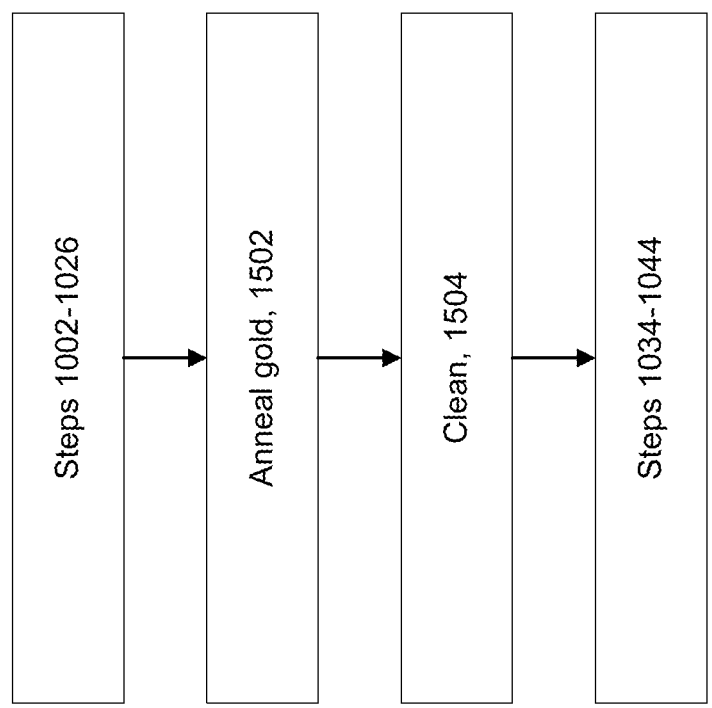

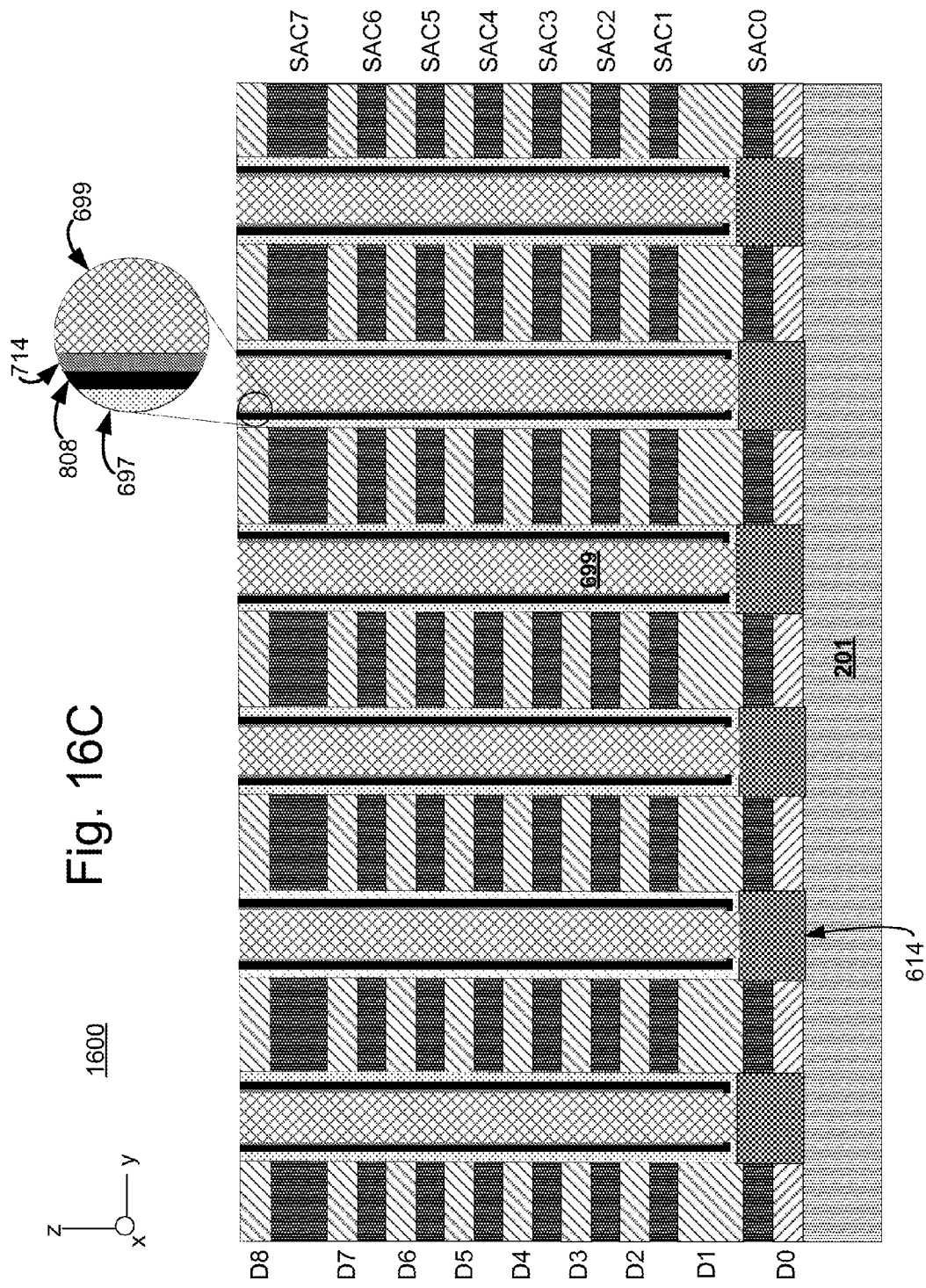

METHOD OF FORMING 3D VERTICAL NAND WITH III-V CHANNEL

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. In one technique, a memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

BRIEF DESCRIPTION OF THE DRAWINGS

Like-numbered elements refer to common components in the different figures.

FIG. 3B depicts a cross-sectional view of a block of the 3D non-volatile memory device of FIG. 3A of SetA0 of NAND strings of FIG. 3A.

FIG. 4C depicts a cross-sectional view of a block of a 3D non-volatile memory device having straight strings.

FIG. 5A depicts a close-up view of the region 669 of the column C0 of FIG. 4C, showing a drain-side select transistor SGD0 and a memory cell MC6,0.

FIG. 5B depicts a cross-sectional view of the column C0 of FIG. 5A.

FIG. 5C depicts a close-up view of region 667 of FIG. 4C.

FIG. 5D depicts a cross-sectional view of the column C0 of FIG. 5C.

FIGS. 6A and 6B depict an alternative embodiment to that of FIGS. 5A and 5B.

FIGS. 6C and 6D depict an alternative embodiment to that of FIGS. 5C and 5D.

FIG. 7C shows further details of one embodiment of the blocking layer, the charge trapping layer, the tunnel dielectric layer, and the III-V channel.

FIG. 8 shows electrical connections between the III-V compound vertical NAND channel and a bit line and a source line.

FIG. 12A is a flowchart of one embodiment of a process of fabricating a 3D memory device in which the entire NAND channel (including the body of the source side select transistor) is formed from a III-V compound.

FIG. 12B is a flowchart that provides details for one embodiment of step 1210 of FIG. 12A.

FIGS. 13D-13E depict results after various steps of FIG. 12A.

FIG. 15A is a flowchart of one embodiment of creating an alloy at the drain end of the NAND channel.

FIGS. 16B and 16C depict results during one embodiment of the process of FIG. 16A.

DETAILED DESCRIPTION

Figure 1:
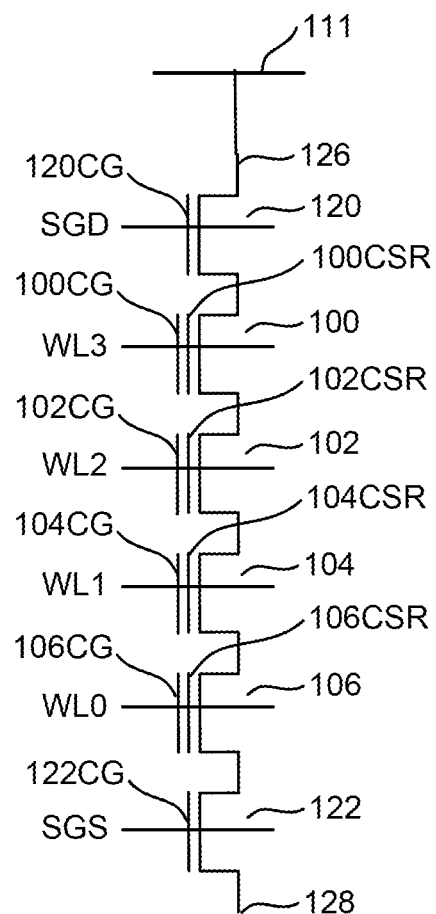
FIG. 1 is a circuit representation of a NAND string.

Disclosed herein is 3D memory with vertical NAND strings having a III-V compound channel, as well as methods of fabrication. The III-V compound has at least one group III element and at least one group V element. The III-V compound may be mono-crystalline. The III-V compound provides for high electron mobility transistor cells (as well as high hole mobility). Note that III-V materials may have a much higher electron mobility compared to silicon (as well as higher hole mobility). Thus, much higher cell current and overall cell performance can be achieved. Also, the memory device may have better read-write efficiency due to much higher carrier mobility and velocity.

Numerous challenges arise when incorporating a III-V channel into 3D memory with vertical NAND strings. The NAND string has a number of memory cells in series. Each memory cell has a charge storage region. A tunnel dielectric film resides between the charge storage regions and the III-V channel. One challenge is providing a good interface between the III-V channel and the tunnel dielectric of the memory cells. The inner-most dielectric film should have a good interface quality with the III-V channel. Moreover, the inner-most dielectric film serves as a part of the tunnel barrier between the NAND channel and the charge storage regions. One embodiment includes a tunnel dielectric that has an aluminum oxide ($Al_2O_3$) film in direct contact with the III-V NAND channel. As one example, the III-V material could be InGaAs. $Al_2O_3$ has good interface properties with InGaAs, resulting in high electron mobility. Also, $Al_2O_3$ is a high-k dielectric. Therefore, it can improve gate capacitance and overall device performance.

The NAND strings are each associated with a bit line. There is a metal bit line contact that provides the electrical connection between a drain end of the NAND channel and the bit line, in one embodiment. Another challenge is providing a good contact between the drain end of the III-V channel and a metal bit line contact. In one embodiment, the drain end of the NAND channel is a metal-III-V alloy. For example, Ni—InGaAs forms the drain end of the NAND channel. This provides a good Ohmic contact to a metal bit line contact (or some other metal region). The metal bit line contact could also be tungsten, aluminum, etc.

The NAND strings are each associated with a source line. Typically, one source line is common to a number of NAND strings. A source side select transistor may connect/disconnect the III-V channel to/from the source line. In one embodiment, the body of the source side select transistor is in direct contact with a semiconductor substrate, which may be silicon. In one embodiment, the body is formed from the III-V semiconductor. In one embodiment, the body is formed from silicon.

Fabricating the III-V NAND channels also presents technical challenges. In some embodiments, the III-V NAND channels are formed in "memory holes," which are vertical holes that extend through horizontal layers of material above the semiconductor substrate. Fabrication techniques should be cost effective. A factor in this is the time it takes to form the NAND channels. In one embodiment, the III-V semiconductor is grown upwards in the memory hole. This results in a solid core of III-V semiconductor in the memory hole. Note that the tunnel dielectric and charge storage regions could be formed in the memory holes prior to forming the III-V semiconductor channel. This growth technique provides for a good quality NAND channel. This growth technique may be referred to as "self-directed," which as that term is used herein means that growth inside of the memory hole defines the shape and location of the NAND channel. Moreover, growth techniques disclosed herein are fast and cost effective.

In one embodiment, a nanowire of III-V semiconductor is grown in the aforementioned memory hole to result in the III-V NAND channel. In one embodiment, the III-V semiconductor is grown in the memory hole upwards using epitaxial growth to result in the III-V NAND channel.

The following is a discussion of some parameters of interest for 3D NAND memory devices. One parameter of note in 3D NAND memory devices is the "on current" of the memory cell on the NAND string, which is referred to as $I_{CELL}$. A higher $I_{CELL}$ can provide better sensing margin. Another parameter of note in 3D NAND memory devices is the sub-threshold slope, which may be defined as the slope of the Vgs/$I_{CELL}$ curve below the memory cell's threshold voltage. The sub-threshold slope, often measured in mV/decade, generally describes the Vgs voltage increase necessary to increase Icell by one order of magnitude. A low slope means that a smaller Vgs increase is needed for a certain Icell increase. When the sub-threshold slope is smaller, the Icell-Vgs curve shows sharper increase of Icell current with every incremental Vgs voltage increase. A low (e.g., relatively flat) slope can make it easier to determine which memory cells are off. Another parameter of note in 3D NAND memory devices is select transistor leakage. This refers to leakage of select transistors that connect/disconnect the NAND string from a bit line or source line. Another parameter of note in 3D NAND memory devices is carrier generation, including trap assisted generation and band-to-band (BTB) generation. Low carrier generation can significantly improve boosting during programming. Also, low carrier generation can reduce program disturb. This can reduce the need to use complicated boosting schemes. This, in turn, can simplify chip design and reduce chip size.

One embodiment of a 3D memory device having a III-V compound NAND string channel has a high on current (e.g., high $I_{CELL}$). One embodiment of a 3D memory device having a III-V compound NAND string channel has a low sub-threshold slope. Thus, the memory cell turns on fast (e.g., $I_{CELL}$ increases sharply with an increment in Vg). One embodiment of a 3D memory device having a III-V compound NAND string channel has a low select transistor leakage.

In one embodiment, the III-V compound NAND string is mono-crystalline. Hence, problems associated with many grain boundaries are avoided. Grain boundaries may be associated with defects. These defects may increase leakage, increase trap assisted carrier generation, reduce cell on current, reduce mobility of charge carriers, and introduce variability of device parameters. One embodiment having a mono-crystalline III-V compound NAND string channel has no grain boundaries and no associated defects/traps. Thus, the adverse effects that such defects/traps have on electron mobility and channel leakage are avoided.

One example of a non-volatile storage system that can implement the technology described herein is a flash memory system that uses the NAND structure, which includes arranging multiple memory cell transistors in series, sandwiched between two select transistors. The memory cell transistors in series and the select transistors are referred to as a NAND string. FIG. 1 is a circuit representation of a NAND string. The NAND string depicted in FIG. 1 includes four memory cell transistors 100, 102, 104 and 106 in series and sandwiched between (drain side) select transistor 120 and (source side) select transistor 122. Select transistor 120 connects the NAND string to a bit line 111. Select transistor 122 connects the NAND string to source line 128. Select transistor 120 is controlled by applying the appropriate voltages to select line SGD. The select line (SGD) is connected to a control gate terminal 120CG of the select transistor 120. Select transistor 122 is controlled by applying the appropriate voltages to select line SGS. The select line (SGS) is connected to a control gate terminal 122CG of the select transistor 122. Note that there may be more than one select transistor at each end of the NAND string, which work together as a switch to connect/disconnect the NAND string to and from the bit line and source line. For example, there may be multiple select transistors in series at each end of the NAND string.

Each of the memory cell transistors 100, 102, 104 and 106 has a control gate (CG) and a charge storage region (CSR). For example, memory cell transistor 100 has control gate 100CG charge storage region 1600CSR. Memory cell transistor 102 includes control gate 102CG and a charge storage region 102CSR. Memory cell transistor 104 includes control gate 104CG and charge storage region 104CSR. Memory cell transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of oxide-nitride-oxide ("ONO") is sandwiched between a conductive control gate and the memory cell channel. As one example, the ONO is silicon oxide, silicon nitride and silicon oxide. As another example, the ONO may be $Al_2O_3$—SiN—$SiO_2$. In the direction from the control gate toward the NAND channel, the first oxide (e.g., $Al_2O_3$) is a blocking layer, which blocks undesirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—$SiO_2$ in the direction from control gate toward the NAND channel, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from polysilicon. This may be heavily doped polysilicon. Other types of non-volatile memory technologies can also be used.

Figure 2:
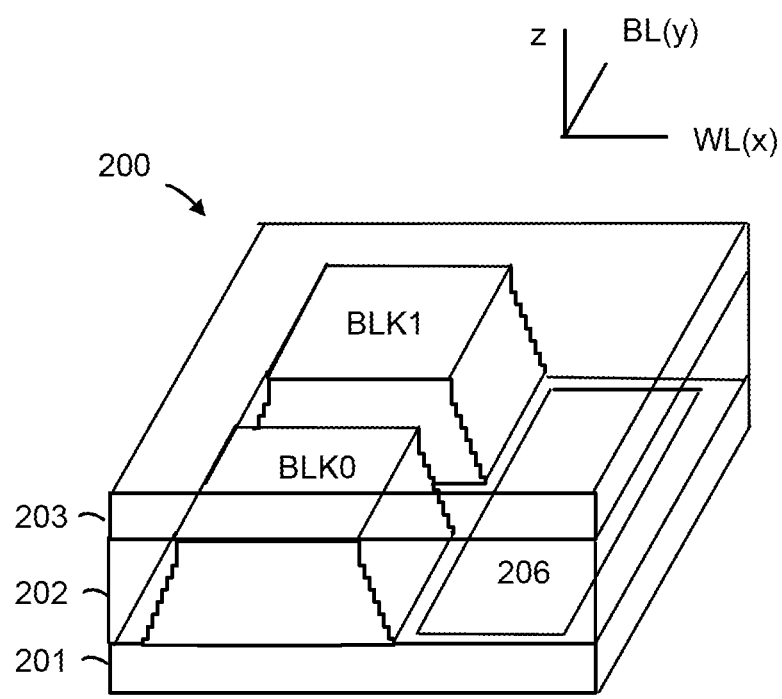
FIG. 2 is a perspective view of a 3D stacked non-volatile memory device.

FIG. 2 is a perspective view of a 3D stacked non-volatile memory device. The 3D memory device 200 includes a substrate 201. In one embodiment, the substrate 201 is formed from silicon. Thus, the substrate 201 may be a semiconductor substrate. The substrate 201 may be a semiconductor wafer. The substrate 201 has a major axis that extends in what will be referred to herein as a horizontal direction, in one embodiment. In FIG. 2, both the x-axis and y-axis extend in the horizontal direction. The substrate 201 has a major surface that extends in the x-y plane. On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3A:
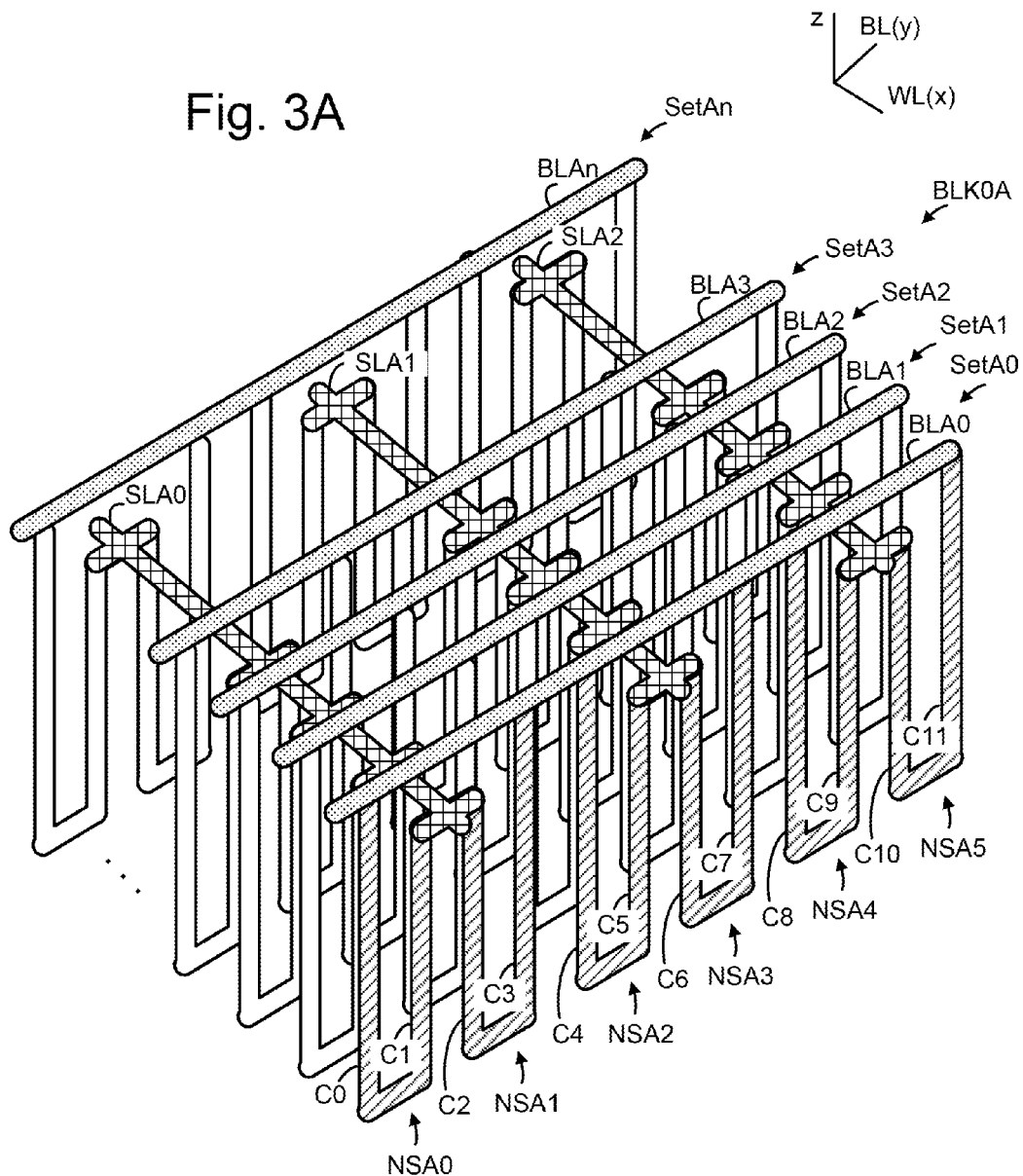
FIG. 3A depicts an embodiment of block BLK0 of FIG. 2 which includes U-shaped NAND strings.

In one embodiment, NAND strings have a U-shape. In another embodiment, NAND strings have a straight shape. FIG. 3A depicts an embodiment of block BLK0 of FIG. 2 which includes U-shaped NAND strings. The block BLK0A includes U-shaped NAND strings arranged in sets (SetA0, . . . , SetAn, where there are n+1 sets of NAND strings in a block). Each set of NAND strings is associated with one bit line (BLA0, BLA1, BLA2, BLA3, . . . , BLAn). In one embodiment, each NAND string has a drain side select transistor that is able to connect/disconnect the NAND string from its bit line. The drain side select transistors in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

FIG. 3B depicts a cross-sectional view of a block of the 3D non-volatile memory device of FIG. 3A of SetA0 of NAND strings of FIG. 3A. Columns of memory cells C0 to C11 are depicted in the multi-layer stack. The stack 377 includes the substrate 201, an insulating film 409 on the substrate 201, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 468 which connect the columns. The back gate when properly biased, allows the back gate transistor to connect, through the pipe connection, thus connecting the two columns of each U-shaped NAND string. For example, NSA0 includes columns C0 and C1 and connecting portion 463. NSA0 has a drain end 378 and a source end 379. NSA1 includes columns C2 and C3 and connecting portion 464. NSA1 has a drain end 306 and a source end 374. NSA2 includes columns C4 and C5 and connecting portion 665. NSA3 includes columns C6 and C7 and connecting portion 466. NSA4 includes columns C8 and C9 and connecting portion 467. NSA5 includes columns C10 and C11 and connecting portion 468.

The source line SLA0 is connected to the source ends 379 and 374 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 377 extend behind the U-shaped NAND strings depicted in the cross-section, e.g., along the x-axis. The U-shaped NAND strings NSA0 to NSA5 are each in a different sub-block, but are in a common set of NAND strings (SetA0).

A slit portion 408 is also depicted as an example. In the cross-section, multiple slit portions are seen, where each slit portion is between the drain- and source-side columns of a U-shaped NAND string. Portions of the source lines SLA0, SLA1, SLA2 are also depicted. A portion of the bit line BLA0 is also depicted.

Short dashed lines depict memory cells (or memory cell transistors) and select transistors, as discussed further below. Thus, FIG. 3B shows strings (e.g., NAND strings) of non-volatile storage elements formed above the substrate 201 in multiple physical levels of a three-dimensional memory array. Each of the strings has an active area comprising a channel that extends vertically through the physical levels. Each string comprises non-volatile storage elements and a drain side select transistor in the SG layer.

Figure 4A:
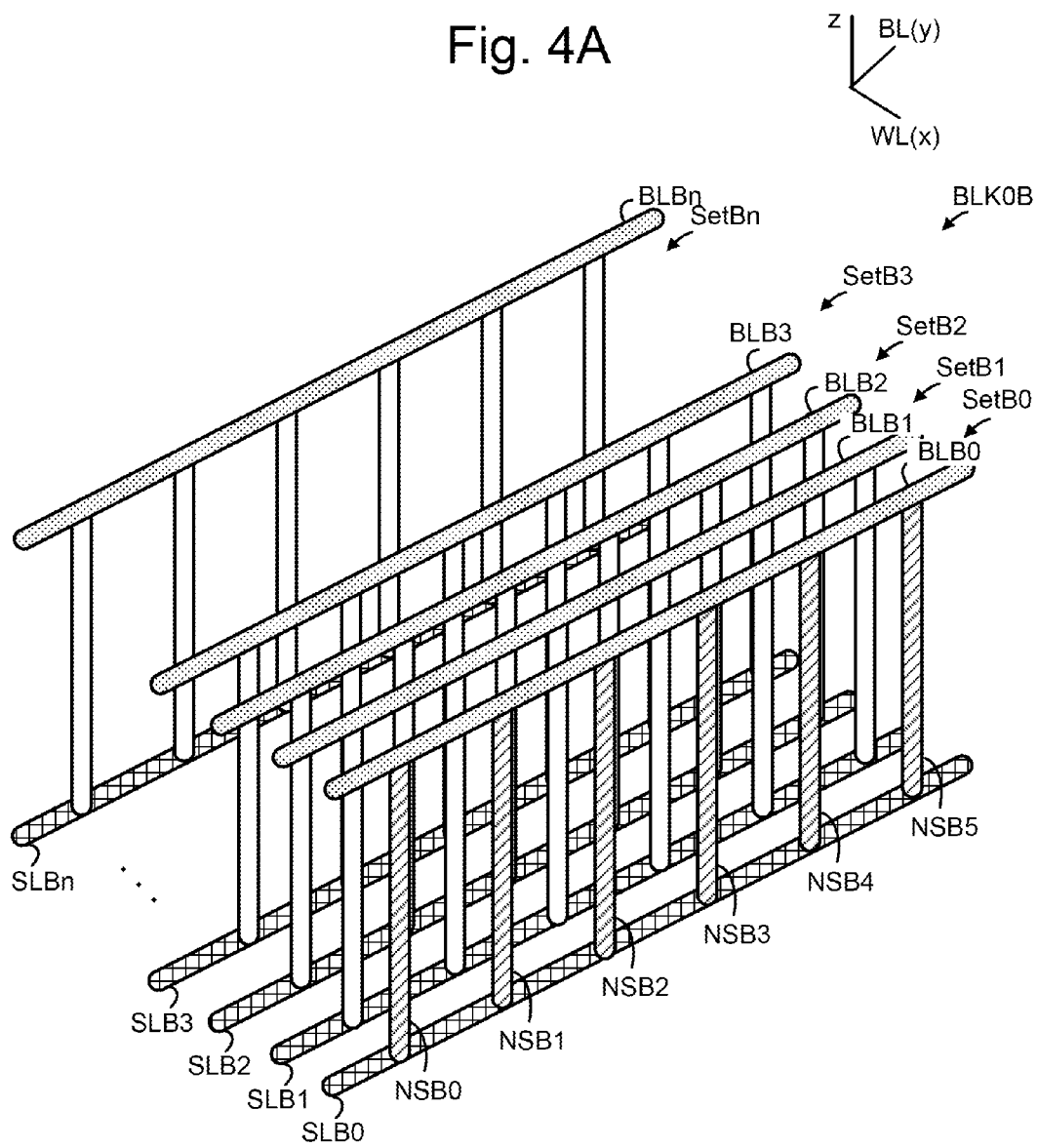
FIG. 4A depicts an embodiment of block BLK0 of FIG. 2 which includes straight NAND strings.

FIG. 4A depicts an embodiment of block BLK0 of FIG. 2 which includes straight NAND strings. The block BLK0B includes straight NAND strings arranged in sets (SetB0, SetB1, SetB2, SetB3, . . . , SetBn, where there are n+1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 4B:
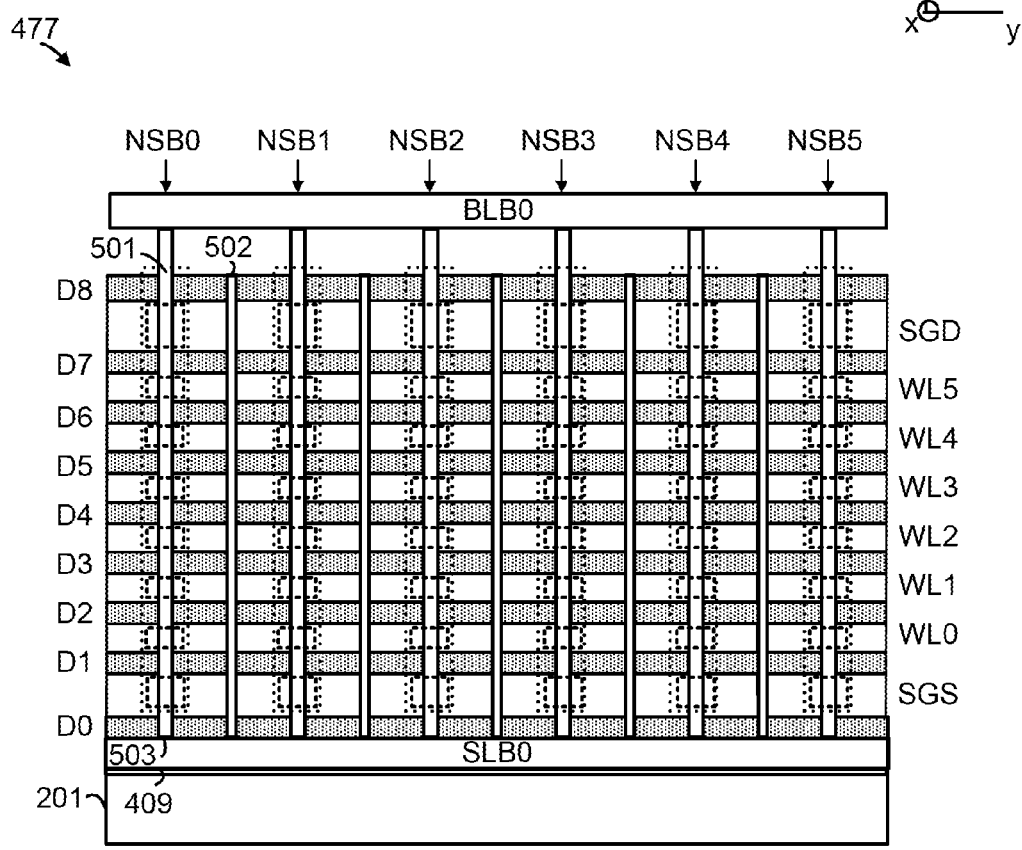
FIG. 4B depicts a cross-sectional view of a block of the 3D non-volatile memory device of FIG. 4A having straight strings.

FIG. 4B depicts a cross-sectional view of a block of the 3D non-volatile memory device of FIG. 4A having straight strings. The view of a portion of setB0 of NAND strings of FIG. 4A. Columns of memory cells corresponding to NAND strings NSB0 to NSB5, respectively, are depicted in the multi-layer stack. The stack 477 includes a substrate 201, an insulating film 409 on the substrate, and a portion of a source line SLB0. Additional straight NAND strings in a sub-block may extend in front of and in back of the NAND strings depicted in the cross-section, e.g., along the x-axis. The NAND strings NSB0 to NSB5 may each be in a different sub-block, but are in a common set of NAND strings (SetB0). NSB0 has a source end 503 and a drain end 501. A slit 502 is also depicted with other slits. It is not required that there be a slit 502 between each pair of strings, as depicted. For example, slits could be used to separate blocks. Slits could be placed between several groups of strings within a block. In this case, a group of strings separated by slits within a block may be referred to as a "finger". There may be several fingers within a block. A portion of the bit line BLB0 is also depicted. Dashed lines depict memory cells and select transistors, as discussed further below.

FIG. 4C depicts a cross-sectional view of a block of another embodiment of a 3D non-volatile memory device having straight strings. This embodiment differs from that of the embodiment of FIG. 4B in that the source end 503 of the NAND strings does not directly contact the source line. Instead, the source end 503 of the NAND string is in direct physical contact with the semiconductor substrate 201. The semiconductor substrate 201 may be silicon. The source line is not depicted in FIG. 4C. A region 669 of the stack that includes column CB0 is shown in greater detail in FIG. 5A.

FIG. 5A depicts a close-up view of region 669, which includes column CB0 of FIG. 4C, showing a drain-side select transistor SGD0 and a memory cell MC6,0 (also referred to as "memory cell transistor"). FIG. 5B depicts a cross-sectional view of the column CB0 of FIG. 5A. The region 669 shows portions of the dielectric layers D6 to D8 and the conductive layers WL6 and SGD. Each column includes a number of layers. These layers can include oxide-nitride-oxide and silicon layers which may be formed using a variety of techniques. Also, the column includes a region of III-V compound for the NAND channel 699. In one embodiment, the III-V compound is InGaAs. However, other III-V compounds including, but not limited to, InAlAs, InAs, GaAs, AlGaAs, InP, GaSb, InGaSb, InSb, InGaAsp, InAlAsP can be used. The III-V compound could be binary, ternary, or quaternary, as in the previous examples. In one embodiment, the III-V channel 699 is $In_xGa_{1-x}As$, where x ranges from 0.65 to 0.73. Note that x could be higher or lower.

A variety of techniques could be used to form the layers. One technique is to drill memory holes into horizontal layers of some material and then fill those memory holes. Note that the memory holes are not necessarily drilled into the horizontal material depicted in FIG. 5A. One option is to first have a sacrificial material instead of the conductive layers WL6 and SGD. After drilling the memory holes and filling the memory holes to form the column, the sacrificial material can be replaced with conductive material for WL6 and SGD. Some of the layers might be formed using atomic layer deposition. For example, a block oxide (or blocking layer) can be deposited on vertical sidewalls of the memory hole as layer 696, a nitride such as SiN as a charge trapping layer (e.g., charge storage region CSR) can be deposited as layer 697, and a tunnel dielectric (or tunneling layer) can be deposited as layer 698. It is not required that all of these layers be formed in the column. An example is discussed below in FIG. 6A in which the blocking layer is not a part of the column.

The block oxide layer 696 and the tunnel dielectric layer 698 may each be formed from several layers of different dielectric materials. In one embodiment, the block oxide layer 696 comprises a layer of $Al_2O_3$ and a layer of $SiO_2$ (the $Al_2O_3$ layer is closer to the word line than the $SiO_2$, in one embodiment). In one embodiment, the tunnel dielectric layer 698 comprises a stack of oxide, nitride and oxide films. Additional memory cells are similarly formed throughout the columns.

One of the challenges of incorporating the III-V compound into the NAND channel is to have a good interface between the III-V compound and the tunnel dielectric layer 698. In one embodiment, the tunnel dielectric layer 698 has a layer of aluminum oxide in direct contact with the III-V compound of the NAND channel 699.

One of the challenges of incorporating the III-V compound into the NAND channel is to have a good Ohmic contact between a metal bit line contact (not depicted in FIG. 5A) and the drain end of the III-V compound NAND channel 699. In one embodiment, the drain end of the NAND channel is a metal-III-V alloy. As one example, it is Ni—InGaAs. Other examples for the metal-III-V alloy include, but are not limited to, Au—InGaAs, Au—Zn—InGaAs, Ni—Au—Ge—InGaAs, etc. In one embodiment, the drain end of the NAND channel is doped with an impurity. For example, an n-type dopant may be used.

Each layer 696-698 is shaped as a hollow cylinder in one possible approach. Region 699 is a III-V compound core, in one possible approach. For example, region 699 may be a solid core that is not hollow. The horizontal cross section of the cylinders may be circular. However, it is not required that the horizontal cross section of the cylinders be circular. In one embodiment, the horizontal cross section of the cylinders is an ellipse. The horizontal cross section of the cylinders could deviate from a perfectly circular or perfectly elliptical shape. Also note that the size (e.g., width in the x-y plane) of the column can vary from top to bottom. Thus, the radius of the cylinders could vary from top to bottom. Thus, the term "cylindrical" as used herein does not require a constant radius from top to bottom. This, the term "cylindrical" as used herein allows for some tapering. Recall that region 669 of the column CB0 of FIG. 4C is for the straight 3D NAND string example. However, the diagrams and discussion for FIGS. 5A and 5B also apply to a U-shaped 3D NAND string, such as the examples of FIGS. 3A-3B.

FIG. 5C depicts a close-up view of region 667, which includes column CB0 of FIG. 4C, showing a source-side select transistor SGS0 and a memory cell MC0,0. One of the challenges of incorporating a III-V compound NAND channel 699 into a 3D memory device is the interface to the semiconductor substrate 201.

When a memory cell such as depicted in FIG. 5A or 5C is programmed, electrons are stored in a portion of the charge trapping layer which is associated with the memory cell. For example, electrons are represented by "-" symbols in the charge trapping layer 697 for MC6,0 in FIG. 5A and MC0,0 in FIG. 5C. These electrons are drawn into the charge trapping layer from the semiconductor body, and through the tunnel oxide. The threshold voltage of a memory cell is increased in proportion to the amount of stored charge.

During one embodiment of an erase operation, a voltage in the NAND channel may be raised due to GIDL, while a voltage of one or more selected word line layers floats. GIDL may occur due to high potential difference between bit line bias and bias applied on SGD to the control gate of the drain side transistor, and similarly, between source line bias and bias applied on SGS to the control gate of the source side transistor. The voltage of the one or more selected word line layers is then driven down sharply to a low level such as 0 V to create an electric field across the tunnel dielectric which may cause holes to be injected from the memory cell's body to the charge trapping layer and recombine with electrons. Also, electrons can tunnel from the charge trapping layer to the positively biased channel. One or both of these mechanisms may work to remove negative charge from the charge trapping layer and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel dielectric is relatively small, and no, or very little, hole tunneling will occur. If word lines are floated, they will be electrically coupled to the NAND channel. As a result their potential will rise resulting in low potential difference between NAND channel and respective word lines. Memory cells of the unselected word lines will experience little or no Vth downshift, and as a result, they will not be erased. Other techniques may be used to erase.

FIGS. 6A and 6B depict an alternative embodiment to that of FIGS. 5A and 5B. FIG. 6A shows similar layers D6, WL6, D7, SGD, and D8, as were depicted in FIG. 5A. A memory cell MC6,0 and a drain side select transistor SGD0, are shown. Note that in this embodiment, the column CB0 has charge trapping layer 697, tunnel dielectric layer 698, and the III-V compound NAND channel 699. However, in the embodiment of FIGS. 6A and 6B, the blocking layer 696 is located outside of the column CB0. The blocking layer 696 has a portion that is in direct contact with charge trapping layer 697. The blocking layer 696 has an optional portion above and below the word line 605. This optional portion results from one embodiment of the fabrication process in which after forming the column, sacrificial material is removed where the word line and blocking layer are to be formed. Then, the blocking layer 696 is deposited, followed by depositing the word line 605. FIG. 6B shows a cross section of FIG. 6A along line 607.

FIGS. 6C and 6D depict an alternative embodiment to that of FIGS. 5C and 5D. FIG. 6C shows similar layers D0, SGS, D1, WL0, and D2, as were depicted in FIG. 5C. A memory cell MC0,0 and a source side select transistor SGS0, are shown. Note that in this embodiment, the charge trapping layer 697 and the tunnel dielectric layer 698 do not extend all the way to the substrate 201. Significantly, the charge trapping layer 697 and the tunnel dielectric layer 698 extend down at least to memory cell MC0,0. In this embodiment, the blocking layer 696 serves as the gate dielectric for the source side select transistor SGS0. However, in another embodiment, the charge trapping layer 697 and the tunnel dielectric layer 698 do extend all the way to the substrate 201. In such an embodiment, the blocking layer 696, the charge trapping layer 697 and the tunnel dielectric layer 698 serve as the gate dielectric for the source side select transistor SGS0. Conductive region 608 serves as a gate for the source side select transistor SGS0. A portion of the III-V semiconductor in the column CB0 serves as the body of the source side select transistor SGS0, in this embodiment. FIG. 6D shows a cross section of FIG. 6C along line 609. The cross section for memory cell MC0,0 may be similar to FIG. 6B.

Figure 6E:
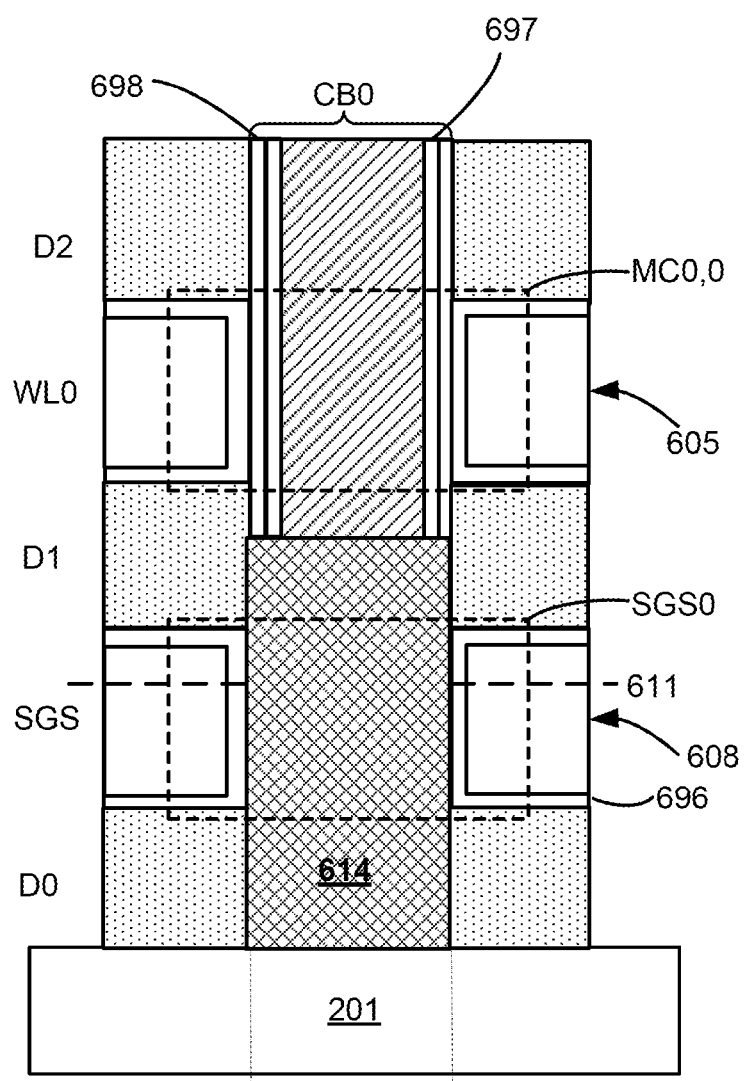
FIGS. 6E and 6F depict an alternative embodiment to that of FIGS. 6C and 6D.
Figure 6F:
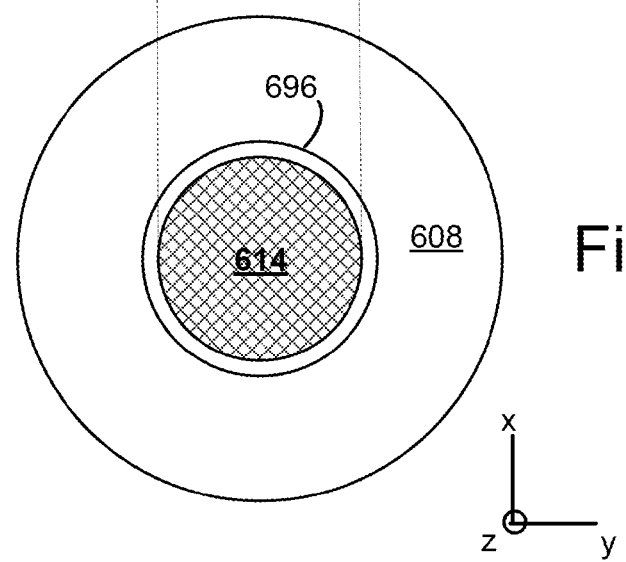

FIGS. 6E and 6F depict an alternative embodiment to that of FIGS. 6C and 6D. There is a silicon region 614 at the bottom of column CB0. In one embodiment, this is crystalline silicon. A difference between this embodiment and that of FIG. 6C is what constitutes the body of the source side select transistor SGS. In this embodiment, the body comprises silicon, rather than the III-V compound. However, the body is a part of the column CB0, in this embodiment. FIG. 6F shows a cross section of FIG. 6E along line 611.

In the embodiment of FIG. 6E, the blocking layer 696 serves as the gate dielectric of the source side select transistor SGS0. Recall that in FIG. 5C, the blocking layer 696, charge trapping layer 697 and tunnel dielectric 698 could serve as the as the gate dielectric of the source side select transistor SGS0. In such an embodiment, the body could be silicon, similar to the example of FIG. 6E.

Figure 7A:
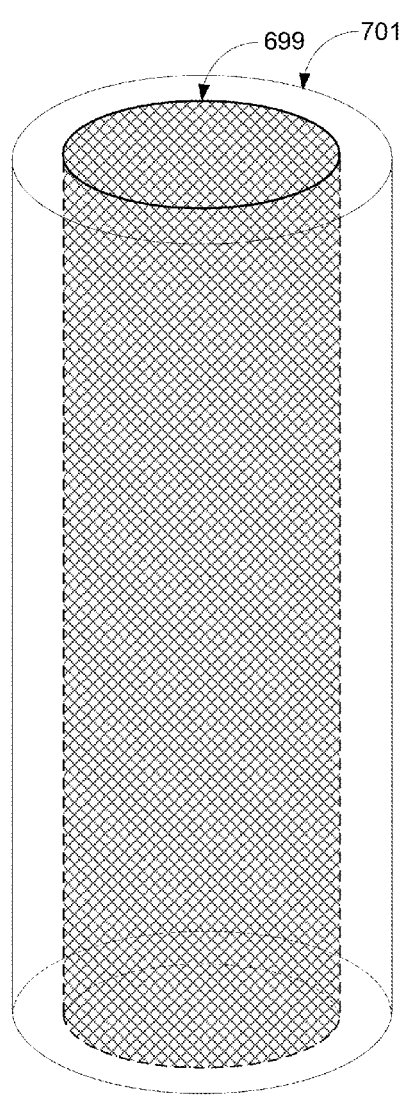
FIG. 7A depicts one embodiment of a III-V NAND channel.

FIG. 7A shows another perspective of one embodiment of a column, similar to the column CB0 in FIGS. 5A-6F. The III-V NAND channel 699 is depicted as a solid core inside of material 701 that forms memory cells. That material 701 includes several layers (not depicted in FIG. 7A), such as the charge trapping region 697 and the tunnel dielectric 698. Optionally, material 701 could include a blocking layer 696. The word line is not depicted in FIG. 7A. Note that material 701 has a hollow cylindrical shape that surrounds the III-V NAND channel 699.

Figure 7B:
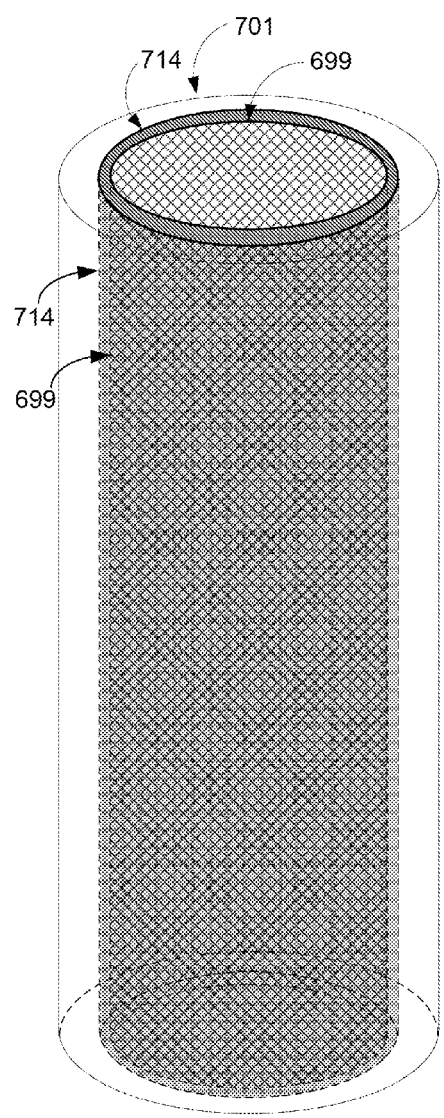
FIG. 7B depicts one embodiment of a III-V NAND channel with high-k tunnel interface.

FIG. 7B shows another perspective of one embodiment of a column, in which the tunnel dielectric has an interface layer 714. The interface layer 714 is aluminum oxide in one embodiment. The interface layer 714 has a hollow cylindrical shape that surrounds the III-V NAND channel 699.

FIG. 7C shows further details of one embodiment of the blocking layer 696, the charge trapping layer 697, the tunnel dielectric layer 698, and III-V channel 699. The diagram is a cross section in the x-y plane, and shows a cross section of a column and the material just outside of the column. The cross section may be of a memory cell, such as the examples of FIGS. 5B, 5D, and 6B. The outermost region is the word line 605 (which serves as the control gate of the memory cell). In order from outside in, there is first $Al_2O_3$ layer 702, first $SiO_2$ layer 704, first SiN layer 706, second $SiO_2$ layer 708, second SiN layer 710, third $SiO_2$ layer 712, second $Al_2O_3$ layer 714, and then the III-V compound 699. Together, first $Al_2O_3$ layer 702 and first $SiO_2$ layer form one embodiment of the blocking layer 696. First SiN layer 706 forms one embodiment of the charge trapping region 697. Together, second $SiO_2$ layer 708, second SiN layer 710, third $SiO_2$ layer 712, and second $Al_2O_3$ layer 714 form one embodiment of the tunnel dielectric 698. In one embodiment, third $SiO_2$ layer 712 is replaced with SiON. Thus, in such an embodiment, second $SiO_2$ layer 708, second SiN layer 710, the SiON, and second $Al_2O_3$ layer 714 form the tunnel dielectric 698. As noted above, the III-V compound 699 may serve as the NAND channel.

The second $Al_2O_3$ layer 714 is an optional layer that is in direct contact with the III-V compound 699, in one embodiment. The second $Al_2O_3$ layer 714 provides a good interface to the III-V compound 699. In one embodiment, the III-V compound 699 is InGaAs. $Al_2O_3$ forms a good stable interface with InGaAs with a small number of defects. This may result in higher mobility. In one embodiment, the second $Al_2O_3$ layer 714 has a thickness of about 2 to 3 nm (2 to $3 \times 10^{-9}$ meters). The second $Al_2O_3$ layer 714 may be thicker or thinner. In addition to being a good interface material to the III-V channel, $Al_2O_3$ is a high-k dielectric. Therefore, it may improve gate capacitance. For example, it may improve gate coupling to the NAND channel. Consequently, read-write efficiency may improve.

Figure 7D:
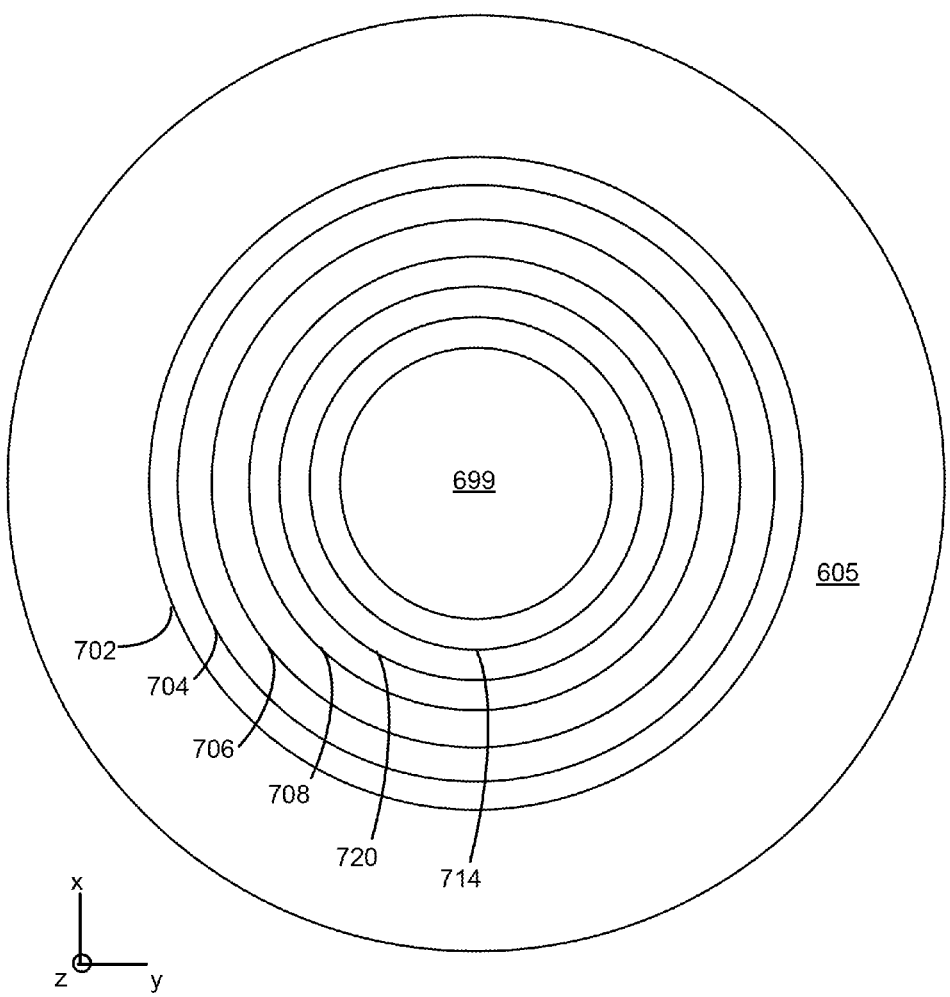
FIG. 7D shows further details of another embodiment of the blocking layer, the charge trapping layer, the tunnel dielectric layer, and the III-V channel.

FIG. 7D shows further details of another embodiment of the blocking layer 696, the charge trapping layer 697, the tunnel dielectric layer 698, and the III-V channel 699. The diagram is a cross section in the x-y plane, and shows a cross section of a column and the material just outside of the column. The cross section may be of a memory cell, such as the examples of FIGS. 5B, 5D, and 6B. The outermost region is the word line 605 (which serves as the control gate of the memory cell). In order from outside in, there is first $Al_2O_3$ layer 702, first $SiO_2$ layer 704, first SiN layer 706, second $SiO_2$ layer 708, $La_2O_3$ layer 720, second $Al_2O_3$ layer 714, and then the III-V compound 699. Together, first $Al_2O_3$ layer 702 and first $SiO_2$ layer form one embodiment of the blocking layer 696. First SiN layer 706 forms one embodiment of the charge trapping region 697. Together, second $SiO_2$ layer 708, $La_2O_3$ layer 720, and second $Al_2O_3$ layer 714 form one embodiment of the tunnel dielectric 698. The $La_2O_3$ layer 720 provides a good interface to the second $Al_2O_3$ layer 714. Also, the $La_2O_3$ layer 720 is a high-k dielectric, which helps increase the gate capacitance for better performance.

In one embodiment, $La_2O_3$ layer 720 is replaced with SiN. Thus, in such an embodiment, second $SiO_2$ layer 708, the SiN, and second $Al_2O_3$ layer 714 form the tunnel dielectric 698. As noted above, the III-V compound 699 may serve as the NAND channel.

FIG. 8 shows electrical connections between the III-V compound vertical NAND channel 699 and a bit line 111 and a source line 128. A single column 806 is depicted. The column 806 has charge storage region 697, tunnel dielectric outer portion 808, aluminum oxide layer 714, and III-V channel 699. Together, the tunnel dielectric outer portion 808 and the aluminum oxide layer 714 form the tunnel dielectric (e.g., FIG. 5A, 698). On one side of the column 806, several word lines (WL0-WL5), SGS, and SGD are depicted. Also, a blocking layer 696 is associated with each of SGS, WL0-WL5, and SGD. Note that the word lines and blocking layer may completely surround the column 806, as previously shown and described. However, this is not depicted in FIG. 8 so as to not obscure the diagram. Also, the dielectric layers that alternate with the word line layers are not depicted.

The drain end 501 of the NAND channel has a metal-III-V alloy region 804. The metal-III-V alloy region 804 is in direct physical contact with a bit line contact 811. The bit line contact 811 is formed from metal, in one embodiment. Likewise, bit line 111 is formed from metal, in one embodiment. Example metals for the bit line and bit line contact include, but are not limited to, titanium, tungsten, copper, aluminum, and molybdenum. In one embodiment, the drain end 501 of the NAND channel is a heavily doped region (e.g., n+ region). For example, first the III-V compound could be doped with an n-type impurity. Then, a process may be performed to convert the III-V compound at the drain end 501 to the metal-III-V alloy. An example of the metal-III-V alloy is Ni—InGaAs. Other examples for the metal-III-V alloy include, but are not limited to, Au—InGaAs, Au—Zn—InGaAs, Ni—Au—InGaAs, Ni—Au—Zn—InGaAs, Ni—Au—Ge—InGaAs, etc.

FIG. 8 also depicts a source side select transistor. SGS, which may be formed from metal, serves as the control gate of the source side select transistor. The portion of the blocking layer 696 that is between SGS and the body 802 serves as the gate dielectric of the source side select transistor. The body 802 of the source side select transistor is formed from the III-V compound in one embodiment. In another embodiment, the body 802 of the source side select transistor is formed from silicon. The body 802 is crystalline silicon in one embodiment. The source side select transistor body 802 is in direct physical contact with the substrate 201, which may be formed from silicon. The channel 812 of the source side select transistor has a vertical component in the column 806 and a horizontal component in the substrate 201. Source 890 may act as the source of the source side select transistor. The source 890 may be an n+ region. Thus, source 890 can be formed by heavily doping the silicon substrate 201. The n-type impurity can be phosphorous (P), arsenic (As) or a combination of both, for example.

The source line 128 is in electrical contact with the source 890. The source line 128 is formed from metal, in one embodiment. Example metals include, but are not limited to, titanium, tungsten, copper, aluminum, and molybdenum. The source line 128 can be electrically connected to the NAND string channel 699 by the action of the source side select transistor transistor, when a respective bias is applied to the SGS line. Note that the source line 128 may serve as a common source line for a number of NAND strings. For example, all of the NAND strings depicted in FIG. 4C may share a common source line.

Figure 9:
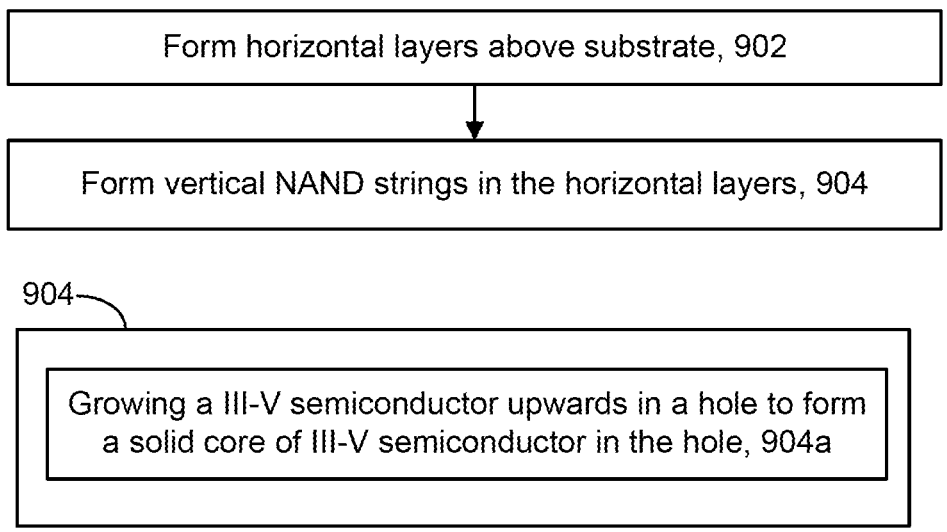
FIG. 9 is a flowchart of one embodiment of a process of fabricating a 3D memory device having a III-V NAND channel.

FIG. 9 is a flowchart of one embodiment of a process of fabricating a 3D memory device having a III-V compound NAND channel. The process may be used to for devices such as, but not limited to, those depicted in FIGS. 3A, 3B, 4A, 4B, and 4C. The NAND strings are straight NAND strings, in one embodiment. The NAND strings are U-shaped, in one embodiment.

Step 902 includes forming layers of material above a semiconductor substrate. In one embodiment, the semiconductor substrate is silicon. Examples of the semiconductor substrate include, but are not limited to, any of the substrates 201 in FIGS. 3B, 4B, 4C, 6C, and 6E. The semiconductor substrate has a major axis that extends in a horizontal direction. The major axis may extend in either the x- or y-direction, as depicted in FIGS. 3B, 4B, 4C, 6C, and 6E, for example. The semiconductor substrate has a major surface that extends in a horizontal plane, such as the x-y plane.

The layers of material may extend in the horizontal direction. These layers may be parallel to the horizontal plane. The layers of material may be alternating between one type of material and another. One possibility is for the layers to alternate between conductive material and a dielectric. Examples of this are depicted in FIGS. 3B, 4B, 4C, as well as in other diagrams. However, it is not required that the layers of material be the final materials for the memory device. In one embodiment, some of the layers are sacrificial layers. For example, rather than having some of the layers being conductive material, the alternating layers could be layers of dielectric material alternating with sacrificial layers. One embodiment of step 902 is to form alternating layers of silicon oxide and silicon nitride. The silicon nitride may be sacrificial material that may be removed after step 904 and replaced, at least in part, with a conductive material.

Step 904 includes forming vertically-oriented NAND strings that extend through the plurality of layers of material. Each vertically-oriented NAND string comprises non-volatile storage elements and a NAND string channel that extends in a vertical direction with respect to the horizontal plane. In one embodiment, the vertical NAND strings are formed through alternating layers of silicon oxide and silicon nitride. In one embodiment, the vertical NAND strings are formed through alternating layers of silicon oxide and metal. The vertical NAND strings are formed perpendicular to these alternating layers and may be vertical with respect to the major surface of the semiconductor substrate.

Step 904a describes that forming an individual one of the NAND string channels includes growing a III-V semiconductor upwards in a hole having a major axis that extends in the vertical direction to form a solid core of III-V semiconductor in the hole. The hole may be what is termed herein as a "memory hole." Note that other material besides the III-V semiconductor may be deposited in the memory hole. For example, the tunnel dielectric for the memory cells can be formed in the memory hole prior to forming the III-V semiconductor. Also, the charge trapping region for the memory cells can be formed in the memory hole prior to forming the tunnel oxide.

In one embodiment, step 904a includes growing a nanowire of III-V semiconductor from the semiconductor substrate upwards to fill the entire hole and to form the entire NAND string channel. This may be referred to as "self-directed" growth.

In one embodiment, step 904a includes forming a body for a source side select transistor of the NAND string in the hole from silicon. The body of the source side select transistor may be in direct contact with the semiconductor substrate, which may be silicon. Then, a nanowire of III-V semiconductor is grown from the silicon body of the source side select transistor upwards in the hole.

In one embodiment, step 904a includes growing the III-V semiconductor in the hole from the semiconductor substrate upwards by epitaxial growth to form the entire NAND string channel. This may also be referred to as "self-directed" growth.

In one embodiment, step 904a includes growing silicon for a body of a source side select transistor of the individual NAND string in the hole by epitaxial growth upwards from the semiconductor substrate. The body of a source side select transistor may be in direct contact with the semiconductor substrate, which may be silicon. Then, the III-V semiconductor is grown in the hole from the body of the source side select transistor upwards by epitaxial growth to form the rest of the NAND string channel.

In one embodiment, step 904a includes forming a metal-III-V semiconductor alloy from a portion of the III-V semiconductor of the NAND string channel. A later step may form a metal bit line contact directly on the metal-III-V semiconductor alloy.

In one embodiment, step 904a includes adding a dopant in a portion of the III-V semiconductor of the NAND string channel. A later step may form a metal bit line contact directly on the portion of the III-V semiconductor having the dopant.

In one embodiment, step 904a includes forming a charge trapping region for each of non-volatile storage elements, and forming a tunnel dielectric for each of the non-volatile storage elements. In one embodiment, the tunnel dielectric comprises aluminum oxide in direct contact with the III-V semiconductor of the NAND string channel. In one embodiment, forming the tunnel dielectric further comprises forming lanthanum oxide in direct contact with the aluminum oxide.

After forming the NAND strings, additional steps may be performed. In one embodiment, the word lines are formed after forming the NAND strings. Also, the blocking layer 696 could be formed after forming the NAND strings in order to form a device having a structure such as the one depicted in FIG. 6E. However, the blocking layer 696 may be formed prior to forming the NAND strings in order to form a device having a structure such as the one depicted in FIG. 5A. Additional steps are to form metal bit line contacts to the drain end of the NAND strings and to form bit lines.

Figure 10:
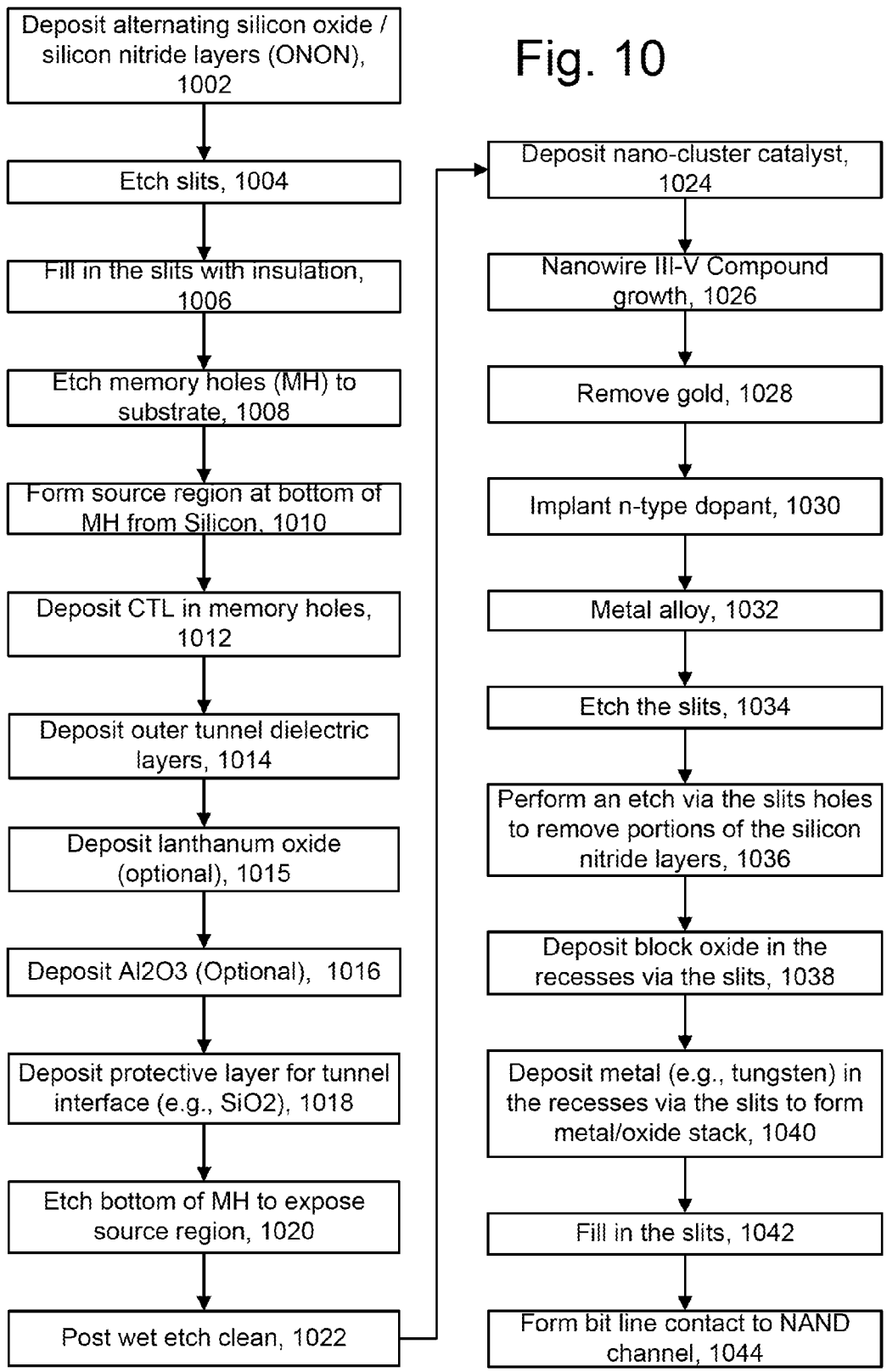
FIG. 10 is a flowchart of one embodiment of a process of fabricating a 3D memory array in which the vertical NAND channels comprises a III-V compound are formed using a nanowire technique.
Figure 11A:
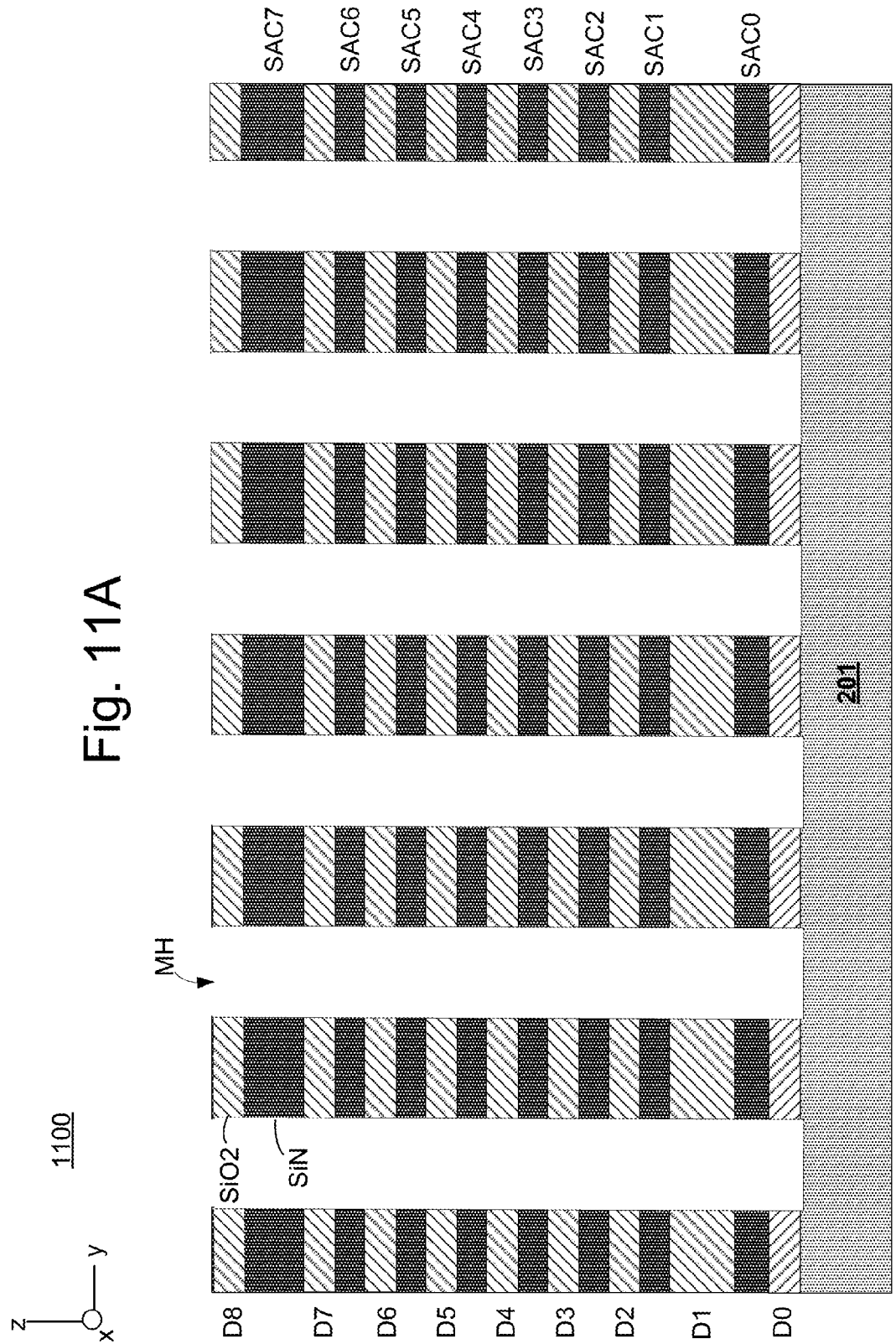
FIGS. 11A-11Q depict results after various steps of FIG. 10.

FIG. 10 is a flowchart of one embodiment of a process of fabricating a 3D memory array in which the vertical NAND channels comprises a III-V compound are formed using a nanowire technique. FIGS. 11A-11Q depict results after various steps of FIG. 10. In FIG. 10, steps need not necessarily be performed as discrete steps in the order indicated. Various modifications can be made. Moreover, other steps which are known from the art of semiconductor fabrication but are not explicitly depicted here may also be performed. FIG. 10 represents a "word line last" technique in which the word lines are formed after forming the NAND strings. For example, after forming the NAND strings, sacrificial silicon nitride may be replaced, at least in part, with metal.

Prior to this process, below-stack circuitry and metal layers may be formed in the substrate. Various circuits may be formed in the substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, aluminum can be used for the top metal layer, while the other layers are tungsten. Potentially, copper can be used instead of aluminum for upper layer, using a corresponding integration scheme. For silicidation, Ni, Ti, Co or W can be used, for instance.

Step 1002 includes depositing alternating silicon oxide ($SiO_2$)/silicon nitride (SiN) layers above the substrate 201. The silicon nitride is a sacrificial layer, which will be replaced in part by material to form the blocking layer 696 and in part by metal to form word lines (as well as a source select line (SGS), and a drain select line (SGD or SG). The silicon oxide will be used for the insulating layers between the metal word (and select) lines. Other insulators could be used instead of silicon oxide. Other sacrificial materials could be used instead of silicon nitride. Step 1002 is one embodiment of step 902 from FIG. 9, which is forming horizontal layers above a semiconductor substrate.

Step 1004 includes etching slits in the alternating silicon oxide ($SiO_2$)/silicon nitride (SiN) layers. Step 1006 includes filling in the slits with insulation. FIGS. 4B and 4C show examples of slits 502 for straight NAND strings. FIG. 3B shows one example of slits 408 for U-shaped NAND strings. The pattern in which the slits are formed can vary widely.

Step 1008 includes etching memory holes (MH) in the alternating layers of silicon nitride and silicon oxide. Reactive ion etching can be used to etch the memory holes. In the memory array area, the memory holes are placed densely. For example, the memory holes can have a diameter of 70-110 nanometers (nm) ($70-110 \times 10^{-9}$ meters). This is an example range; other ranges could be used. Also note that the diameter could vary from top to bottom.

FIG. 11A shows results after step 1008. FIG. 11A shows sacrificial layers (SAC0-SAC7) alternating with insulating layers (D0-D8) in a stack 1100 over a semiconductor substrate 201. The sacrificial layers are silicon nitride (SiN) in this embodiment and will eventually be layers SGS, WL0, WL1, WL2, WL3, WL4, WL5, and SGD (note that the blocking layer 696 is also formed in the region vacated by the sacrificial layers in this embodiment). The insulating layers are silicon oxide in this embodiment. Six memory holes (MH) are depicted as extending vertically through the alternating sacrificial layers and insulating layers. The memory holes extend down to the semiconductor substrate 201, which is formed from silicon in one embodiment. Etching the memory holes could etch partway into the semiconductor substrate 201. An x-y-z coordinate system is depicted, showing the direction of formation. The memory holes each have a major axis that is parallel to the z-axis.

Figure 11B:
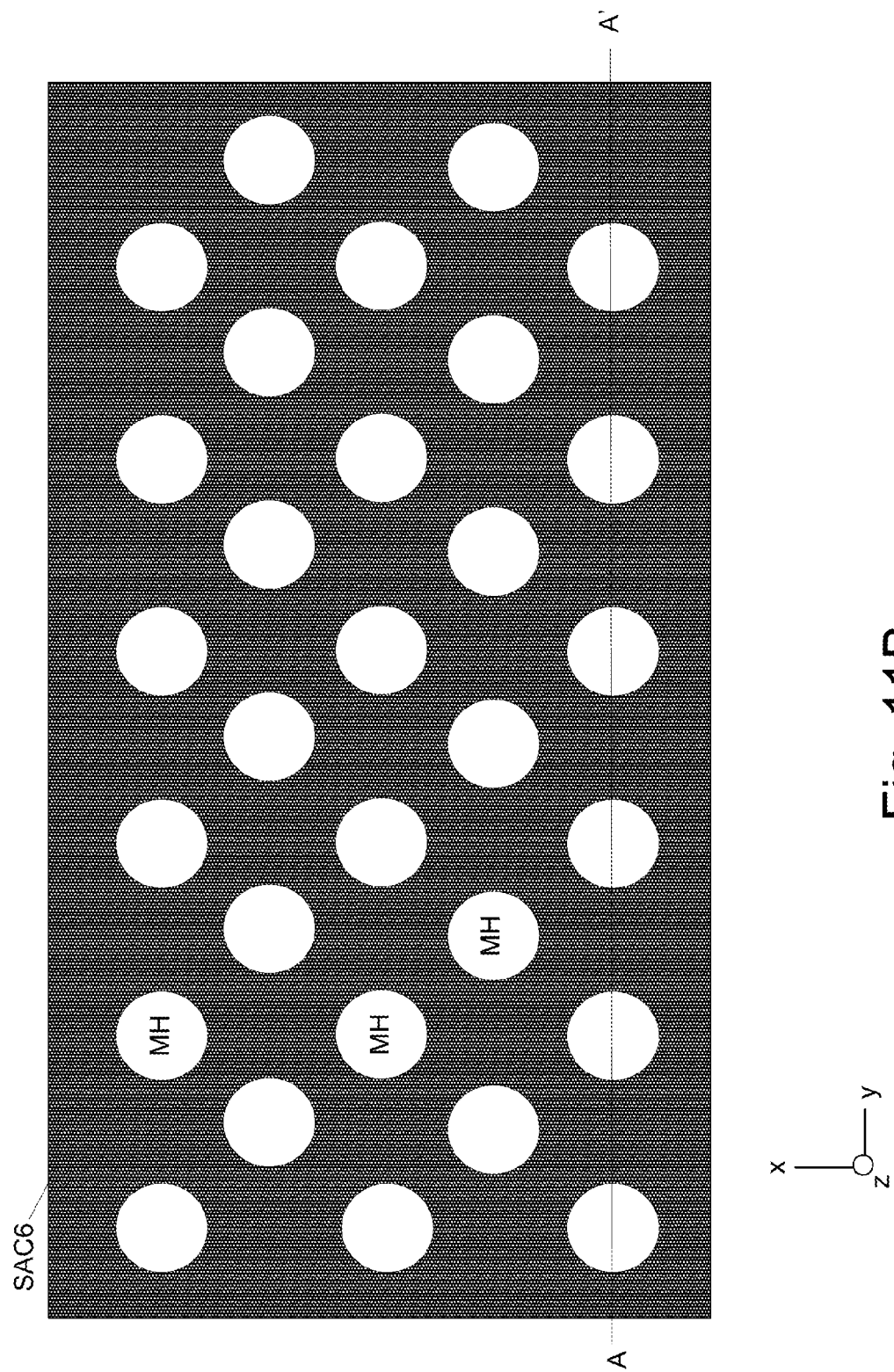

FIG. 11B shows a cross sectional view of layer SAC6 from FIG. 11A after step 1008, showing one possible pattern for the memory holes (MH). This is not the only possible pattern. For example, the memory holes do not need to be staggered as depicted. An x-y-z coordinate system is depicted, showing that direction of formation. Note that line A-A' indicates that FIG. 11A is a cross section along line A-A' of FIG. 11B. Also note that the memory holes have a circular cross section in the horizontal direction (e.g., x-y plane), in this example. The memory holes are not required to be circular in cross section. Note that the memory holes could be of different diameter in the different layers. For example, the memory holes could have a smaller diameter at the lower layers. The slits are not depicted in FIGS. 11A-11B so as to not obscure the diagrams.

Step 1010 includes formation of silicon at the bottom of the memory holes for the source side select transistor bodies 802. In one embodiment, the silicon is mono-crystalline silicon. Step 1010 includes epitaxial silicon growth at the bottom of the memory holes, in one embodiment. In one embodiment, precursors such as dicholorosilane (DCS) and HCl are used. Step 1010 includes two sub-steps, in one embodiment. In a first sub-step, a bake in hydrogen is performed. This bake may be at about 750 to 950 degrees Celsius and may be for between about ten seconds to 150 seconds. As one example, the hydrogen gas flow rate is about 10 to 50 sccm. As one example, the pressure may be about 10 to 30 mTorr. Also, a nitrogen gas flow may be used to mitigate unintentional nucleation sites on nitride corners. The nitrogen gas flow may be about 10 to 50 sccm. This optional nitrogen gas flow step passivates dangling silicon bonds prior to epitaxial silicon growth. The vertical sidewalls of the memory holes may have unintentional nucleation sites. The unintentional nucleation sites may be dangling silicon bonds. Passivating the dangling silicon bonds helps to prevent unintentional growth of silicon on the vertical sidewalls of the memory holes. Such growth could potentially block the memory hole during the later NAND channel growth stage of step 1026. Such blockage could potential prevent the growth of the III-V channel 699 in a blocked memory hole.

The second sub-step is epitaxial silicon growth. In one embodiment, precursors such as dicholorosilane (DCS) and HCl are used in this sub-step. As one example, the HCl flow rate is about 50 to 150 sccm. As one example, the DCS flow rate is about 100 to 400 sccm. A precursor other than dicholorosilane (DCS) and HCl could be used. An example range of temperatures is 750 to 850 degrees Celsius. However, higher or lower temperatures can be used. As one example, the pressure may be about 10 to 30 mTorr. The time may vary depending on the desired amount of epitaxial growth. The growth rate may increase with temperature. The entire growth process may be carried out in a Chemical Vapor Deposition (CVD) technique (single wafer process or batch).

FIG. 11C depicts results after step 1010, showing silicon region 614 in the bottom of the memory holes (MH). Note that silicon region 614 will serve as the body 802 of the source side select transistor.

Step 1012 is depositing the charge trapping layer (CTL) in the memory holes. In one embodiment, a nitride such as SiN be deposited as a charge trapping layer 697. This may be deposited as a conformal layer over vertical sidewalls of the memory holes, as well as over the silicon region 614.

Step 1014 is depositing at least one of the layers of the tunnel dielectric 698 in the memory holes. The tunnel dielectric 698 may be deposited as a conformal layer on the charge trapping layer 697. Thus, the tunnel dielectric 698 may cover vertical sidewalls of the charge trapping layer 697, as well as the portion of the charge trapping layer 697 that is on the silicon region 614.

Step 1014 may include depositing multiple layers, such as $SiO_2$ and SiON, with the $SiO_2$ nearest the charge trapping region (e.g., SiN). The tunnel dielectric might also include $SiO_2$ and ISSG (in-situ steam generation) formed oxide, with the $SiO_2$ nearest the charge trapping region. The tunnel dielectric might also include three layers: $SiO_2$, SiON, and ISSG formed oxide.

Note that steps 1015 and 1016 describe depositing optional additional layers of the tunnel dielectric. Step 1015 is optionally depositing a lanthanum oxide layer in the memory holes on the other tunnel dielectric layers. Similar to other layers, the lanthanum oxide layer may be deposited on vertical sidewalls of previous layers. Also, the lanthanum oxide layer may be deposited over the silicon region 614 at the bottom of the memory holes. Referring to FIG. 7D, step forms $La_2O_3$ layer 720, in one embodiment.

Figure 11D:
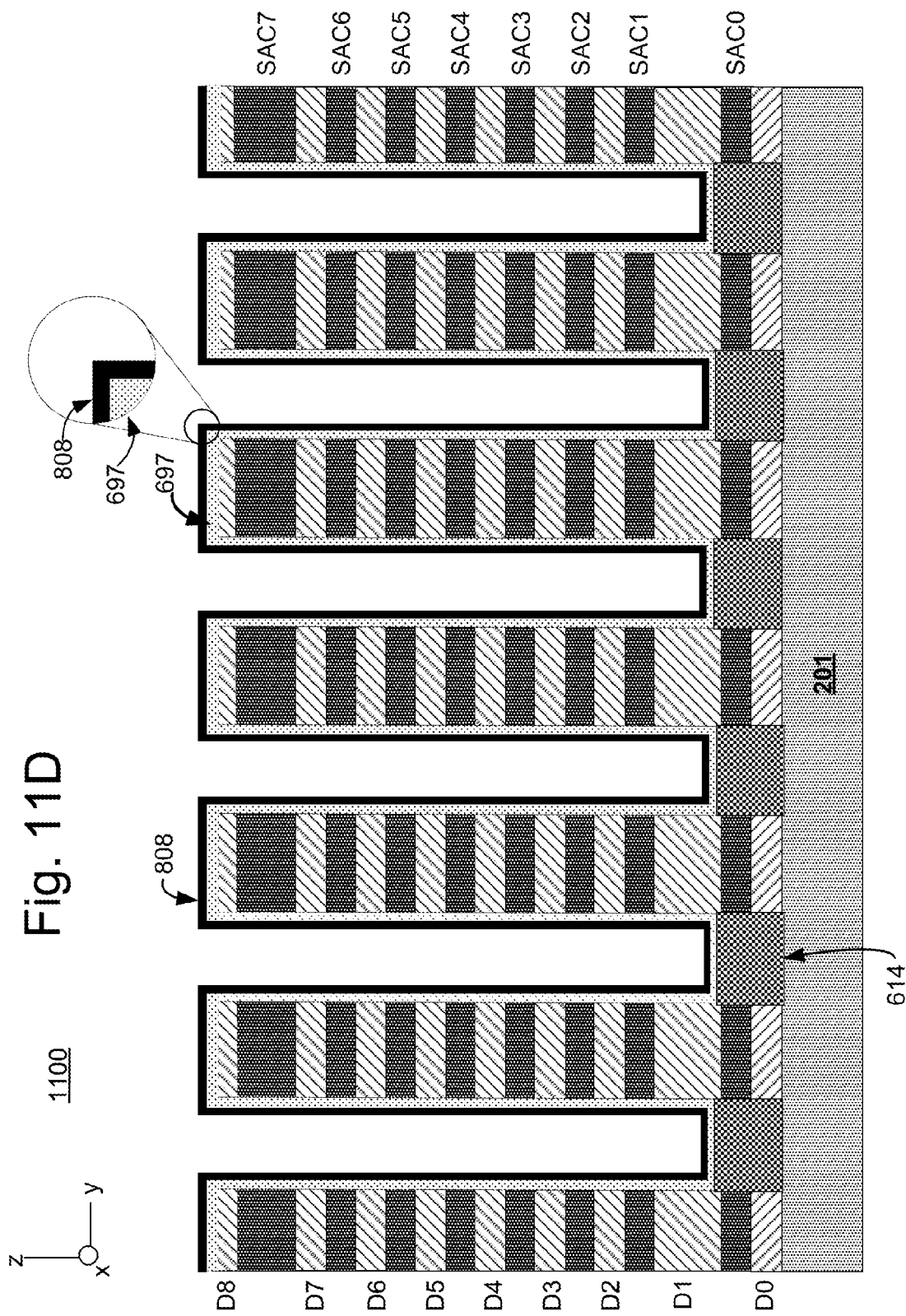
Figure 11E:
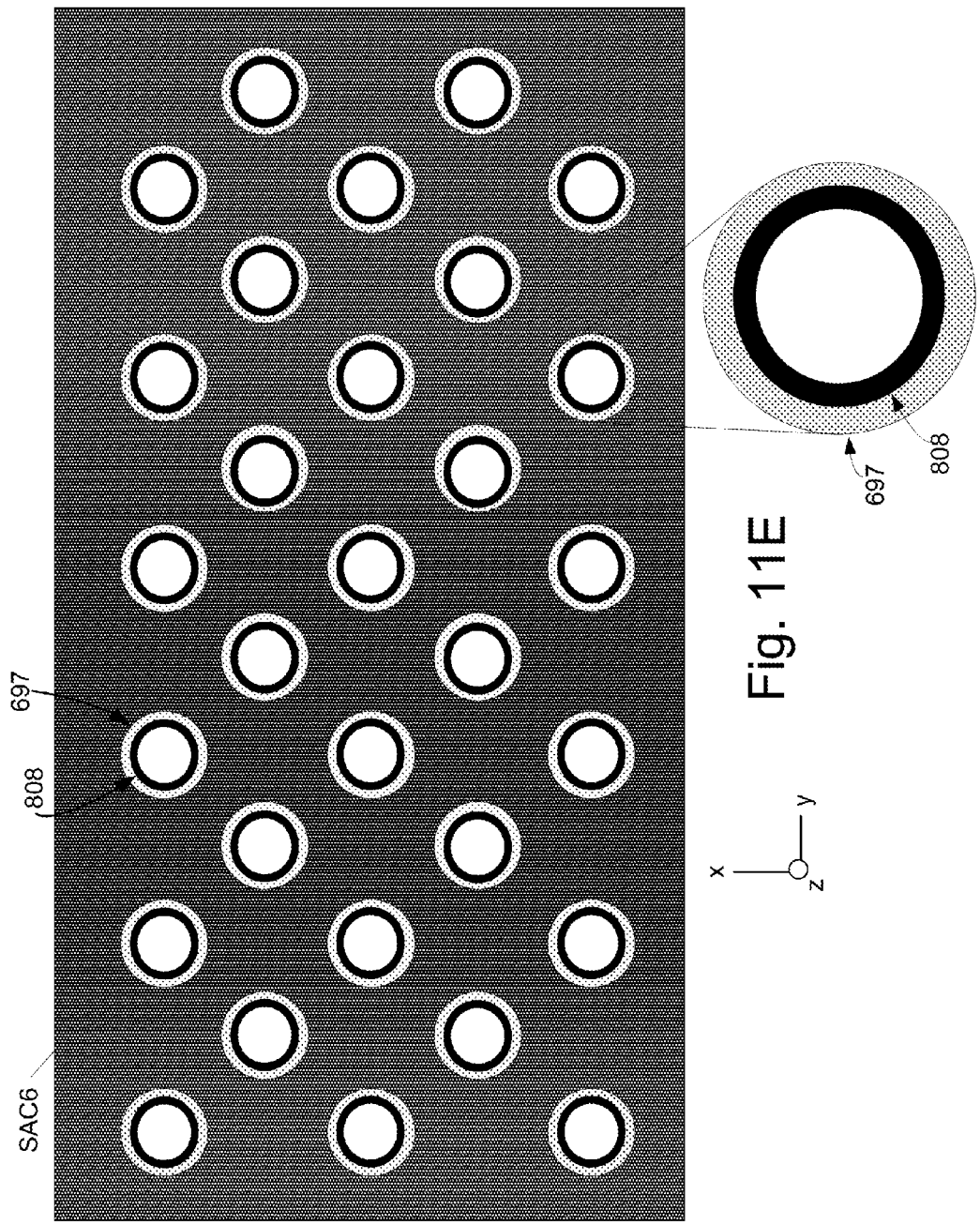

FIGS. 11D and 11E depicts results after step 1015. Charge trapping layer 697 is depicted on the vertical sidewalls of the memory holes, as well as over the top surface of the silicon region 614 at the bottom of the memory holes. Layer(s) 808 represents the layers of the tunnel dielectric layer that have been deposited thus far in step 1014 and step 1015, if performed. Thus, referring to FIG. 7C, layer 808 in one embodiment represents second $SiO_2$ layer 708, second SiN layer 710, and third $SiO_2$ layer 712. In one embodiment, SiON is used instead of third $SiO_2$ layer 712. Thus, in such an embodiment, second $SiO_2$ layer 708, second SiN layer 710, and the SiON, are represented by layer 808. Referring to FIG. 7D, layer 808 in one embodiment represents second $SiO_2$ layer 708 and $La_2O_3$ layer 720. Note that FIGS. 11D and 11E each depict a magnified view of layers 697 and 808. Other Figures to be discussed below also show magnified views of certain layers.

Figure 11F:
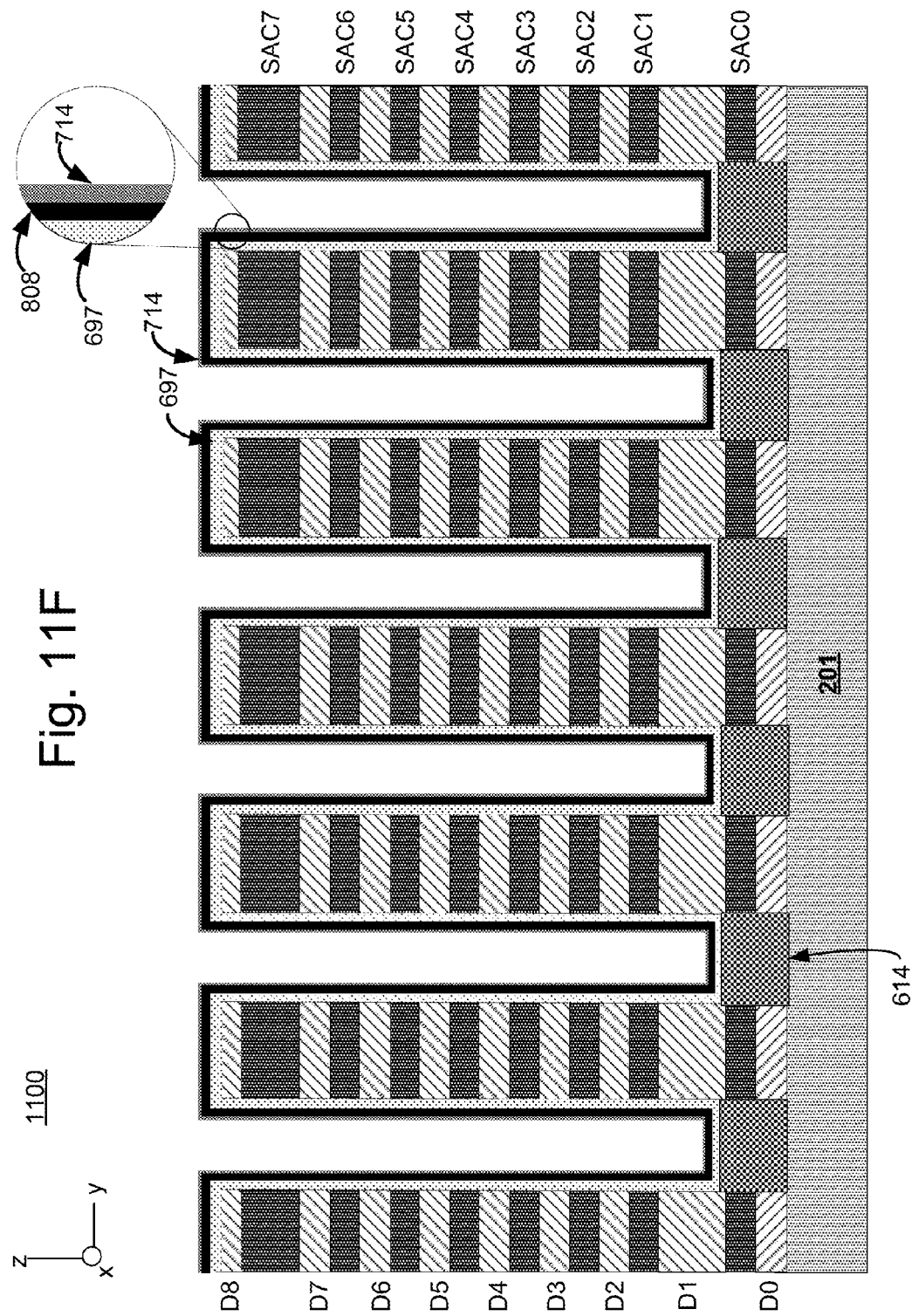
Figure 11G:
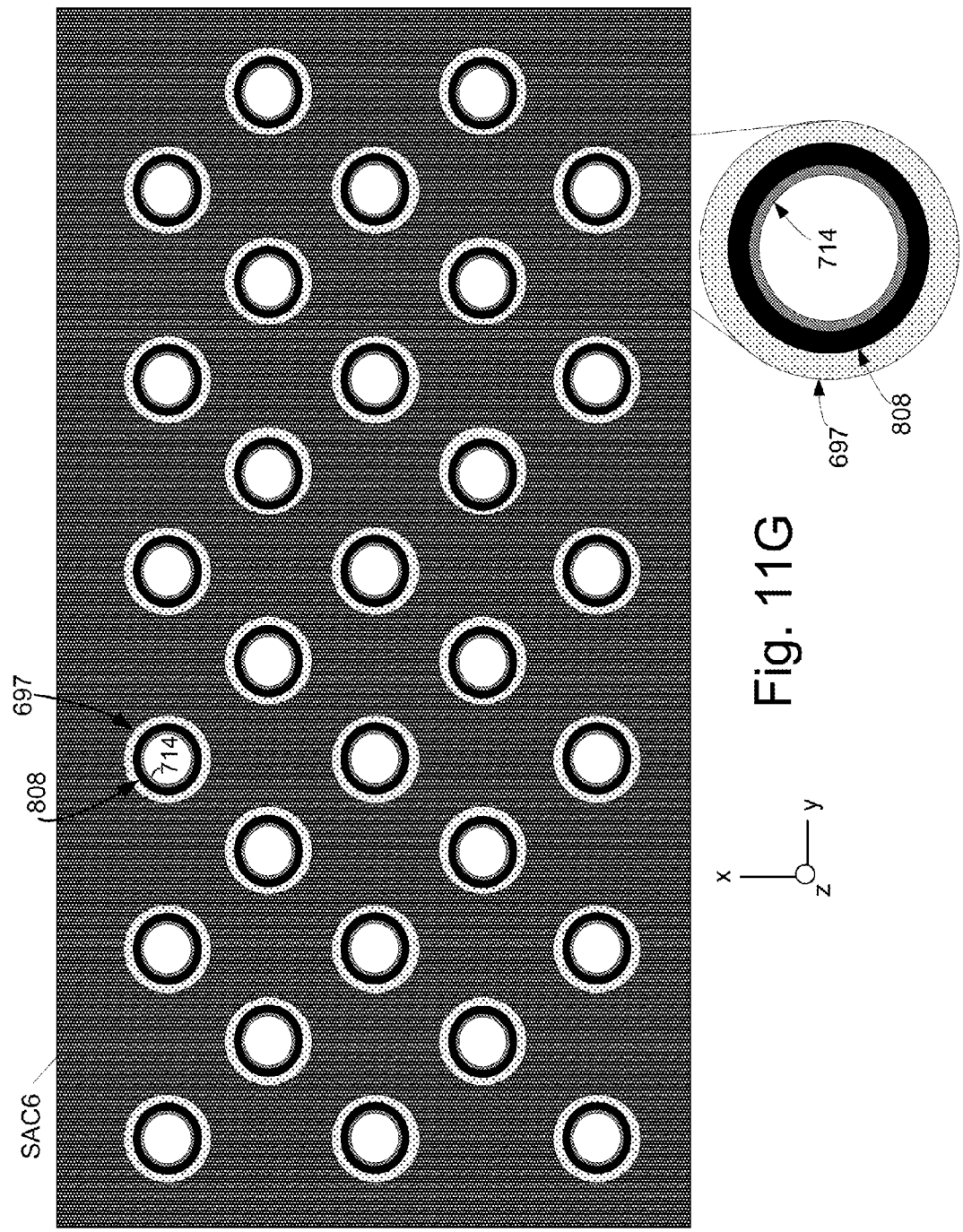

Step 1016 is the optional step of depositing aluminum oxide in the memory holes. This may be deposited using CVD or ALD, for example. The aluminum oxide may be about 1-3 nm in thickness. However, it could be thicker or thinner. FIGS. 11F and 11G depict results after step 1016. Aluminum oxide layer 714 is shown in the memory holes over the tunnel dielectric layers 808. The aluminum oxide layer 714 covers vertical sidewalls of previously deposited layers in the memory holes, as well as the horizontal surface of the previously deposited layers over silicon region 614 at the bottom of the memory holes.

Figure 11H:
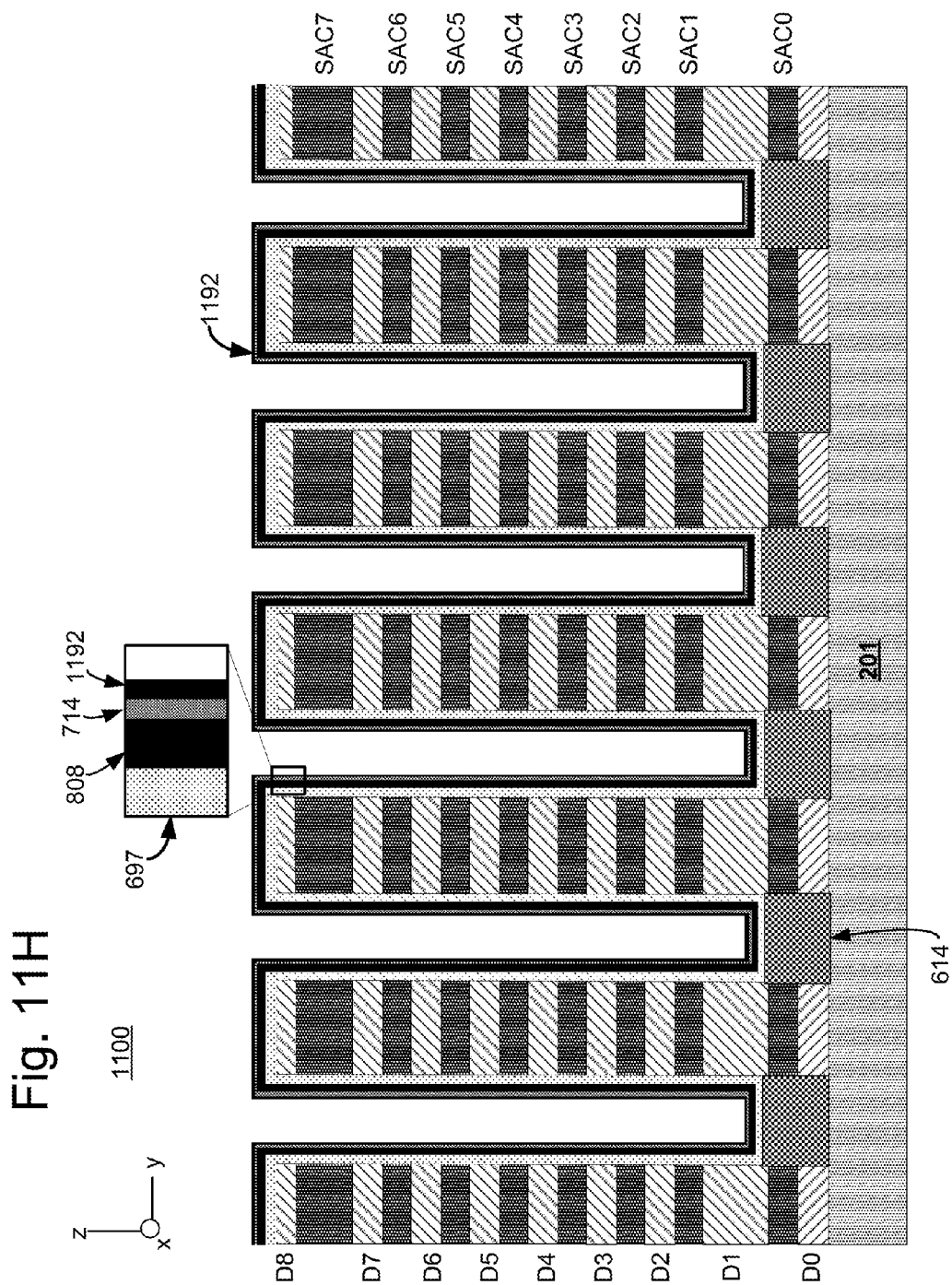

Step 1018 is to deposit a protective layer over the tunnel dielectric layers that have been deposited thus far in steps 1014 and optionally in steps 1015 and/or 1016. In one embodiment, a layer of silicon oxide is deposited over the aluminum oxide 714. This may be deposited using CVD or ALD, as two examples. The silicon oxide may be about 5 nm in thickness. However, it could be thicker or thinner. FIG. 11H depicts results after step 1016. The protective layer 1192 may serve to protect the tunnel dielectric during later etching steps.

Figure 11I:
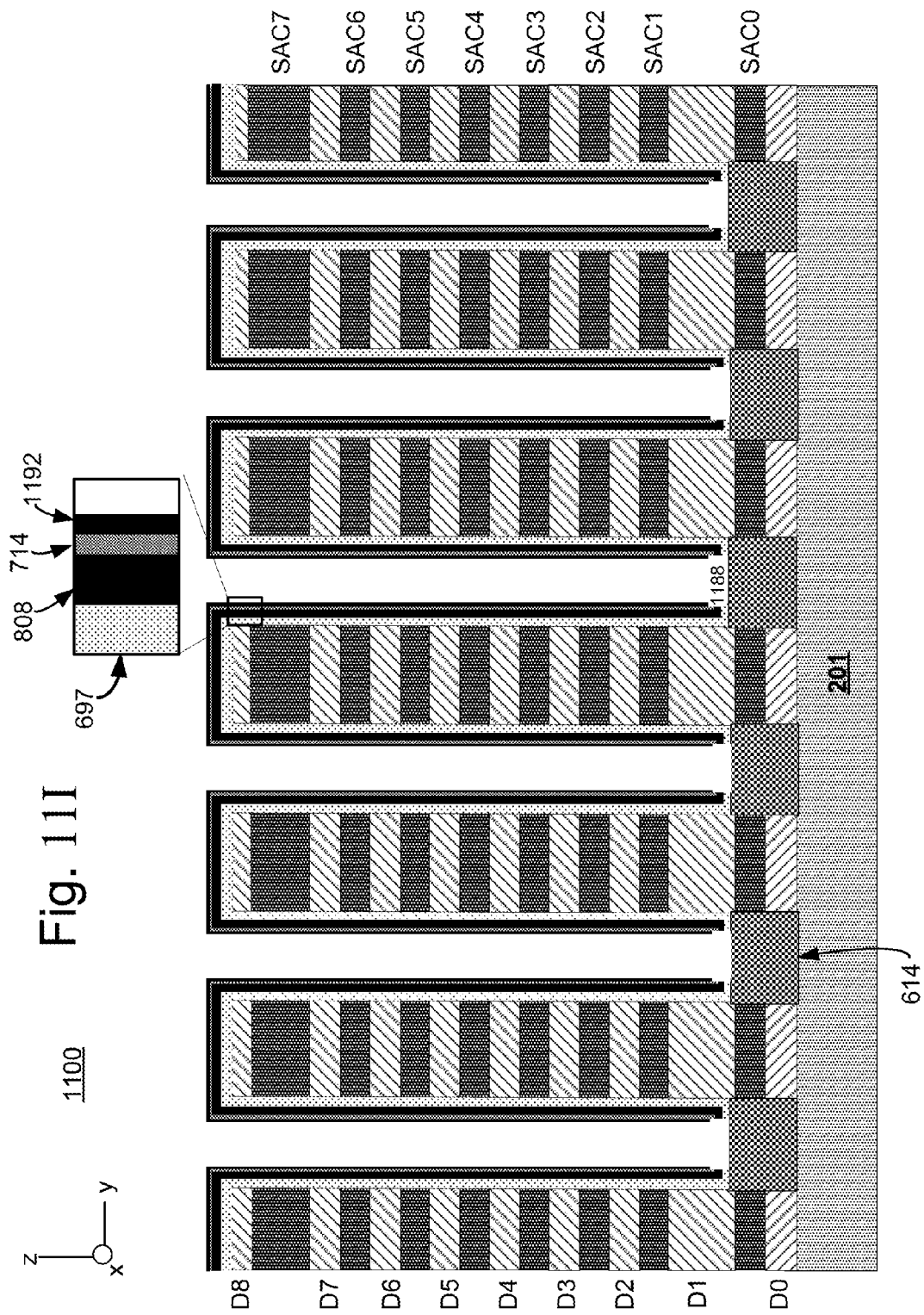

Step 1020 includes etching at the bottom of the memory holes to expose the silicon region 614. In one embodiment, this is a reactive ion etch (RIE). FIG. 11I shows results after step 1020. The etching has created a gap 1188 at the bottom of the memory holes. The etching has gone through the protective layer 1192 at the bottom of the memory holes, through the horizontal portion of the aluminum oxide 714 at the bottom of the memory holes, through the horizontal portion of other tunnel dielectric layer(s) 808, and through the charge trapping layer 697 at the bottom of the memory holes. However, the protective layer 1192 remains largely in place over the vertical sidewalls of the aluminum oxide layer 714 in the memory holes, protecting the aluminum oxide layer 714 on the vertical sidewalls.

Step 1022 is a post wet etch clean. This step removes of the protective layer 1192. In one embodiment, a wet etch is used to remove the silicon oxide protective layer. Also polymer residues from the etch of step 1020 are etched away.

In one embodiment, the III-V compound channel 699 is formed using nanocluster-catalyzed vapor-liquid-solid (VLS) growth (synthesis) of a III-V nanowire. VLS synthesis requires a catalyst. For nanowires, some of the best catalysts may be liquid metal (such as gold) nanoclusters.

Step 1024 is depositing nano-clusters in the channel holes. The nano-clusters serve as a catalyst for growth of the III-V compound in the memory holes. The reactant source (e.g., In, Ga, As) may enter these nanoclusters and begin to saturate them. On reaching super-saturation, the reactant source may solidify and grow outward from the nanocluster. Turning off the reactant source can adjust the final length of the nanowire. Switching sources while still in the growth phase can create compound nanowires with super-lattices of alternating materials.

The nano-clusters are gold, in one embodiment. Nanoclusters may constitute an intermediate state of matter between molecules and solids. Nanoscale gold clusters may exhibit catalytic activity. The gold nano-clusters are deposited as a thin film between about 1 to 10 nanometers ($1\times10^{-9}$ meters to $10\times10^{-9}$ meters) in one embodiment. However, the film could be thicker or thinner.

In one embodiment, gold nano-clusters are deposited in colloidal form in the channel hole. A spin coating method may be used. Colloidal gold is a suspension (or colloid) of submicron-size nanoparticles of pure gold suspended in a fluid, e.g. water or other liquids. In one embodiment, the water is pure deionized water. The gold nanoparticles may be a few nanometers to several tens of nanometer in diameter, as one example range. An atom of gold is about 0.288 nanometers in diameter, so the gold nanoparticles may be only about 10 times, to several hundred times the diameter of a single gold atom. These particles stay suspended in pure deionized water and do not fall to the bottom. It is these suspended particles that make it a colloid.

Figure 11J:
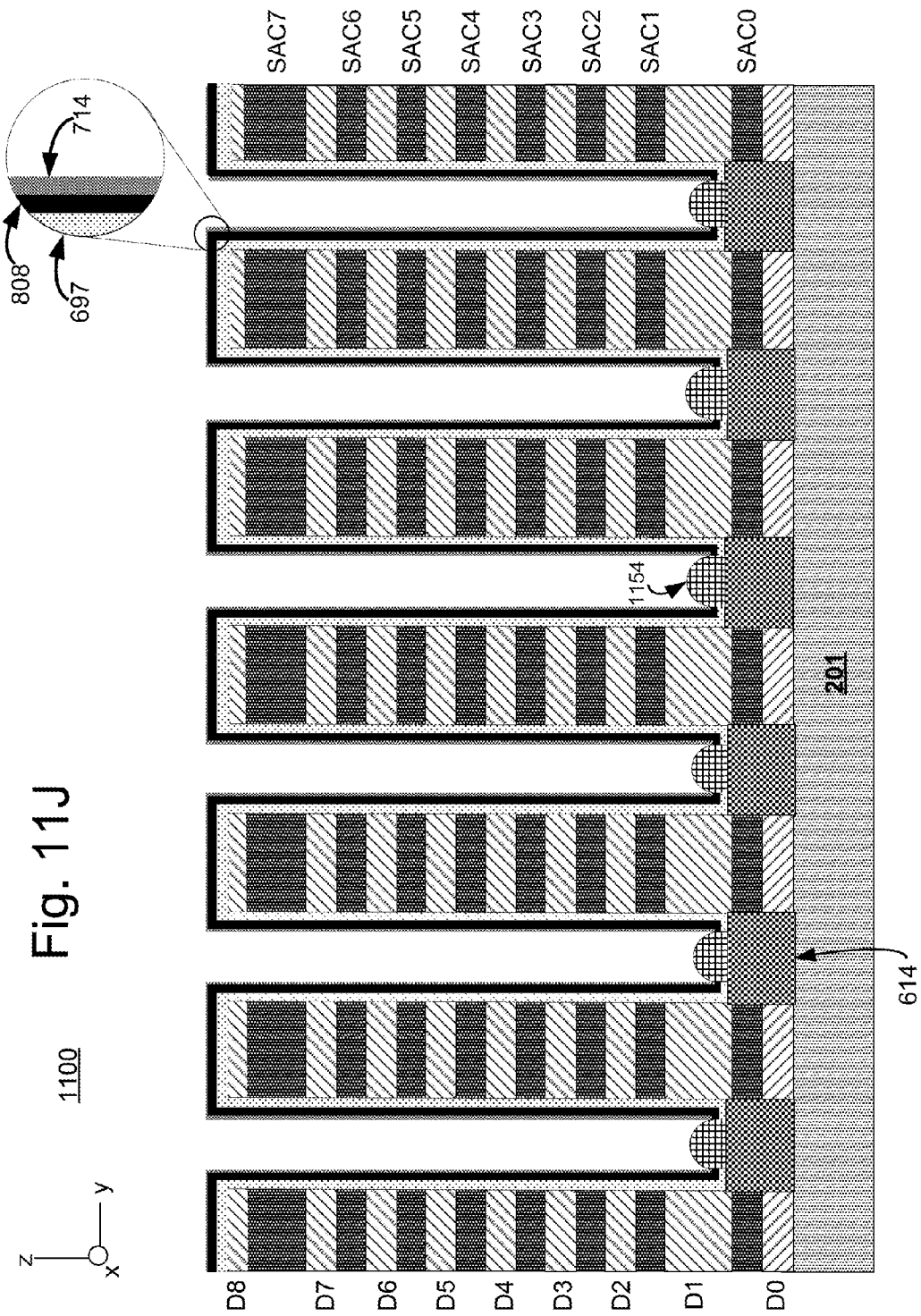

FIG. 11J shows results after step 1024. FIG. 11J shows gold nano-clusters 1154 near the bottom of the memory holes. The gold nano-clusters 1154 are formed directly on the silicon region 614, in this embodiment.

Step 1026 is nano-wire III-V compound growth. In one embodiment, nanocluster-catalyzed vapor-liquid-solid (VLS) growth (or synthesis) is used. The overall growth process of nanocluster-catalyzed VLS can be broken down into contributions from (i) catalytic adsorption of gaseous reactants at the surface of liquid nanoparticles, (ii) diffusion of III-V elements through the liquid alloy to a sink, and (iii) crystallization at liquid-solid interface.

In one embodiment, the gaseous reactants are Ga, As, and In. These gaseous reactants are adsorbed into the gold nano-clusters as noted in the previous paragraph. The Ga, As, and In crystallize to form InGaAs. Note that this may be mono-crystalline InGaAs.

Figure 11K:
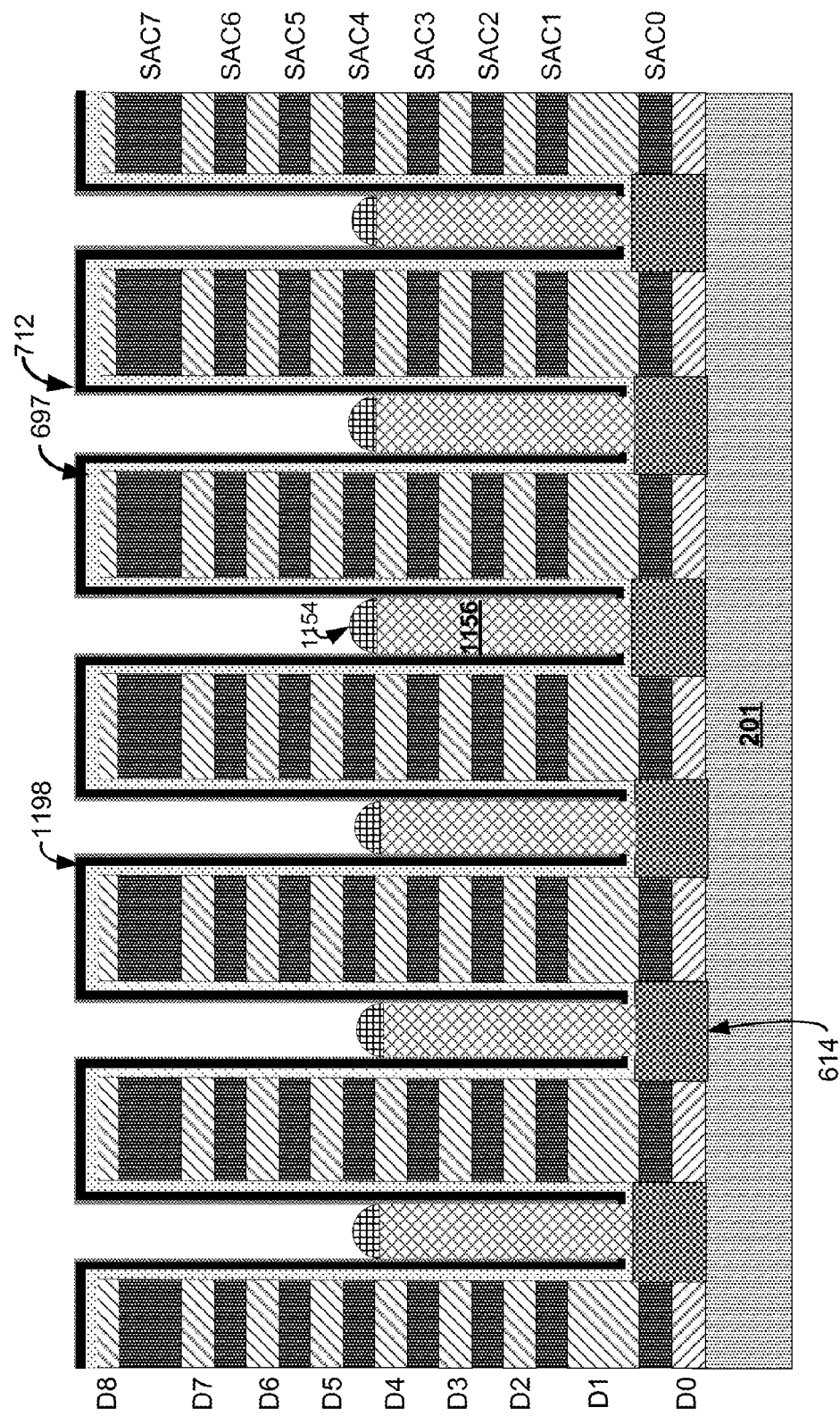

FIG. 11K shows results during growth of the III-V nanowire in the memory holes during step 1026. The catalyst 1154 is seen on top of the III-V nanowire 1156, which is growing from the bottom to the top of the memory holes. This is referred to herein as "self-directed" growth as the nanowire shape may conform to the shape and location of the memory hole. Although the gaseous reactants (such as Ga, As, and In) are not depicted in FIG. 11K, gaseous reactants are adsorbing into the catalyst 1154 at this time. Moreover, the III-V nanowire 1156 is growing as a crystal from the bottom memory hole towards the top of the memory hole, in one embodiment.

Figure 11L:
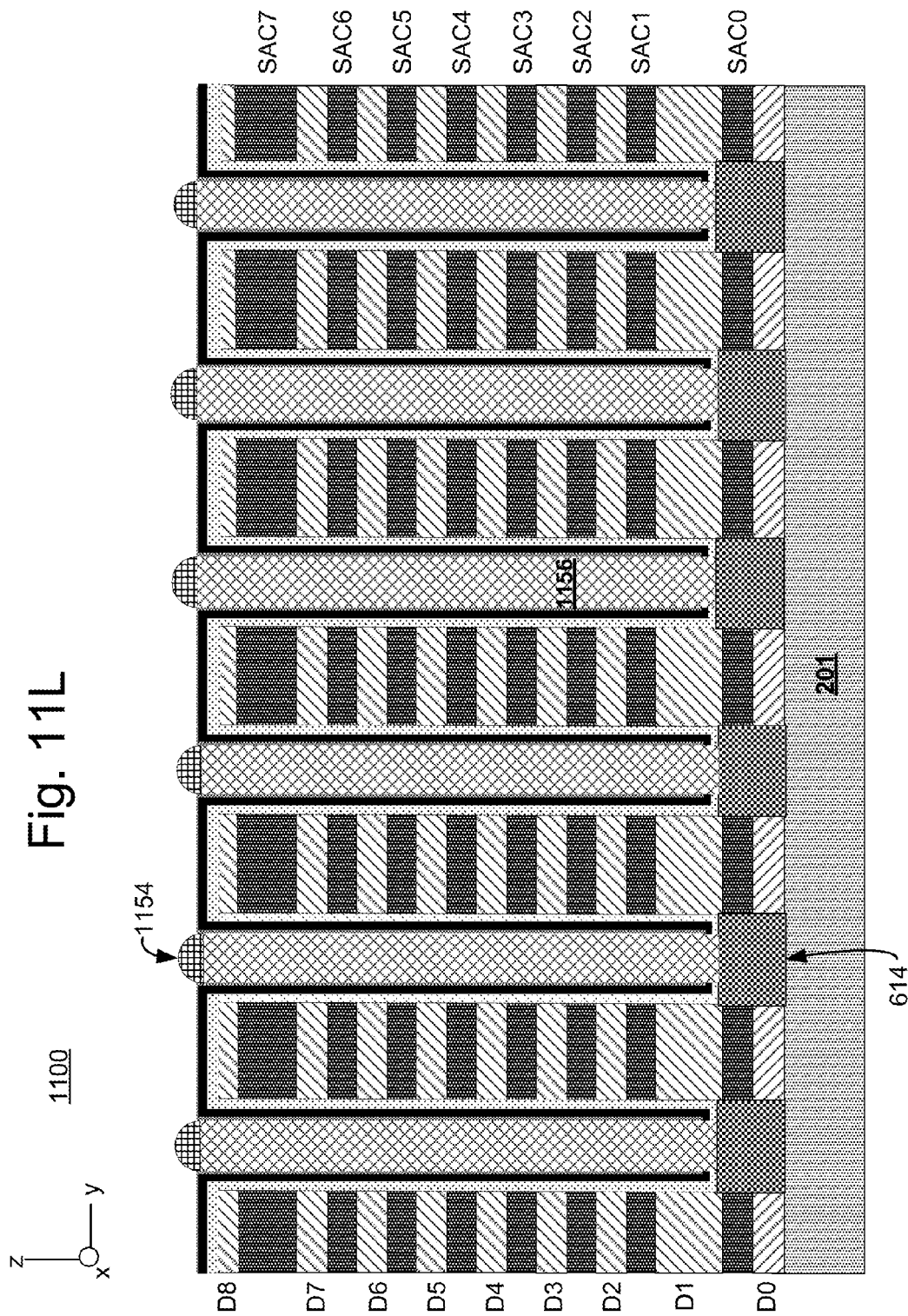

FIG. 11L shows results after growth of the III-V nanowires is complete. At this point the catalyst 1154 is seen as emerging from the memory holes. In one embodiment, process can produce III-V nanowires with diameter from 10 of nanometers to 100 nm (10 to $100 \times 10^{-9}$ meters). This is suitable to be able to fill the remainder of the memory hole (after depositing layers 697, 808, and 714) by a single mono-crystalline nanowire. For example, the memory hole may have a diameter of, for example, 70 to 110 nm (70 to $110 \times 10^{-9}$ meters). The thickness of the charge trap layer and tunnel dielectric may be about 22 nm ($22 \times 10^{-9}$ meters), as one example. This leaves about 22 nm to 66 nm (22 to $66 \times 10^{-9}$ meters) to be filled by the III-V nanowire, in this example. The height of the nanowire can reach a few micrometers ($10^{-6}$ meters) or more, depending on the time of growth. Growth rates of 10 micrometers ($10 \times 10^{-6}$ meters) in 30 minutes may be possible. Thus, the III-V channel 699 can be fabricated fast and in a cost-effective manner.

In one embodiment, the III-V channel 699 is $In_xGa_{1-x}As$, where x ranges from 0.65 to 0.73. The process provides for very good control over the stoichiometry. Note that x could be higher or lower.

Figure 11M:
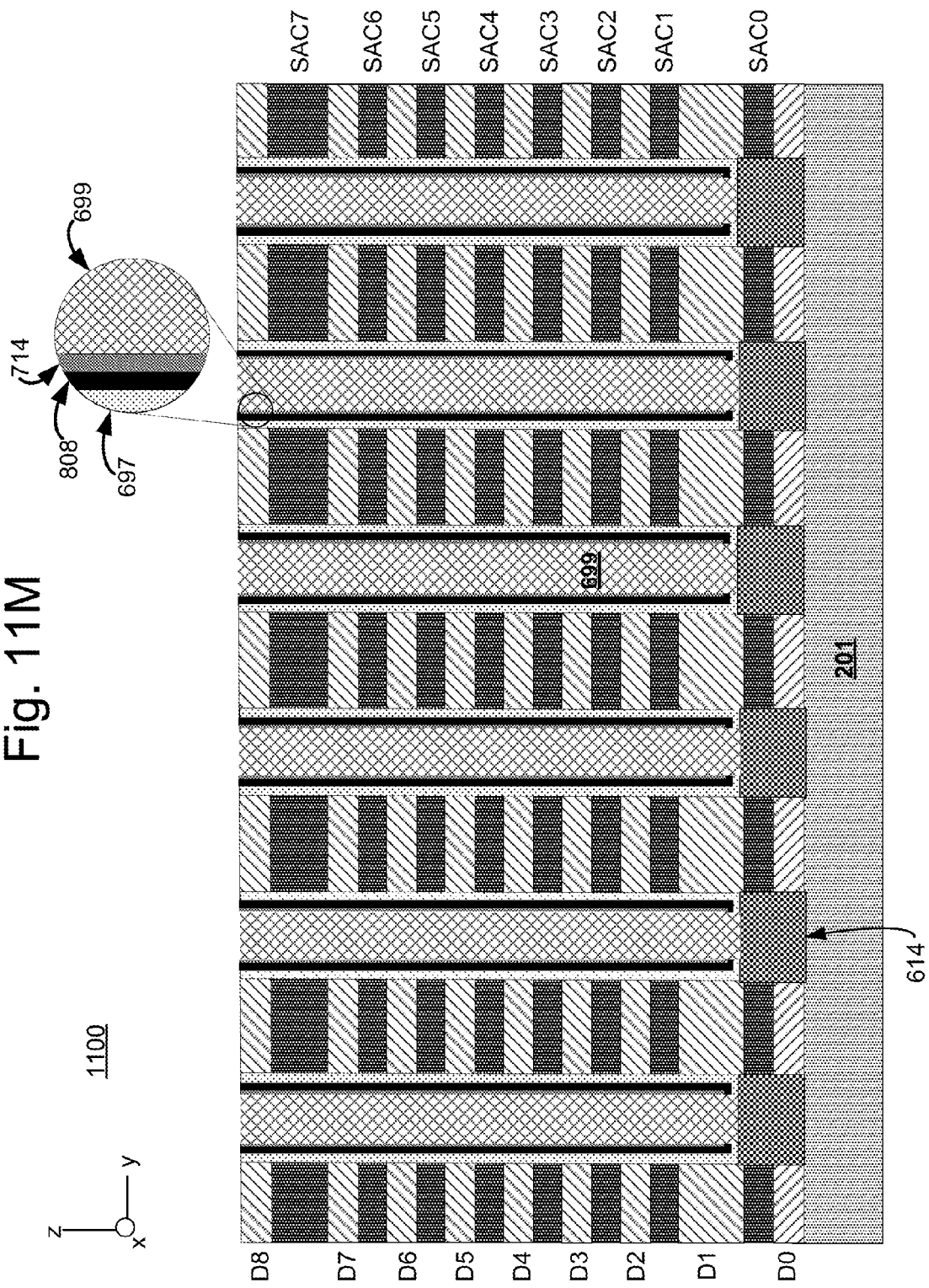

Step 1028 is to remove the gold nano-clusters at the tops of the NAND string channel 699. In one embodiment, the gold nano-clusters 1154 can be etched by Potassium Iodide (KI) solution. The solution may include Potassium Iodide (KI), Iodine ($I_2$), and deionized water. An example of an etching solution is: ($KI:I_2:H_2O=4$ g:1 g:40 ml). Other etching compositions can be used. FIGS. 11M and 11N show results after step 1028. FIGS. 11M and 11N show the III-V NAND channel 699 in the memory holes. Silicon region 614 may be in direct contact with the III-V NAND channel 699. Since the silicon region 614 serves as the body of the source side select transistor, which may be considered to be part of the NAND string, the silicon region 614 may be considered to be part of the NAND channel.

Figure 11O:
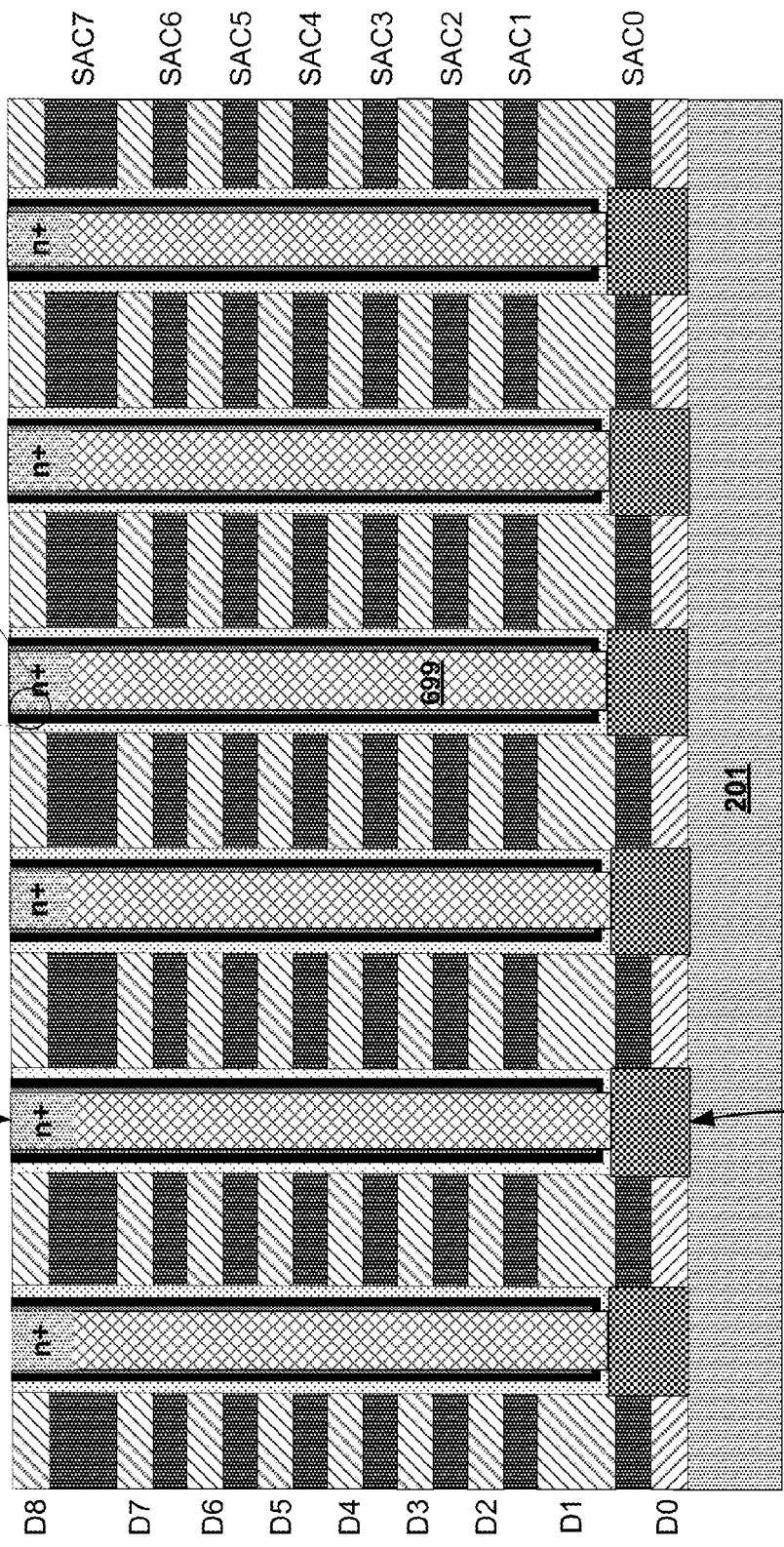

Step 1030 is to implant an n-type dopant in the drain end of the III-V channel 699. In one embodiment, silicon is used as the donor impurity. An activation anneal of 900-1000 C is used in one embodiment. This creates an n+ region at the drain end that reduces contact resistance with a bit line contact, in one embodiment. FIG. 11O shows results after step 1030, showing the n+ region 1178 at the drain end of the III-V NAND channel 699.

Figure 11P:
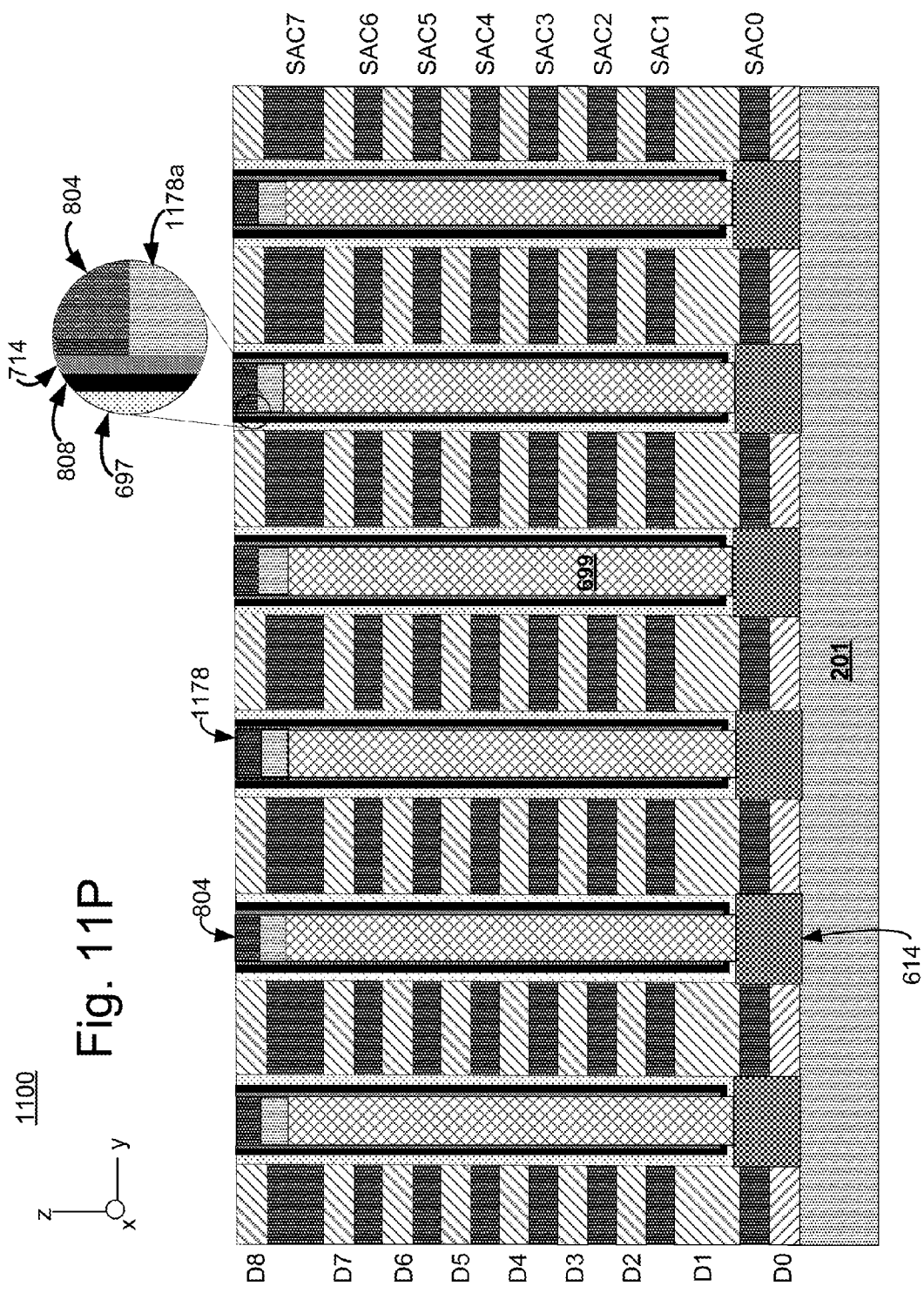
Figure 11Q:
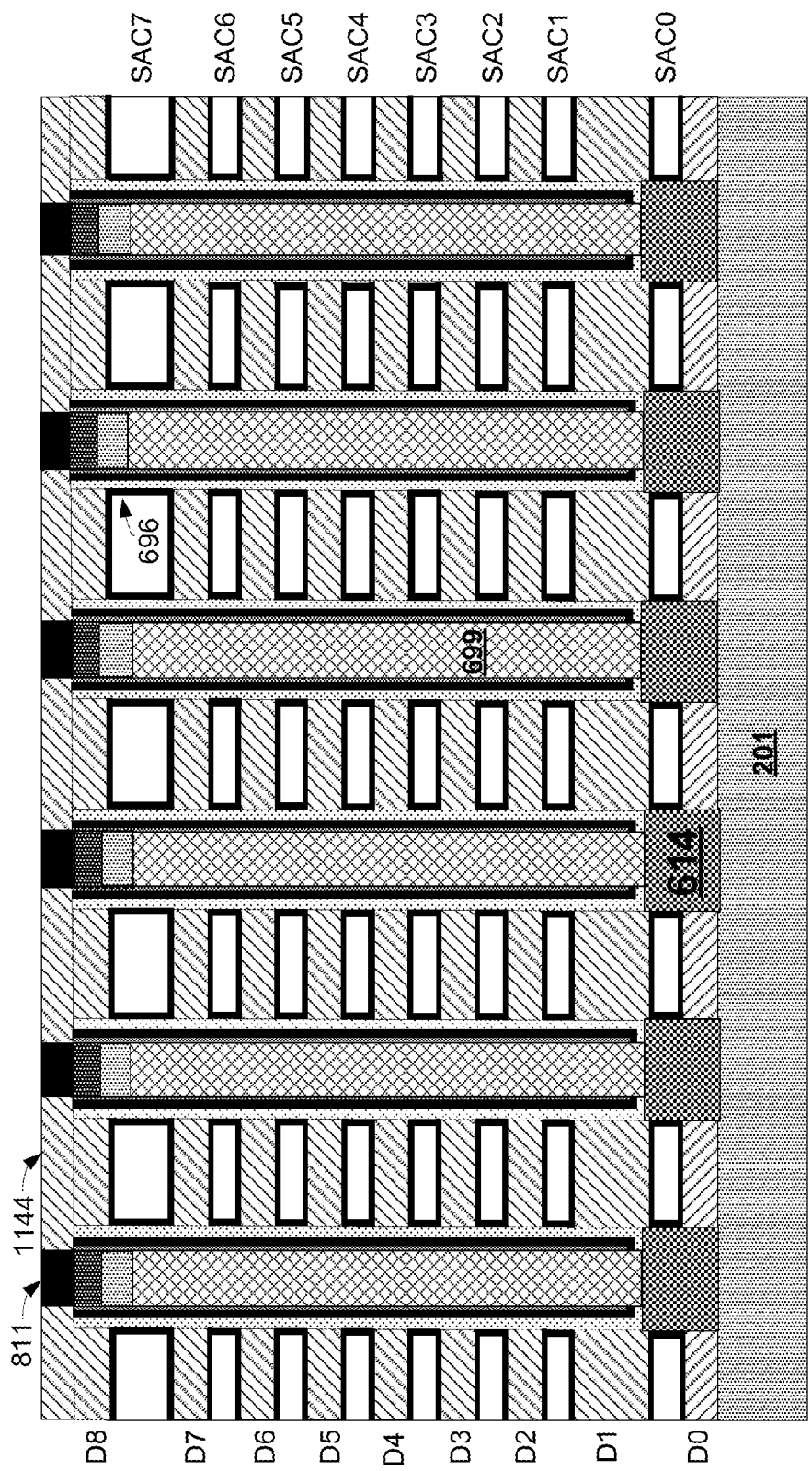

Step 1032 is to form a metal-III-V alloy at the drain end of the III-V channel 699. In one embodiment, this is a Ni—InGaAs alloy. Nickel is sputtered and annealed to form the metal-III-V alloy, in one embodiment. The anneal is between 350 to 550 C, in one embodiment. FIG. 11P shows results after step 1032, showing the metal-III-V alloy 804 at the drain end of the III-V NAND channel 699. Note that the n+ region 1178 remains after forming the metal alloy. These two regions may overlap. The close up shows a portion 1178*a* of the n+ region that is outside of the metal-III-V alloy 804 region. However, the metal-III-V alloy 804 region itself is formed in another portion of the n+ region, in this embodiment. Note that this type of overlap is just one option. However, note that significantly, both metal-III-V alloy region 804 and n+ region 1178 exist at the top of the III-V channel 699. Therefore both regions 804 and 1178 can help to reduce contact with a metal region that will later be formed above and in direct contact with the III-V NAND channel 699.

In another embodiment, the n+ region 1178 is formed, but the metal-III-V alloy 804 is not formed. In another embodiment, the metal-III-V alloy region 804 is formed, but the n+ region 1178 is not formed.

Step 1034 is to etch the slits. This removes the material that was in the slits and is done to allow removal of the sacrificial silicon nitride and to deposit metal.

Step 1036 includes performing an etch via the slits to remove portions of the silicon nitride layers. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings.

The wet etch should remove essentially the entire silicon nitride layers wherein the NAND strings are being formed (memory cell area), so that when the regions of the removed silicon nitride are replaced in at least part by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

Note that rather than performing the etch through the slits to remove the sacrificial material, the sacrificial material could be removed by etching through holes, voids, etc. In another embodiment, the sacrificial material is removed at an earlier stage of the process by etching through the memory holes to remove the sacrificial material. In such an embodiment, the slits can be filled with a material that serves as an anchor when etching through the memory holes.

In step 1038, the blocking layer is formed. The blocking layer is an $SiO_2$ layer and an $AlO_3$ layer (with the $SiO_2$ layer closer to the charge storage region), in one embodiment. The blocking layer may be deposited by ALD from outside of the memory hole through the slits.

Step 1040 includes depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal.

Step 1042 is re-filling in the slits. Step 1044 is forming a metal bit line contact 811 to the III-V NAND channel 699.

FIG. 11Q shows results after step 1042. The sacrificial layers SAC0-SAC7 have been replaced by the blocking layer 696, as well as metal layers SGS, WL0-WL5, and SGD, respectively. Also, the metal bit line contact 811 is formed in direct contact with the drain end of the III-V channel 699. Individual bit line contacts 811 are separated by a dielectric 1144. Afterwards, the bit lines 111 may be formed such that the bit lines are electrically connected to the metal bit line contacts 811.

In the process of FIG. 10, the body of the source side select transistor is formed from silicon. In another embodiment, the body of the source side select transistor is formed from a III-V compound. This may be the same III-V compound that is used to form the rest of the NAND channel. However, different process steps may be used to form the body of the source side select transistor.

FIG. 12A is a flowchart of one embodiment of a process of fabricating a 3D memory device in which the entire NAND channel (including the body of the source side select transistor) is formed from a III-V compound. The process has many steps in common with the process of FIG. 10. Similar steps will not be discussed in detail. The process starts with steps 1002-1008, which results in a structure such as depicted in FIGS. 11A and 11B. Recall that in one embodiment the structure 1100 has alternating layers of silicon oxide and silicon nitride, with memory holes etched down to the substrate 201.

In step 1210, a III-V compound is grown at the bottom of each of the memory holes. This is for the body of the source side select transistor. In one embodiment, step 1210 includes growing a nanowire to form the III-V compound. In one embodiment, nanocluster-catalyzed VLS synthesis is used.

Figure 13A:
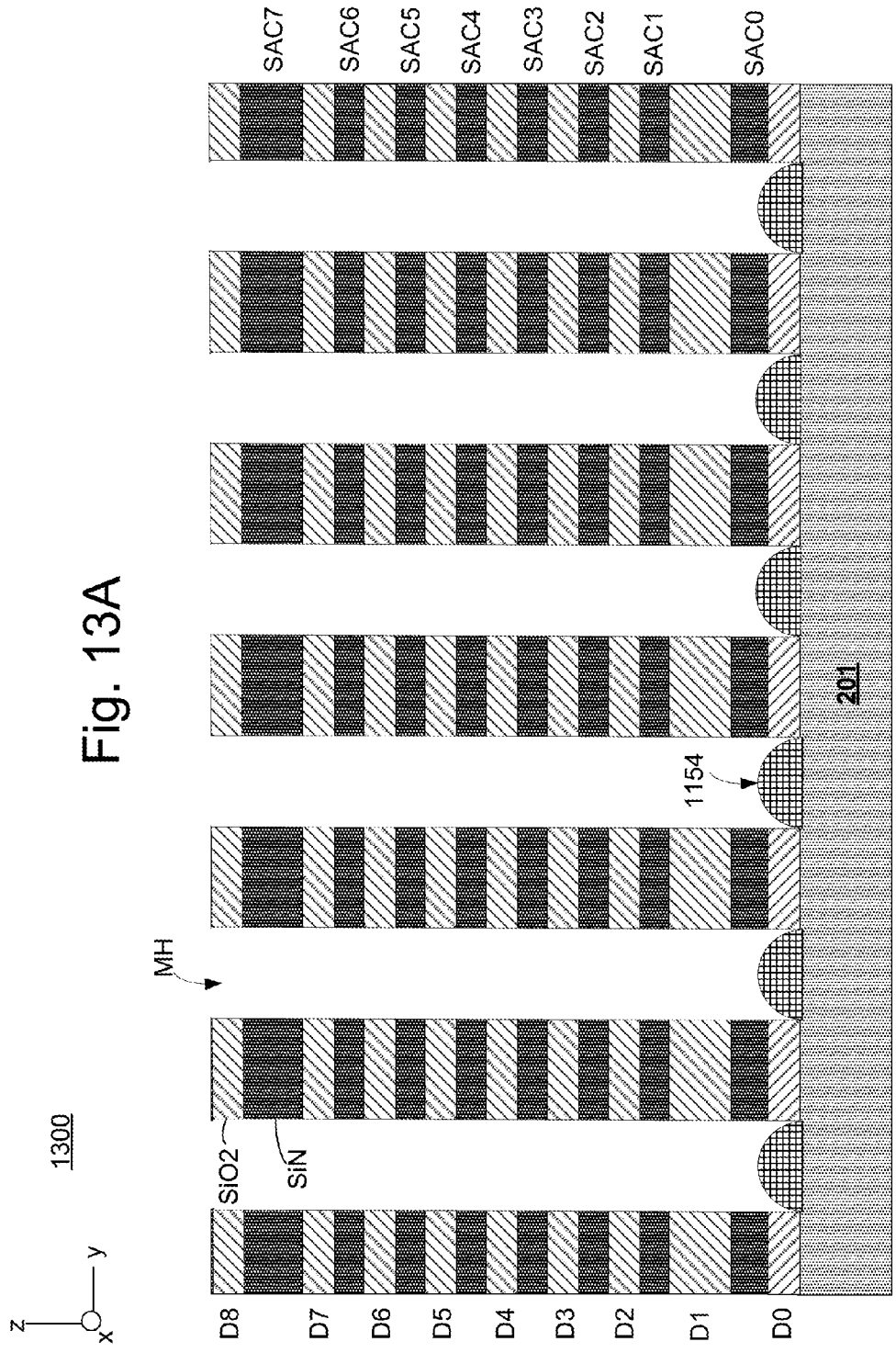
FIGS. 13A-13C depict results after various steps of FIG. 12B.

FIG. 12B is a flowchart that provides details for one embodiment of step 1210 of FIG. 12A. Step 1244 includes depositing nano-clusters in the memory holes. This step is similar to step 1024 of FIG. 10. However, the nano-clusters are deposited on the semiconductor substrate 201, in this embodiment. Results after step 1244 are depicted in FIG. 13A. FIG. 13A shows a structure 1300 with memory holes (MH) etched into alternating layers of silicon oxide and silicon nitride. Gold nano-clusters 1154 are depicted on the semiconductor substrate 201 at the bottom of the memory holes (MH). The semiconductor substrate 201 is silicon, in one embodiment.

Figure 13B:
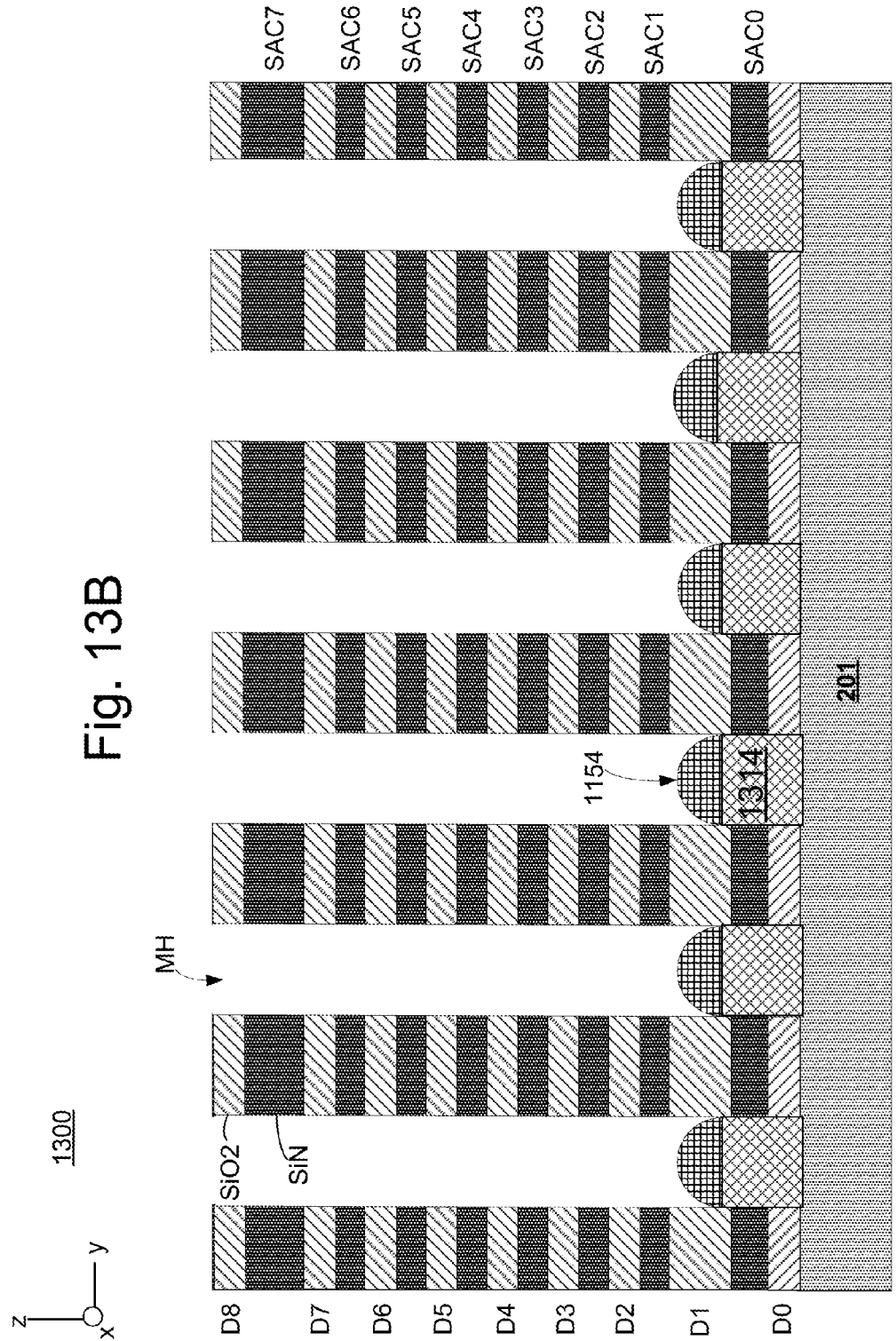

Step 1246 of FIG. 12B is nano-wire III-V compound growth upwards from the semiconductor substrate 201. This growth only goes partway up of the memory holes, such that the body of the source side select transistor is formed. The growth of the nano-wire III-V compound growth may be similar to step 1026 of FIG. 10. Results after step 1246 are depicted in FIG. 13B. Here, the growth has been controlled to achieve a desired height for the III-V body 1314 of the source side select transistor. The gold nano-clusters 1154 are still shown.

Figure 13C:
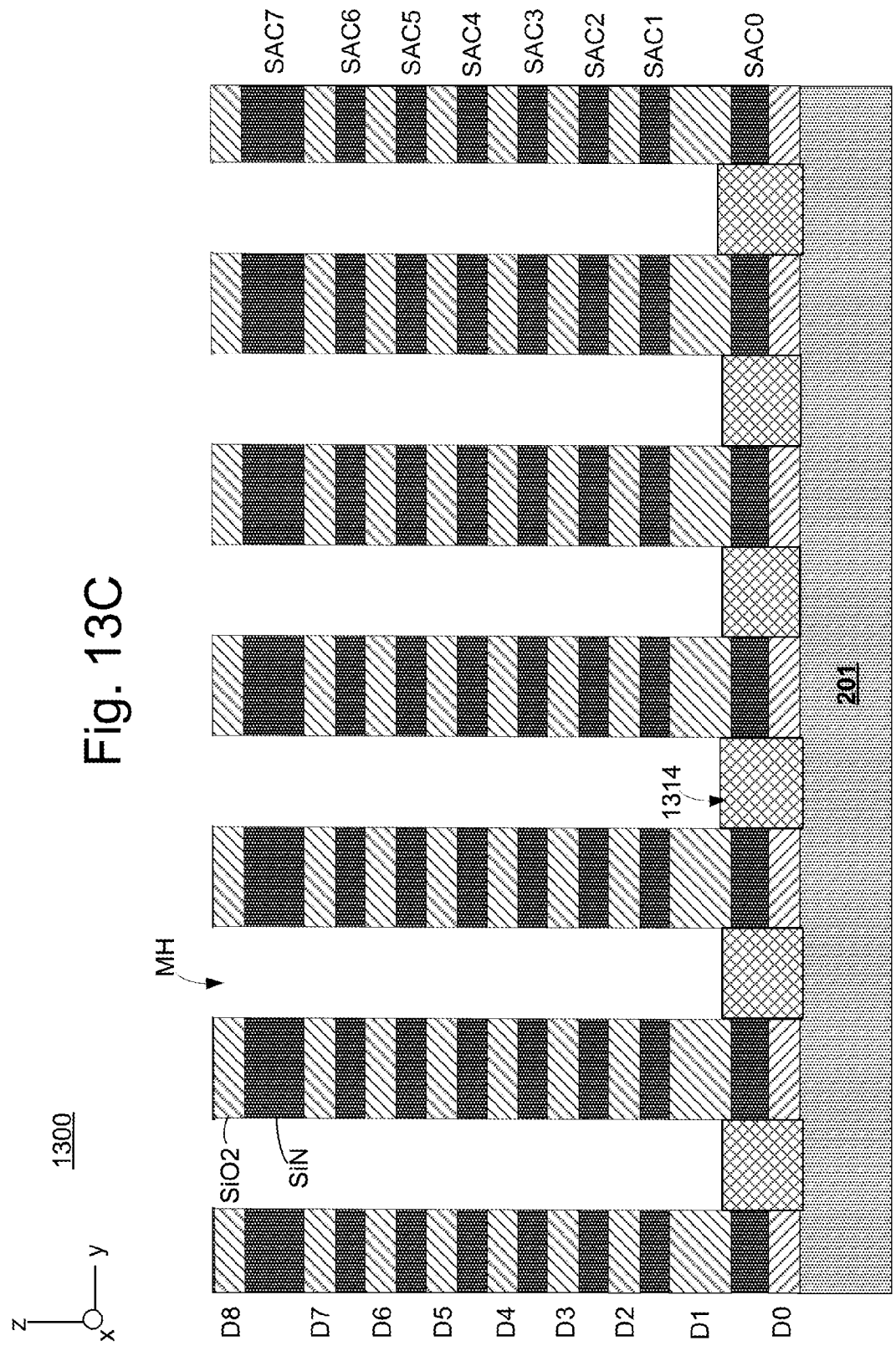

Step 1248 of FIG. 12B is to remove the gold nano-clusters 1154. The gold nano-clusters 1154 may be removed by a process similar to step 1028 of FIG. 10. In one embodiment, the gold nano-clusters 1154 can be etched by Potassium Iodide (KI) solution. Results after the etch are depicted in FIG. 13C. FIG. 13C shows the III-V body 1314 of the source side select transistor at the bottom of each memory hole. Since this is self-directed growth, the III-V body 1314 conforms its shape and location to that of the memory hole, in one embodiment. The III-V body 1314 is mono-crystalline, in one embodiment.

Discussion will now be returned to FIG. 12A. After the source region 1314 is formed from the III-V compound in step 1210, the process has some steps similar to those of FIG. 10. As noted, a difference is the material from which the body of the source side select transistor is formed. Steps 1012-1022 are then performed. These steps deposit the charge trapping layer (step 1012) and the tunnel dielectric layers (step 1014, optionally step 1015, optionally step 1016) in the memory holes. A variety of options are possible for the tunnel dielectric layers, similar to the process of FIG. 10. After depositing the charge trapping layer and the tunnel dielectric layers, a protective layer may be deposited in step 1018. Then, etching is performed to expose the source region in step 1020. After the etch, cleaning is performed in step 1022.

In step 1224-1228, the III-V NAND channel 699 is completed. The process may be similar to the one of FIG. 10. In step 1224, the nano-cluster catalyst is deposited. This is similar to step 1024 of FIG. 10, except here the nano-cluster catalyst is deposited on the III-V body 1314. Results after step 1224 of FIG. 12A are depicted in FIG. 13D. A gold nano-cluster catalyst 1154 is depicted on each III-V body 1314 in the memory holes. Also depicted are the charge trapping layer 697, the tunnel dielectric outer portion 808, and the aluminum oxide layer 714. As noted above, the aluminum oxide layer 714 is optional.

In step 1226 of FIG. 12A, a III-V nanowire is grown in each memory hole. In one embodiment, nanocluster-catalyzed VLS synthesis is used. This step is similar to step 1026 of FIG. 10, except that the growth is from the III-V body 1314 of the source side select transistor. Step 1228 is to remove the gold catalyst. This step may be similar to step 1028 from FIG. 10. Steps 1030-1044 are similar to those in FIG. 10.

Results after step 1044 of FIG. 12A are depicted in FIG. 13E. The memory hole now has the charge trapping layer 697, the outer tunnel dielectric layers 808, the aluminum oxide 714, and the III-V channel 699. The III-V body 1314 may be considered to be part of the III-V channel 699. Thus, the process grows a nanowire of III-V semiconductor from the semiconductor substrate 201 upwards to fill the entire hole that is left after layers 697, 808 and 714 are deposited. The drain end of the III-V channel 699 has the n+ doped region 1178 and the alloy 804. The metal bit line contact 811 is in contact with the drain end of the III-V channel 699. In this embodiment, the blocking layer 696 has been formed outside of the memory holes.

Figure 14B:
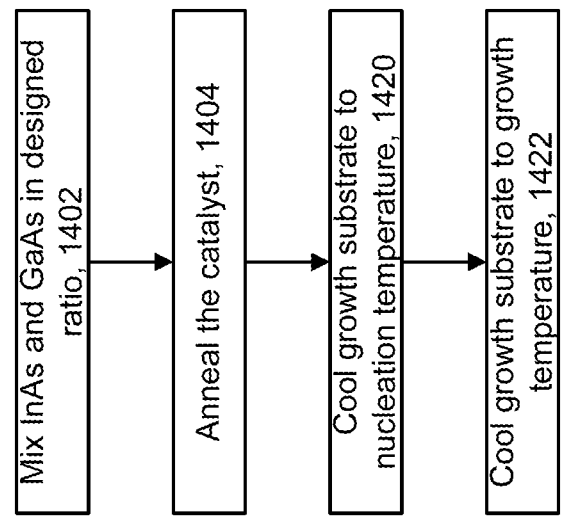
FIG. 14B describes a two step growth method of one embodiment of nanowire growth in memory holes.
Figure 14A:
FIG. 14A is a flowchart that shows additional details of one embodiment of nanowire growth in memory holes.

FIG. 14A is a flowchart that shows additional details of one embodiment of nanowire growth in memory holes. This process could be used for any of the III-V nanowire synthesis described herein, including but not limited to, the process of FIGS. 10, 12A and 12B. The process could be used for forming the III-V body 1314 or the rest of the NAND channel 699.

In this embodiment, a two zone furnace is used. The two zones are referred to as an upstream and a downstream. The upstream of the furnace is used for the reactant source. The growth substrate is positioned in the downstream of the furnace. Note that prior to this process the growth catalyst may have already been deposited at the bottom of the memory holes (either on the semiconductor substrate 201 or the body of source side select transistor).

In step 1402, III-V (e.g., InGaAs) nanowire growth is facilitated using InAs and GaAs powders mixed in a designated ratio (e.g., 50 wt % InAs/50 wt % GaAs) and loaded into a boron nitride crucible in the upstream of the furnace as a reactant source.

In step 1404, the catalyst is annealed. As one example, the downstream of the furnace is elevated to 720-800 C and held at that temperature for 1-10 minutes to anneal a gold catalyst.

In step 1406, the temperature is then cooled directly to the growth temperature. An example of the growth temperature is 520-560 C. This may be performed about 15 minutes after annealing has finished. The upstream then starts to heat. When the source temperature reaches the designated value, growth begins. In one embodiment, $H_2$ is used as a carrier gas to transport the evaporated source materials to the growth substrate. During the growth phase, the flow rate of $H_2$ may be maintained at 100 sccm. The pressure downstream may be about 1 Torr.

FIG. 14A describes a single step growth method of one embodiment of nanowire growth in memory holes. However, if the temperature is cooled down quickly and directly to the growth temperature when precursor particles start to be supplied from the source zone, the catalyst nanoparticles may not be homogeneous, and some solid phase may co-exist with liquid phase at the stage of nucleation. This physical phase inversion within the catalysts could hinder the growth rate of nanowires at the catalyst nanowire interface and lead to unevenly distributed growth rate, and hence formation of grains and defects. Therefore, in one embodiment, initial formation of nanowires in the memory holes (stage of nucleation) is done at higher temperature, e.g. 600-640 C. Then, the temperature is reduced to a lower, steady-state growth rate of 520-560 C.

FIG. 14B describes a two step growth method of one embodiment of nanowire growth in memory holes. Steps 1402 and 1404 are similar to FIG. 14A. In step 1420, the growth substrate is cooled to a "nucleation temperature". As just noted, this is about 600-640 C in one embodiment. This step may be performed about 10 minutes after the anneal is complete. This first step may last for about 1 to 5 minutes.

In step 1422, the growth substrate is cooled to a "growth temperature." This is 520-560 C in one embodiment. This could be held for about 10 to 40 minutes, as one example. During the growth phase, the flow rate of $H_2$ may be maintained at 100 sccm. The pressure downstream may be about 1 Torr.

FIGS. 14A and 14B described a process for forming InGaAs channels. The processes can be modified for other III-V compounds.

In one embodiment, the catalyst that is used to help form the III-V nanowires is used to create an alloy at the drain end of the NAND channel 699. FIG. 15A is a flowchart of one embodiment of creating an alloy at the drain end of the NAND channel 699. The process has much in common with the process of FIG. 10. However, some steps from FIG. 10 are not needed. The process starts with steps 1002-1026. This produces a structure such as the one depicted in FIG. 11L, in one embodiment. That structure has some of the gold catalyst 1154 on top of the III-V nanowire 1156.

In the process of FIG. 15A, the gold catalyst is not removed. Thus, step 1028 from FIG. 10 is not performed. Also, it is not required to perform an implant. Thus, step 1030 from FIG. 10 is not required. Likewise, step 1032 from FIG. 10 is not required.

Instead of those steps, an anneal is performed in step 1502 to cause the gold 1154 to diffuse into the drain end of the III-V nanowire 1156. The anneal is performed at a temperature between 350-500 C for 5 to 10 minutes, in one embodiment. The anneal may take place in an $N_2$ or Ar atmosphere. The anneal causes the gold 1154 to diffuse to some desired depth (based on anneal parameters). In one embodiment, the III-V nanowire 1156 is formed from InGaAs. In this case, the gold forms an Au—InGaAs alloy, in one embodiment. Thus, step 1502 forms a metal-III-V alloy from the gold catalyst in the drain end of the vertically-oriented NAND string channel.

Figure 15B:
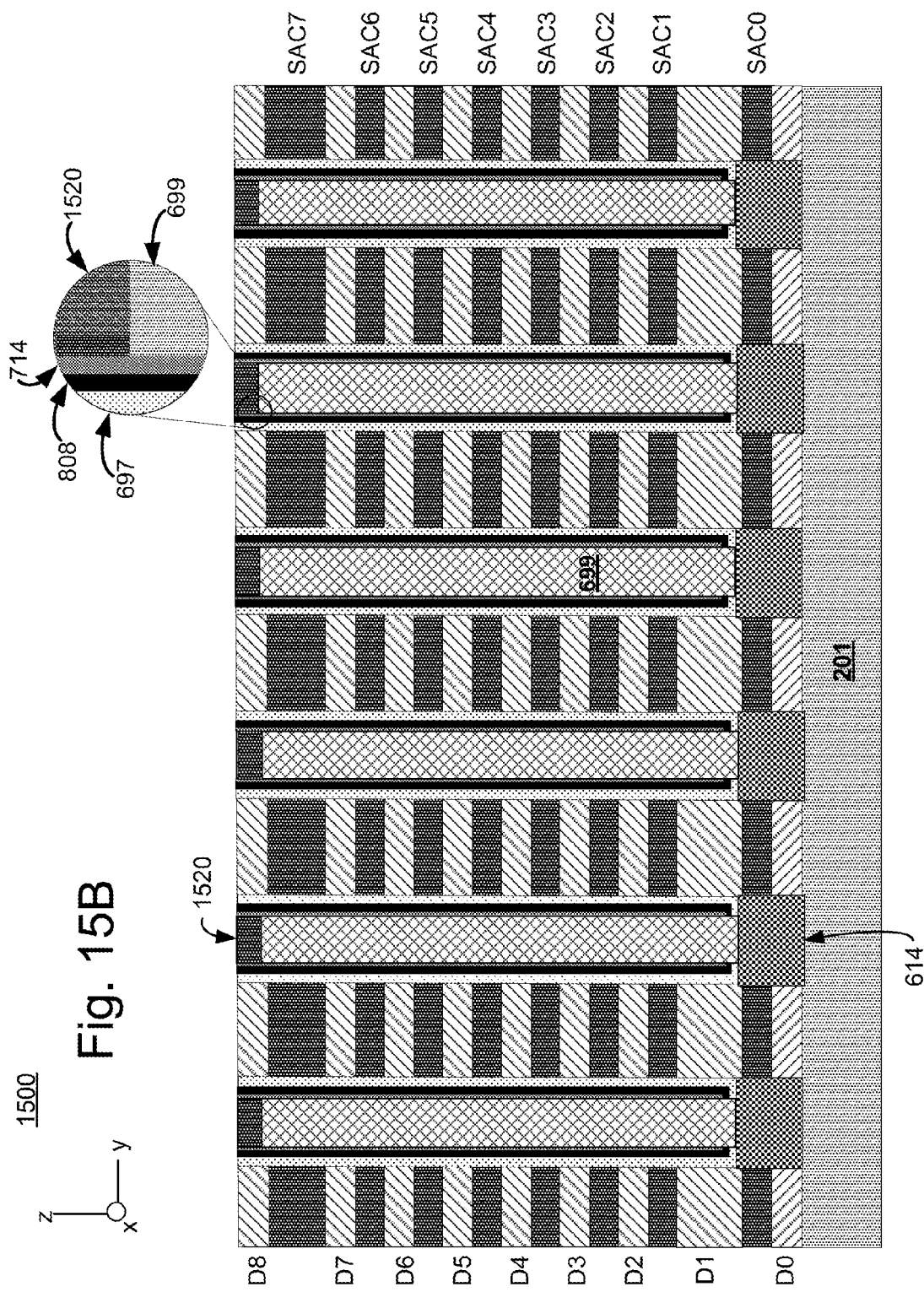
FIG. 15B depicts results after step 1504 of FIG. 15A.

Step 1504 is to clean after the anneal. A DHF wet clean is used in one embodiment. Results after step 1504 are depicted in FIG. 15B, which shows the alloy 1520 region at the drain end of the III-V NAND channel 699.

Optionally, other alloys may be formed using other process steps. For example, a gold-zinc-III-V alloy could be formed.

The technique of using the catalyst to create an alloy at the drain end of the NAND channel 699 may also be used when III-V bodies 1314 are formed, as was discussed with respect to FIG. 12A.

Figure 16A:
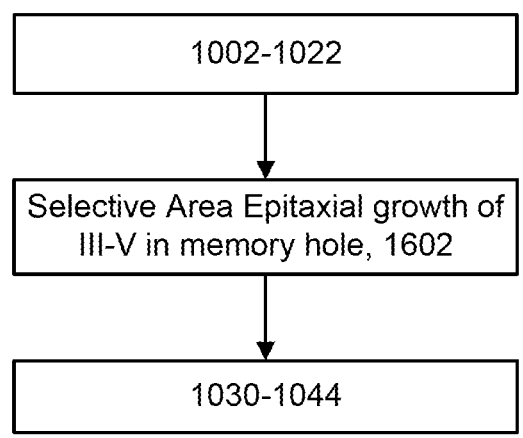
FIG. 16A is a flowchart of one embodiment of a process of fabricating a 3D memory having a III-V NAND channel in which selective area epitaxy (SAE) is used to form the NAND channel in memory holes.

In some embodiments, the III-V NAND channel 699 is formed using epitaxial growth of the III-V compound in the memory holes. Thus, this is also a "self-directed" technique. FIG. 16A is a flowchart of one embodiment of a process of fabricating a 3D memory having a III-V NAND channel in which selective area epitaxy (SAE) is used to form the NAND channel in memory holes. The process is similar in some ways to the process of FIG. 10, with a difference being that SAE is used instead of forming nanowires. Thus, steps from FIG. 10 will be referred to when discussing FIG. 16A. Initially, steps 1002-1022 from FIG. 10 are performed. This results in a structure similar to the one depicted in FIG. 11I. Note that in FIG. 11I, the body of the source side select transistor is formed from silicon.

In step 1602 SAE is used to form the III-V NAND channels within the memory holes. This is self-directed growth. This forms a single crystal of III-V compound in one embodiment. In one embodiment, $(CH_3)_3In$ (TMIn) and $(CH_3)_3Ga$ (TMGa) are used as Group III precursors, and $(CH_3)_3CAs$ (TBAs) is used as a group V precursor. The carrier gas may be $H_2$. The growth temperature may be 610 C.

Figure 16B:
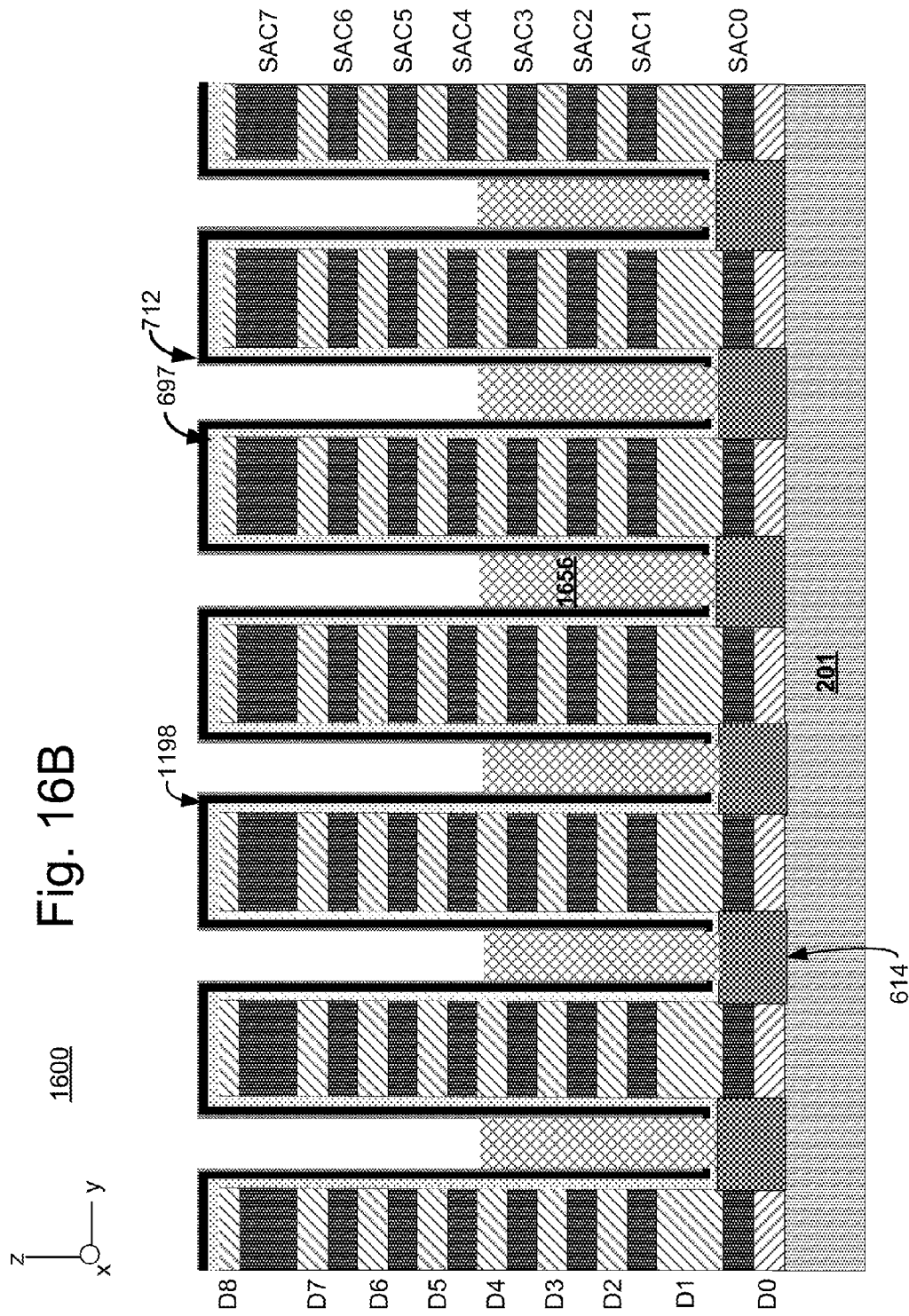

FIG. 16B depicts results during step 1602. The structure 1600 has memory holes drilled in alternating layer of silicon oxide and silicon nitride. The silicon body 614 of the source side select transistor is depicted in the bottom of the memory holes. The III-V compound 1656 is shown having grown about halfway up the memory hole by this point, in self-directed growth.

FIG. 16C depicts results after step 1602 is complete. The III-V compound 1656 is shown having grown to fill the memory holes. At this point the III-V compound now forms the III-V NAND channel 699.

After the III-V NAND channel 699 has been formed by SAE, steps 1030-1044 may be performed. This results in a structure such as depicted in FIG. 11Q.

Similar to how when forming the III-V NAND channel 699 with a nanowire technique that the body of the source side select transistor can be formed from silicon or the III-V compound, the body can be formed from either material when using SAE to form the III-V NAND channel 699.

Figure 17A:
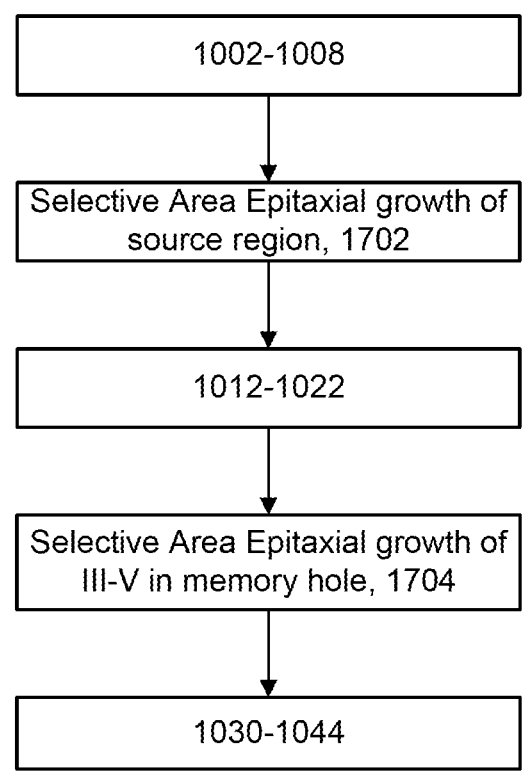
FIG. 17A is a flowchart that describes one embodiment of a process of fabricating 1 3D memory device having a III-V NAND channel forming using SAE, in which the bodies of the source side select transistor are forming from the III-V compound.

FIG. 17A is a flowchart that describes one embodiment of a process of fabricating a 3D memory device having a III-V NAND channel 699 forming using SAE, in which the bodies of the source side select transistor are forming from the III-V compound. This is also a "self-directed" technique. The process is similar in some ways to the process of FIG. 12A, with a difference being that SAE is used instead of forming nanowires. Initially, steps 1002-1008 from FIG. 10 are performed. This results in a structure similar to the one depicted in FIG. 11A. FIG. 11A shows memory holes etched in alternating layers of silicon nitride and silicon oxide.

Figure 17B:
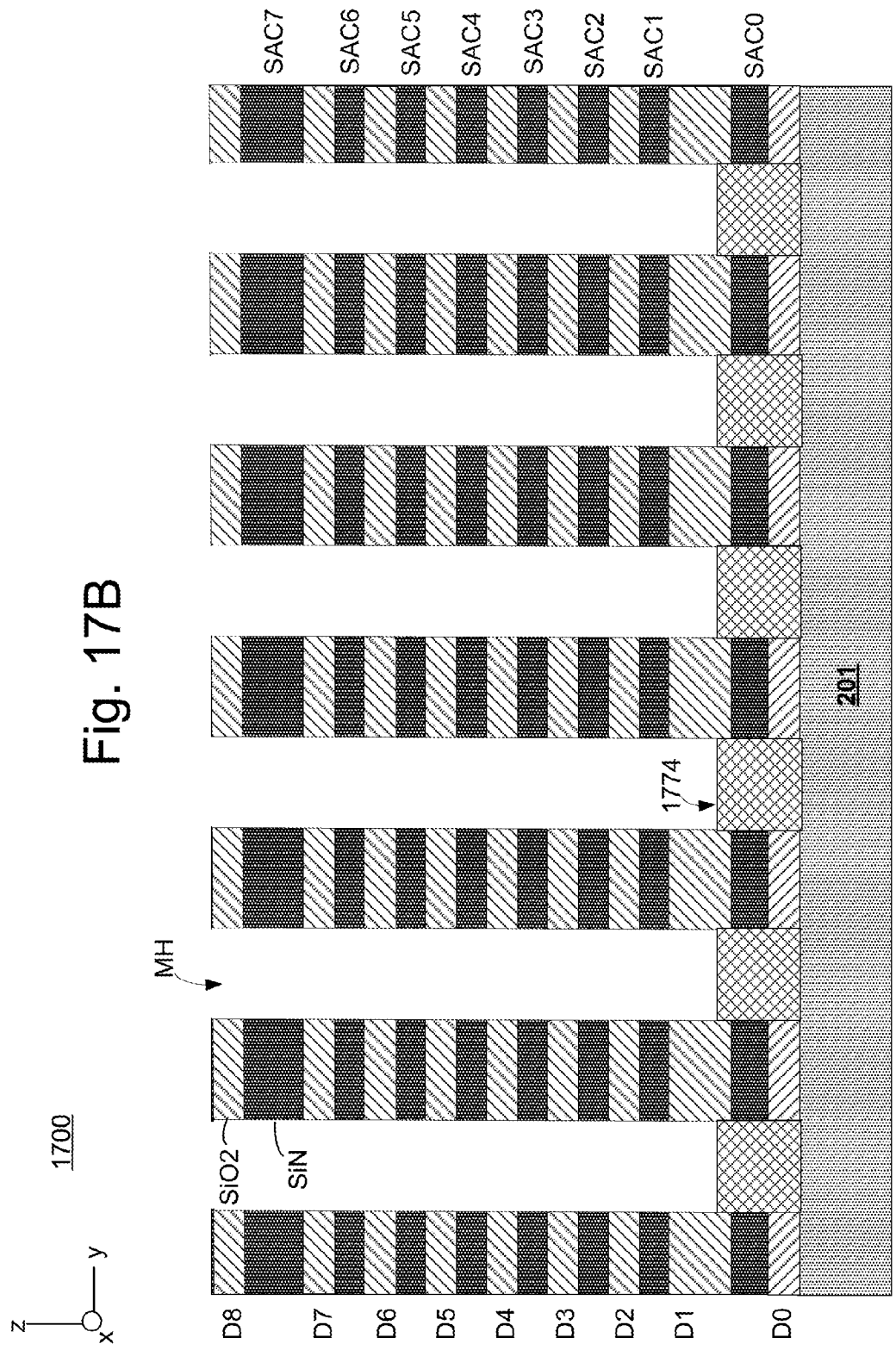
FIGS. 17B-17D depict results after various steps of the process of FIG. 17A.

In step 1702 SAE is used to form the III-V bodies of the source side select transistor within the memory holes. This is self-directed growth. This forms a single crystal of III-V compound in one embodiment. In one embodiment, $(CH_3)_3In$ (TMIn) and $(CH_3)_3Ga$ (TMGa) are used as Group III precursors, and $(CH_3)_3CAs$ (TBAs) is used as a group V precursor. The carrier gas may be $H_2$. The growth temperature may be 610 C. Results after step 1702 are depicted in FIG. 17B. FIG. 17B shows a structure 1700 having memory holes etched in alternating layers of silicon nitride and silicon oxide. The III-V body 1774 that was formed by SAE is depicted at the bottom of each memory hole.

After the III-V bodies 1774 are formed using SAE, steps 1012-1022 are performed. This forms the charge trapping layer and the tunnel dielectric layers in the memory holes. As discussed with respect to FIG. 10, a variety of options are possible for the tunnel dielectric layers. The aluminum oxide layer is optional. Likewise, the lanthanum oxide layer is optional.

In step 1704, SAE is used to form the rest of the NAND channel. This step is similar to step 1602 from FIG. 16A. A difference is that now the growth is started from the III-V bodies 1774, instead of from silicon bodies 614. This forms a mono-crystalline III-V compound that fills the memory hole, in one embodiment. In one embodiment, $(CH_3)_3In$ (TMIn) and $(CH_3)_3Ga$ (TMGa) are used as Group III precursors, and $(CH_3)_3CAs$ (TBAs) is used as a group V precursor. The carrier gas may be $H_2$. The growth temperature may be 610 C.

Figure 17C:
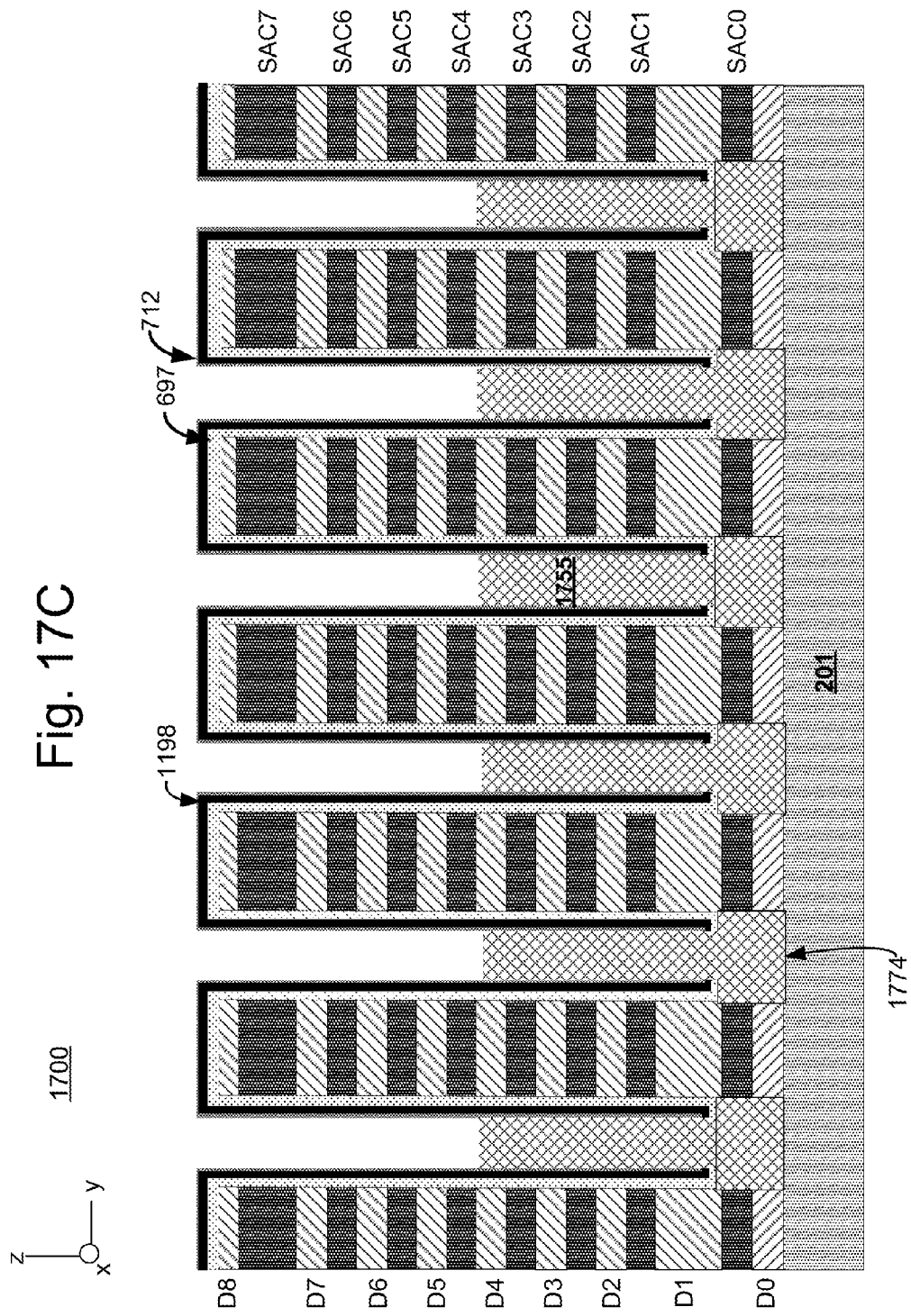

FIG. 17C depicts results during step 1704. The structure 1700 has memory holes drilled in alternating layer of silicon oxide and silicon nitride. The III-V body 1774 of the source side select transistor is depicted in the bottom of the memory holes. The III-V compound 1775 is shown having grown about halfway up the memory hole by this point.

Figure 17D:
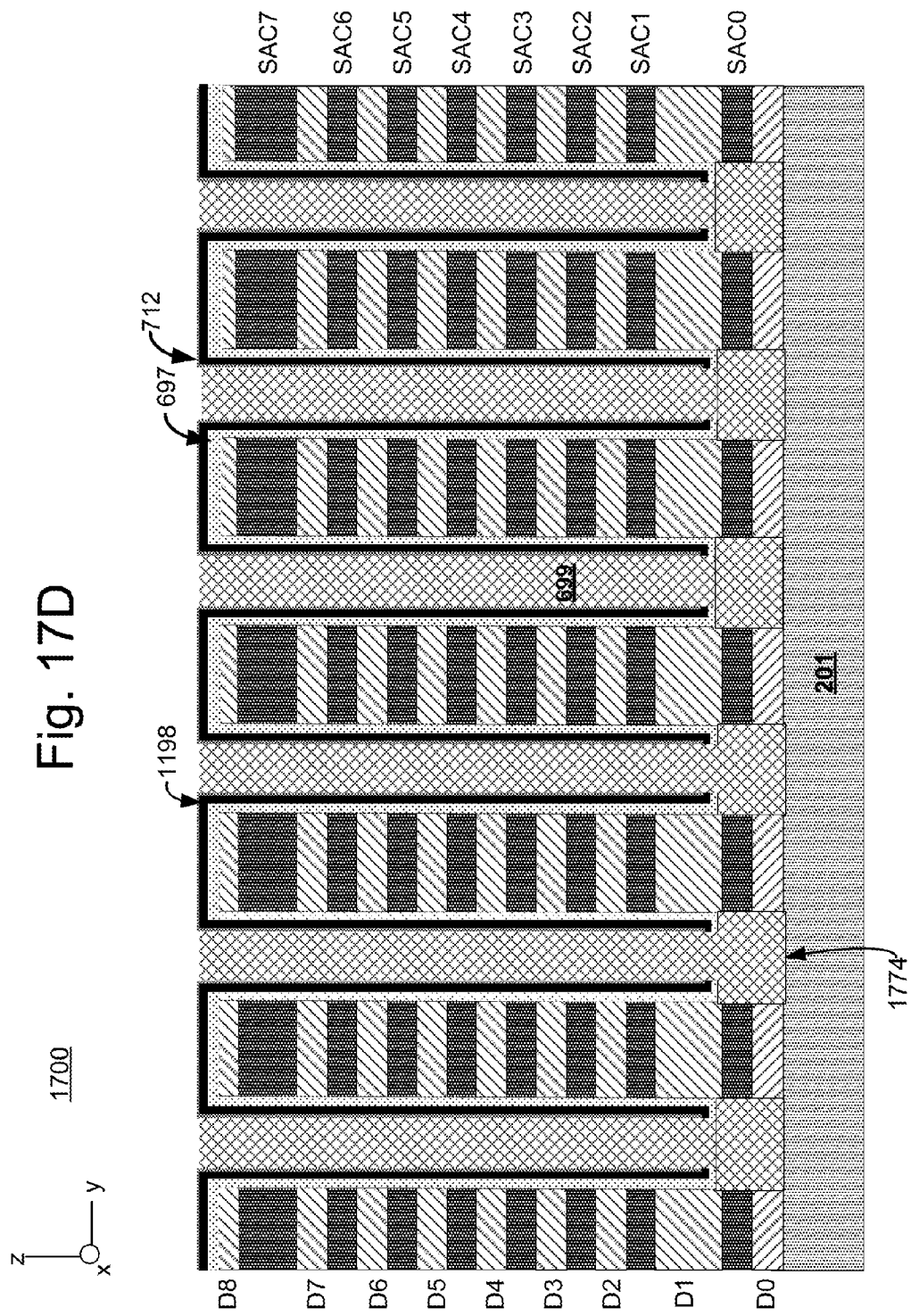

FIG. 17D depicts results after step 1704 is complete. The III-V compound is shown having grown to fill the memory holes. At this point the III-V compound now forms the III-V NAND channel 699. The III-V bodies 1714 may be considered to be part of the NAND channel 699. Thus, the process grows the III-V semiconductor in the hole from the semiconductor substrate upwards by epitaxial growth to form the entire NAND string channel.

After the III-V NAND channel 699 has been formed by SAE, steps 1030-1044 may be performed. This results in a structure such as depicted in FIG. 13E.

One embodiment disclosed herein includes a three-dimensional (3D) non-volatile storage device, comprising a semiconductor substrate that has a major axis that extends in a horizontal direction, a plurality of word lines, a plurality of bit lines, a plurality of metal bit line contacts, and a plurality of vertically oriented NAND strings associated with the plurality of bit lines and with the plurality of word lines. Each of the metal bit line contacts is connected to a bit line of the plurality of bit lines. Each of the vertically oriented NAND strings comprises a channel region that comprises a III-V semiconductor, wherein the channel region has a major axis that extends in a vertical direction with respect to the semiconductor substrate. The channel region has a drain end and a source end. The drain end of each NAND string channel comprises a metal-III-V semiconductor alloy. Each metal bit line contact is in direct contact with the metal-III-V semiconductor alloy of its associated NAND string. Each of the vertically oriented NAND strings also has a plurality of memory cells associated with the channel region. Each of the memory cells has a charge storage region and a tunnel dielectric between the channel region and the charge storage region.

One embodiment disclosed herein includes a three-dimensional (3D) non-volatile storage device, comprising a semiconductor substrate that has a major axis that extends in a horizontal direction, a plurality of word lines, a plurality of bit lines, and a plurality of vertically oriented NAND strings associated with the plurality of bit lines and with the plurality of word lines. Each of the vertically oriented NAND strings comprises a channel region that comprises a III-V semiconductor, wherein the channel region has a major axis that extends in a vertical direction with respect to the semiconductor substrate. Each of the vertically oriented NAND strings also has a plurality of memory cells associated with the channel region. Each of the memory cells has a charge storage region and a tunnel dielectric between the channel region and the charge storage region. The tunnel dielectric comprises aluminum oxide in direct contact with the III-V semiconductor of the channel region.

One embodiment disclosed herein includes a three-dimensional (3D) non-volatile storage device, comprising a semiconductor substrate that has a major axis that extends in a horizontal direction, a plurality of word lines, a plurality of bit lines, and a plurality of vertically oriented NAND strings associated with the plurality of bit lines and with the plurality of word lines. Each of the vertically oriented NAND strings comprises a channel region that comprises a III-V semiconductor, wherein the channel region has a major axis that extends in a vertical direction with respect to the semiconductor substrate. Each of the vertically oriented NAND strings also has a plurality of memory cells associated with the channel region. Each of the memory cells has a charge storage region and a tunnel dielectric between the channel region and the charge storage region. The NAND strings each have a source side select transistor that comprises a body that is the III-V semiconductor. The semiconductor substrate is silicon, wherein the body of the source side select transistor is in direct contact with the semiconductor substrate and is in direct contact with the III-V semiconductor at the source end of the NAND.

One embodiment disclosed herein includes a three-dimensional (3D) non-volatile storage device, comprising a semiconductor substrate that has a major axis that extends in a horizontal direction, a plurality of word lines, a plurality of bit lines, and a plurality of vertically oriented NAND strings associated with the plurality of bit lines and with the plurality of word lines. Each of the vertically oriented NAND strings comprises a channel region that comprises a III-V semiconductor, wherein the channel region has a major axis that extends in a vertical direction with respect to the semiconductor substrate. Each of the vertically oriented NAND strings also has a plurality of memory cells associated with the channel region. Each of the memory cells has a charge storage region and a tunnel dielectric between the channel region and the charge storage region. The NAND strings each have a source side select transistor that comprises a body that is crystalline silicon. The semiconductor substrate is silicon, wherein the body of the source side select transistor is in direct contact with the semiconductor substrate and is in direct contact with the III-V semiconductor at the source end of the NAND.

One embodiment disclosed herein includes a three-dimensional (3D) non-volatile storage device, comprising: a semiconductor substrate that has a major axis that extends in a horizontal direction; a first plurality of layers of conductive material that extend in the horizontal direction above the semiconductor substrate; a second plurality of layers of insulating material alternating with the first plurality of layers of conductive material in a stack above the semiconductor substrate; a plurality of bit lines; a plurality of metal bit line contacts, each of the metal bit line contacts is connected to a bit line of the plurality of bit lines; and a plurality of NAND strings that extend vertically through the plurality of layers of conductive material and the plurality of layers of insulating material. Each of the NAND strings is connected to a bit line contact of the plurality of metal bit line contacts. Each of the NAND strings comprises a plurality memory cells, a drain side select transistor, and a source side select transistor, and a channel that has a major axis that extends in a vertical direction. Each of the memory cells comprises a charge storage region and a tunnel dielectric between the channel and the charge storage region. A portion of the channel adjacent to the charge storage regions is a III-V semiconductor. Each NAND string channel has a drain contact portion that comprises a metal-III-V semiconductor alloy, wherein the metal bit line contact is in direct contact with the drain contact portion of the associated NAND string.

One embodiment disclosed herein includes a three-dimensional (3D) non-volatile storage device, comprising: a semiconductor substrate that has a major axis that extends in a horizontal direction; a plurality of word lines; a plurality of bit lines; a plurality of metal bit line contacts, wherein each of the metal bit line contacts is connected to a bit line of the plurality of bit lines; and a plurality of NAND strings that extend in a vertical direction with respect to the semiconductor substrate. Each NAND string is associated with a metal bit line contact and a bit line. Each NAND string comprises a cylindrically shaped vertically-oriented channel and a plurality of non-volatile storage elements that surround the vertically-oriented channel. The vertically-oriented channel is a III-V semiconductor adjacent to the plurality of non-volatile storage elements. Each of the non-volatile storage elements comprises a charge storage region and a tunnel dielectric between the vertically-oriented channel and the charge storage region. A drain side of the vertically-oriented channel comprises a metal-III-V semiconductor alloy. The metal bit line contact is in direct contact with the metal-III-V semiconductor alloy.

One embodiment disclosed herein includes a method for fabricating a three-dimensional (3D) non-volatile storage device. The method comprises forming a plurality of layers of material above a semiconductor substrate that has a major axis that extends in a horizontal direction; and forming vertically-oriented NAND strings that extend through the plurality of layers of material. Each vertically-oriented NAND string comprises a plurality of non-volatile storage elements and a NAND string channel that extends in a vertical direction with respect to the horizontal direction. Forming an individual one of the NAND string channels includes growing a III-V semiconductor upwards in a hole having a major axis that extends in the vertical direction to form a solid core of III-V semiconductor in the hole.

In one embodiment, growing a III-V semiconductor upwards in the hole as just described comprises growing a nanowire of III-V semiconductor from the semiconductor substrate upwards to fill the entire hole and to form the entire NAND string channel.

In one embodiment, forming an individual one NAND string channel comprise comprises: forming a body for a source side select transistor of the NAND string in the hole from silicon, and growing a nanowire of III-V semiconductor from the silicon body of the source side select transistor upwards in the hole.

In one embodiment, growing a III-V semiconductor upwards in the hole as just described comprises growing the III-V semiconductor in the hole from the semiconductor substrate upwards by epitaxial growth to form the entire NAND string channel.

In one embodiment, forming an individual one of the NAND string channels comprises: growing silicon for a body of a source side select transistor of the individual NAND string in the hole by epitaxial growth upwards from the semiconductor substrate; and growing the III-V semiconductor in the hole from the body of the source side select transistor upwards by epitaxial growth to form the rest of the NAND string channel.

One embodiment includes a method for fabricating a three-dimensional (3D) non-volatile storage device, which comprises: forming a first plurality of horizontal layers of a first material above a semiconductor substrate that has a major axis that extends in a horizontal direction; forming a second plurality of horizontal layers of a second material above the substrate, the second plurality of horizontal layers alternating with the first plurality of horizontal layers; forming a pattern of memory holes that each have a major axis that extends in a vertical direction through the first and second plurality of horizontal layers to the semiconductor substrate; and forming a vertically-oriented NAND string in each of the memory holes. Each vertically-oriented NAND string comprises a plurality of non-volatile storage elements and a vertically-oriented NAND string channel. Forming the vertically-oriented NAND strings comprises: forming a tunnel dielectric layer in each of the memory holes, wherein the tunnel dielectric layer has a hollow cylindrical shape in the memory holes; and growing III-V semiconductor upwards in each of the memory holes after the tunnel dielectric layer has been formed to form NAND string channels each having a solid core of the III-V semiconductor that is in direct contact with the tunnel dielectric layer.

One embodiment includes a method for fabricating a three-dimensional (3D) non-volatile storage device, which comprises: forming a first plurality of horizontal layers of a first material above a silicon substrate that has a major axis that extends in a horizontal direction; forming a second plurality of horizontal layers of a second material above the silicon substrate, the second plurality of horizontal layers alternating with the first plurality of horizontal layers; forming a pattern of memory holes that extend vertically through the first and second plurality of horizontal layers to the silicon substrate, wherein the memory holes have sidewalls that extend in a vertical direction with respect to the horizontal direction; forming a body of a source side select transistor in each of the memory holes and in direct contact with the silicon substrate; forming a charge trapping layer on the vertical sidewalls in each of the memory holes, wherein the charge trapping layers each have a vertical sidewall that extends in the vertical direction; forming a tunnel dielectric layer on the vertical sidewall of the charge trapping layer in each of the memory holes, wherein each of the tunnel dielectric layers has a vertical sidewall that extends in the vertical direction; growing a III-V semiconductor directly on the tunnel dielectric layer in each of the memory holes to form NAND string channels having a solid core of the III-V semiconductor, including growing the III-V semiconductor upwards in the memory hole from the body of the source side select transistor; and forming a plurality of metal bit line contacts, including forming a metal bit line contact in direct contact with each of the NAND string channels.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method for fabricating a three-dimensional (3D) non-volatile storage device, the method comprising:
    forming a plurality of layers of material above a semiconductor substrate that has a major surface that extends in a horizontal plane; and
    forming vertically-oriented NAND strings that extend through the plurality of layers of material, each vertically-oriented NAND string comprising a plurality of non-volatile storage elements and a NAND string channel that extends in a vertical direction with respect to the horizontal plane, wherein forming an individual one of the NAND string channels includes:
        growing a nanowire of III-V semiconductor upwards in a hole having a major axis that extends in the vertical direction to form a solid core of III-V semiconductor in the hole, including depositing a material other than the III-V semiconductor that serves as a catalyst for nanowire growth.

2. The method of claim 1, wherein the growing a nanowire of III-V semiconductor upwards in a hole having a major axis that extends in the vertical direction to form a solid core of III-V semiconductor in the hole comprises:
    growing the nanowire of III-V semiconductor from the semiconductor substrate upwards to fill the entire hole and to form the entire NAND string channel.

3. The method of claim 1, wherein the forming an individual NAND string channel comprises: forming a body for a source side select transistor of the NAND string in the hole from silicon, wherein the body of the source side select transistor is in direct contact with the semiconductor substrate, wherein the semiconductor substrate is silicon; and wherein the forming a nanowire of III-V semiconductor comprises growing the nanowire of III-V semiconductor from the silicon body of the source side select transistor upwards in the hole.

4. The method of claim 2, wherein the growing a nanowire of III-V semiconductor from the semiconductor substrate upwards to fill the entire hole and to form the entire NAND string channel comprises:
    performing a nucleation step at a first temperature; and
    performing a growth step at a second temperature that is lower than the first temperature.

5. The method of claim 1, further comprising:
    adding a dopant in a portion of the III-V semiconductor of the NAND string channel; and
    forming a metal bit line contact directly on the portion of the III-V semiconductor having the dopant.

6. The method of claim 1, further comprising:
    forming a metal-III-V semiconductor alloy from a portion of the III-V semiconductor of the NAND string channel; and
    forming a metal bit line contact directly on the metal-III-V semiconductor alloy.

7. The method of claim 1, further comprising:
    forming a charge trapping region for each of the plurality of non-volatile storage elements; and
    forming a tunnel dielectric for each of the plurality of non-volatile storage elements, wherein the tunnel dielectric comprises aluminum oxide in direct contact with the III-V semiconductor of the NAND string channel.

8. The method of claim 7, wherein forming the tunnel dielectric further comprises:
    forming lanthanum oxide in direct contact with the aluminum oxide.

9. A method for fabricating a three-dimensional (3D) non-volatile storage device, the method comprising:
    forming a first plurality of horizontal layers of a first material above a semiconductor substrate that has a major axis that extends in a horizontal direction;
    forming a second plurality of horizontal layers of a second material above the semiconductor substrate, the second plurality of horizontal layers alternating with the first plurality of horizontal layers;
    forming a pattern of memory holes that each have a major axis that extends in a vertical direction through the first and second plurality of horizontal layers to the semiconductor substrate; and
    forming a vertically-oriented NAND string in each of the memory holes, each vertically-oriented NAND string comprising a plurality of non-volatile storage elements and a vertically-oriented NAND string channel, wherein forming the vertically-oriented NAND strings comprises:
        forming a tunnel dielectric layer in each of the memory holes, wherein the tunnel dielectric layer has a hollow cylindrical shape in the memory holes; and
        using nanocluster-catalyzed vapor-liquid-solid (VLS) nanowire synthesis to grow a nanowire of III-V semiconductor upwards in each of the memory holes after the tunnel dielectric layer has been formed to form NAND string channels each having a solid core of the III-V semiconductor that is in direct contact with the tunnel dielectric layer.

10. The method of claim 9, wherein forming a vertically-oriented NAND string in each of the memory holes comprises:
    forming a charge trapping layer in each of the memory holes prior to forming the tunnel dielectric layer, wherein the charge trapping layer has a hollow cylindrical shape in the memory holes, wherein forming the tunnel dielectric layer in each of the memory holes comprises forming the tunnel dielectric layer on the charge trapping layer in each of the memory holes, wherein the tunnel dielectric layer comprises a layer of aluminum oxide, wherein the using nanocluster-catalyzed vapor-liquid-solid (VLS) nanowire synthesis to grow the III-V semiconductor comprises growing the III-V semiconductor upwards in the memory hole and in direct contact with the layer of aluminum oxide.

11. The method of claim 10, wherein the forming the tunnel dielectric layer on the charge trapping layer in the memory holes comprises:

forming a layer of lanthanum oxide in each of the memory holes, wherein the layer of lanthanum oxide has a hollow cylindrical shape in the memory holes; and forming the layer of aluminum oxide on the layer of lanthanum oxide.

12. The method of claim 9, wherein the using nanocluster-catalyzed vapor-liquid-solid (VLS) nanowire synthesis to grow III-V semiconductor upwards in each of the memory holes after the tunnel dielectric layer has been formed to form NAND string channels each having a solid core of the III-V semiconductor that is in direct contact with the tunnel dielectric layer comprises:

using nanocluster-catalyzed VLS to grow the nanowire of III-V semiconductor upwards in the memory hole from the semiconductor substrate to form the entire NAND string channel.

13. The method of claim 9, wherein the using nanocluster-catalyzed vapor-liquid-solid (VLS) nanowire synthesis comprises: depositing a catalyst in each of the memory holes prior to growing the nanowire of III-V semiconductor;

and further comprising: forming a metal-III-V alloy from the catalyst in a drain end of the vertically-oriented NAND string channel.

14. The method of claim 9, wherein the forming an individual one of the NAND string channels comprises:

forming a body for a source side select transistor from silicon, wherein the silicon body is in direct contact with the semiconductor substrate, wherein the semiconductor substrate is silicon; and growing the nanowire of III-V semiconductor from the silicon body of the source side select transistor using nanocluster-catalyzed vapor-liquid solid nanowire synthesis.

15. The method of claim 9, further comprising:

adding an n-type dopant in a portion of the III-V semiconductor of the NAND string channel;

forming a metal-III-V semiconductor alloy from the n-type doped portion of the III-V semiconductor; and forming a metal bit line contact directly on the portion of the III-V semiconductor having the metal-III-V semiconductor alloy.

16. A method for fabricating a three-dimensional (3D) non-volatile storage device, the method comprising:

forming a first plurality of horizontal layers of a first material above a silicon substrate that has a major axis that extends in a horizontal direction;

forming a second plurality of horizontal layers of a second material above the silicon substrate, the second plurality of horizontal layers alternating with the first plurality of horizontal layers;

forming a pattern of memory holes that extend vertically through the first and second plurality of horizontal layers to the silicon substrate, wherein the memory holes have sidewalls that extend in a vertical direction with respect to the horizontal direction;

forming a body of a source side select transistor in each of the memory holes and in direct contact with the silicon substrate;

forming a charge trapping layer on the vertical sidewalls in each of the memory holes, wherein the charge trapping layers each have a vertical sidewall that extends in the vertical direction;

forming a tunnel dielectric layer on the vertical sidewall of the charge trapping layer in each of the memory holes, wherein each of the tunnel dielectric layers has a vertical sidewall that extends in the vertical direction;

growing a III-V semiconductor in direct contact with the tunnel dielectric layer in each of the memory holes to form NAND string channels having a solid core of the III-V semiconductor, including growing the III-V semiconductor upwards in the memory hole from the body of the source side select transistor; and forming a plurality of metal bit line contacts, including forming a metal bit line contact in direct contact with each of the NAND string channels.

17. The method of claim 1, wherein the material comprises liquid metal.

18. The method of claim 1, wherein the material comprises gold.

19. The method of claim 1, wherein growing a nanowire of III-V semiconductor comprises using nanocluster-catalyzed vapor-liquid solid nanowire synthesis.

20. A method for fabricating a three-dimensional (3D) non-volatile storage device, the method comprising:

forming a plurality of layers of material above a semiconductor substrate that has a major surface that extends in a horizontal plane; and forming vertically-oriented NAND strings that extend through the plurality of layers of material, each vertically-oriented NAND string comprising a plurality of non-volatile storage elements and a NAND string channel that extends in a vertical direction with respect to the horizontal plane, wherein forming an individual one of the NAND string channels includes:

growing a nanowire of III-V semiconductor upwards in a hole having a major axis that extends in the vertical direction to form a solid core of III-V semiconductor in the hole comprising:

performing a nucleation step at a first temperature; and performing a nanowire growth step at a second temperature that is lower than the first temperature.

21. The method of claim 20, wherein the growing a nanowire of III-V semiconductor upwards in a hole having a major axis that extends in the vertical direction to form a solid core of III-V semiconductor in the hole comprises:

growing the nanowire of III-V semiconductor from the semiconductor substrate upwards to fill the entire hole and to form the entire NAND string channel.

22. The method of claim 20, wherein forming an individual NAND string channel comprises forming a body for a source side select transistor of the NAND string in the hole from silicon, wherein the body of the source side select transistor is in direct contact with the semiconductor substrate, wherein the semiconductor substrate is silicon; and wherein growing the nanowire of III-V semiconductor comprises growing the nanowire of III-V semiconductor from the silicon body of the source side select transistor upwards in the hole.

23. A method for fabricating a three-dimensional (3D) non-volatile storage device, the method comprising:

forming a plurality of layers of material above a semiconductor substrate that has a major surface that extends in a horizontal plane; and forming vertically-oriented NAND strings that extend through the plurality of layers of material, each vertically-oriented NAND string comprising a plurality of non-volatile storage elements and a NAND string channel that extends in a vertical direction with respect to the horizontal plane, wherein forming an individual one of the NAND string channels includes:

growing a III-V semiconductor upwards in a hole having a major axis that extends in the vertical direction to form a solid core of III-V semiconductor in the hole;

forming a metal-III-V semiconductor alloy from a portion of the III-V semiconductor of the NAND string channel; and forming a metal bit line contact directly on the metal-III-V semiconductor alloy.

24. A method for fabricating a three-dimensional (3D) non-volatile storage device, the method comprising:

forming a plurality of layers of material above a semiconductor substrate that has a major surface that extends in a horizontal plane; and forming vertically-oriented NAND strings that extend through the plurality of layers of material, each vertically-oriented NAND string comprising a plurality of non-volatile storage elements and a NAND string channel that extends in a vertical direction with respect to the horizontal plane, wherein forming an individual one of the NAND string channels includes:

growing a III-V semiconductor upwards in a hole having a major axis that extends in the vertical direction to form a solid core of III-V semiconductor in the hole;

forming a charge trapping region for each of the plurality of non-volatile storage elements; and forming a tunnel dielectric for each of the plurality of non-volatile storage elements, wherein the tunnel dielectric comprises aluminum oxide in direct contact with the III-V semiconductor of the NAND string channel and forming lanthanum oxide in direct contact with the aluminum oxide.

* * * * *